(12) United States Patent
Ryan

(10) Patent No.: US 11,888,444 B2
(45) Date of Patent: Jan. 30, 2024

(54) SOLAR PANELS AND HARVESTING OF SOLAR DERIVED ENERGY

(71) Applicant: SUNOVATE PTY LTD, South Perth (AU)

(72) Inventor: Glen Lee Ryan, South Perth (AU)

(73) Assignee: Sunovate Pty Ltd, South Perth (AU)

( * ) Notice: Subject to any disclaimer, the term of this patent is extended or adjusted under 35 U.S.C. 154(b) by 37 days.

(21) Appl. No.: 16/766,758

(22) PCT Filed: Nov. 28, 2018

(86) PCT No.: PCT/AU2018/051267
§ 371 (c)(1),
(2) Date: May 26, 2020

(87) PCT Pub. No.: WO2019/104380
PCT Pub. Date: Jun. 6, 2019

(65) Prior Publication Data
US 2021/0376787 A1    Dec. 2, 2021

(30) Foreign Application Priority Data
Nov. 28, 2017  (AU) ............................. 2017904802

(51) Int. Cl.
*H02S 40/44*    (2014.01)
*H02S 20/23*    (2014.01)
(Continued)

(52) U.S. Cl.
CPC .............. *H02S 40/44* (2014.12); *F24S 10/40* (2018.05); *F24S 40/42* (2018.05);
(Continued)

(58) Field of Classification Search
CPC .......... H02S 40/44; H02S 20/23; H02S 40/32; H02S 40/425; H02S 50/00; H02S 30/20;
(Continued)

(56) References Cited

U.S. PATENT DOCUMENTS 4,201,195 A    5/1980    Sakhuja
5,851,309 A   12/1998    Kousa
(Continued)

FOREIGN PATENT DOCUMENTS

KR    20170089750 A    8/2017
WO     2016190754 A1   12/2016

OTHER PUBLICATIONS

Machine Translation KR 2017 0089750.
English machine translation of KR 20170089750 A.

*Primary Examiner* — Michael Y Sun
(74) *Attorney, Agent, or Firm* — Charles H Jew

(57) ABSTRACT

Photovoltaic thermal (PVT) apparatus 10 combines a photovoltaic panel (PV) panel 24 and solar air heater (SAH). The SAH includes body 12 with hollow interior 14 defining ducts 16a, 18a for air inlet 16 and air return 18. Jets 22 provide air to convey heat from the PV panel underside. Spaces between the jets provide drains 26 for warmed air to flow away. Flow modifiers/deflectors 124 can guide the airflow. A fan 42 pushes ambient air into the inlet 16 via air handling unit (AHU) 50. Return warm air flows via the AHU to escape via the ambient exhaust 40. A combined thermal transfer and storage unit 52 determines whether air from the PVT panel(s) diverts to the interior space. For cooler ambient conditions, the PVT apparatus can radiate heat to return cooled air into the space. The PVT apparatus can harvest condensation, heat/cool pools and industrial processes.

20 Claims, 63 Drawing Sheets

(51) Int. Cl.
*H02S 40/32* (2014.01)
*H02S 40/42* (2014.01)
*F24S 10/40* (2018.01)
*F24S 40/42* (2018.01)
*H01L 31/0236* (2006.01)
*H02S 50/00* (2014.01)

(52) U.S. Cl.
CPC ........ *H01L 31/02363* (2013.01); *H02S 20/23* (2014.12); *H02S 40/32* (2014.12); *H02S 40/425* (2014.12); *H02S 50/00* (2013.01)

(58) Field of Classification Search
CPC ......... H02S 20/22; H02S 20/30; F24S 10/40; F24S 40/42; F24S 20/66; F24S 20/67; F24S 25/00; F24S 2025/012; F24S 2080/03; F24S 2080/05; F24S 10/742; F24S 80/30; F24S 2010/71; F24S 10/50; F24S 10/00; F24S 20/60; H01L 31/02363; Y02B 10/10; Y02B 10/20; Y02E 10/44; Y02E 10/50; Y02E 10/60; Y02P 80/20; F28F 7/02; F28F 3/12; F28D 2021/0028
See application file for complete search history.

(56) References Cited

U.S. PATENT DOCUMENTS

| | | |
|---|---|---|
| 2007/0028960 A1 | 2/2007 | Royne |
| 2008/0223436 A1* | 9/2008 | den Boer ........ H01L 31/022483 136/256 |
| 2009/0032098 A1* | 2/2009 | Lu .......................... G02B 1/115 136/257 |
| 2014/0166074 A1* | 6/2014 | Prakash ................ H02S 40/425 136/246 |
| 2015/0194557 A1* | 7/2015 | Williams ................ H02S 30/10 136/248 |
| 2015/0208549 A1 | 7/2015 | Shedd |
| 2016/0079460 A1* | 3/2016 | Brottier ................... H01L 31/18 438/64 |
| 2016/0120065 A1 | 4/2016 | Shedd et al. |
| 2016/0322933 A1 | 11/2016 | Escher |
| 2018/0340704 A1* | 11/2018 | Turney ................. G05B 13/048 |
| 2020/0033013 A1* | 1/2020 | Zhang ................... F24F 5/0046 |

* cited by examiner

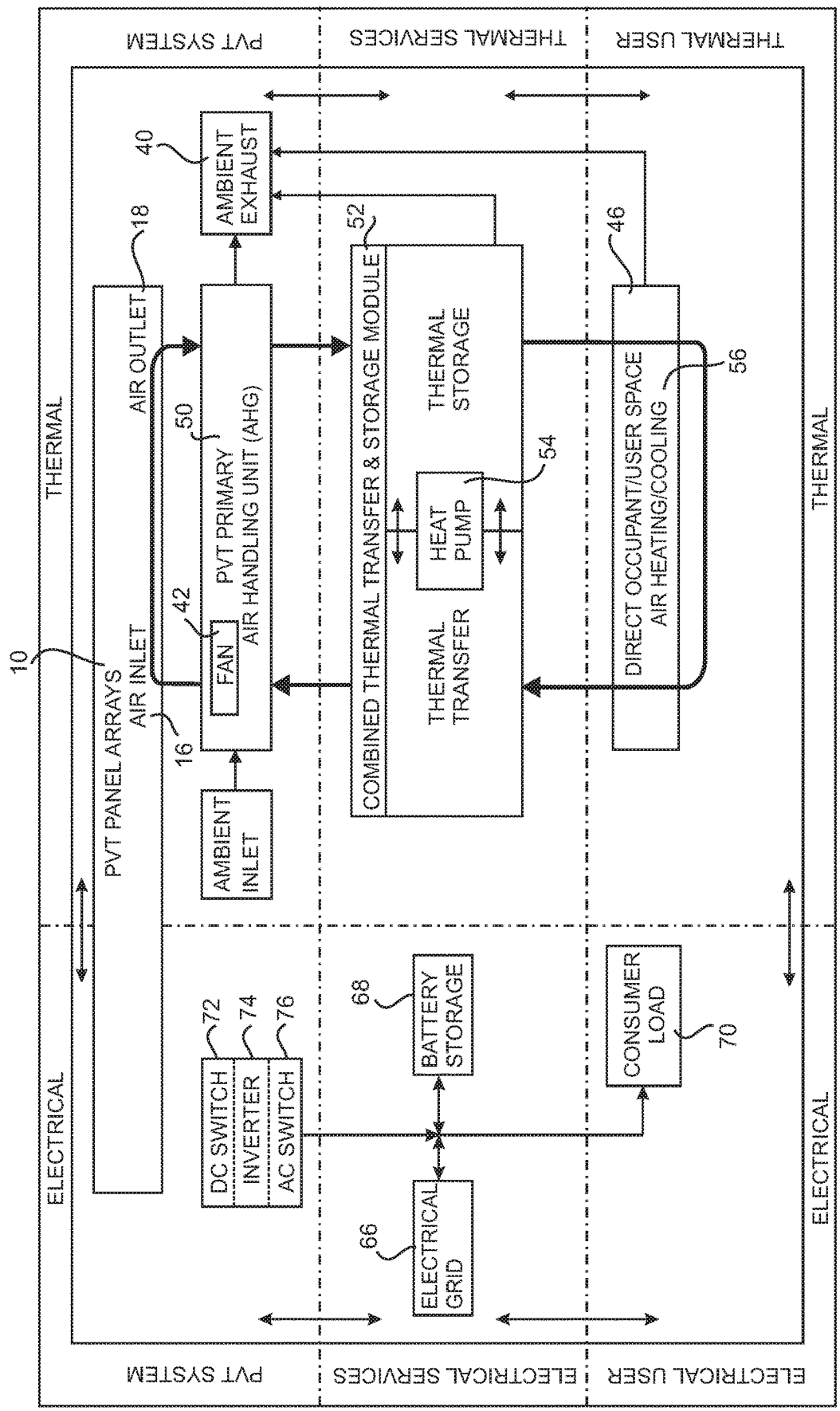
FIGURE 3b   COMPLETE INSTALLATION ARRANGEMENT, PVT SYSTEM CLOSED LOOP MODE

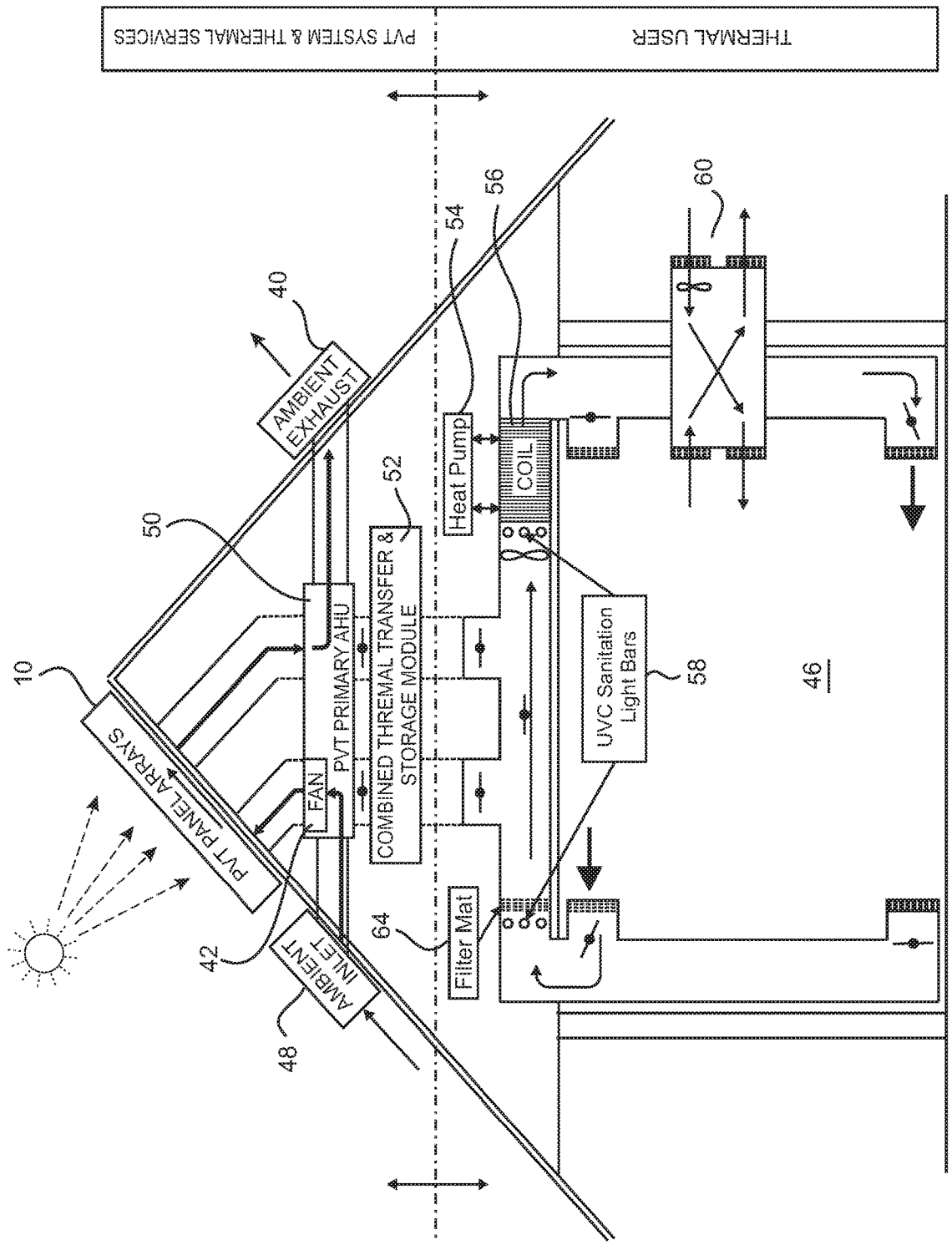

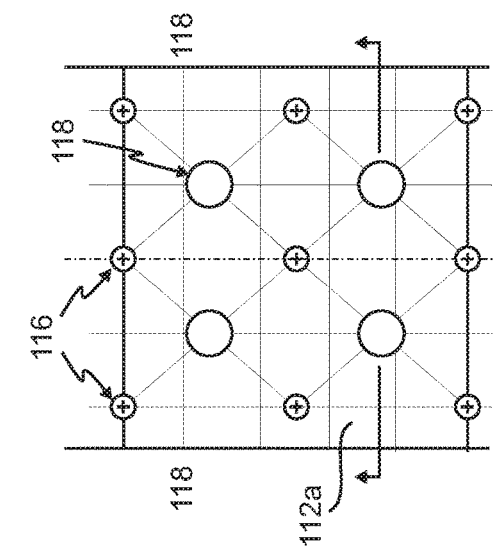
FIGURE 14 c-a
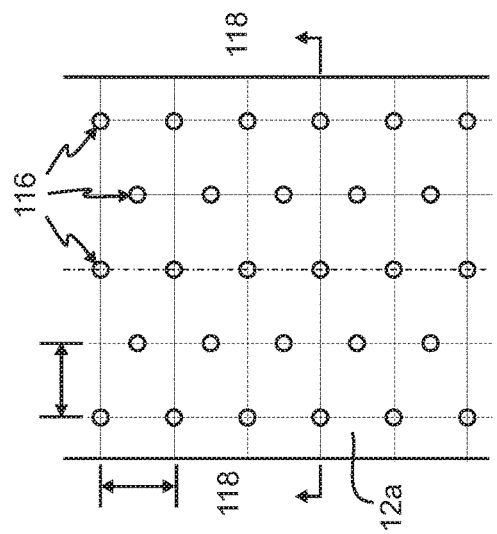
FIGURE 14 b-a
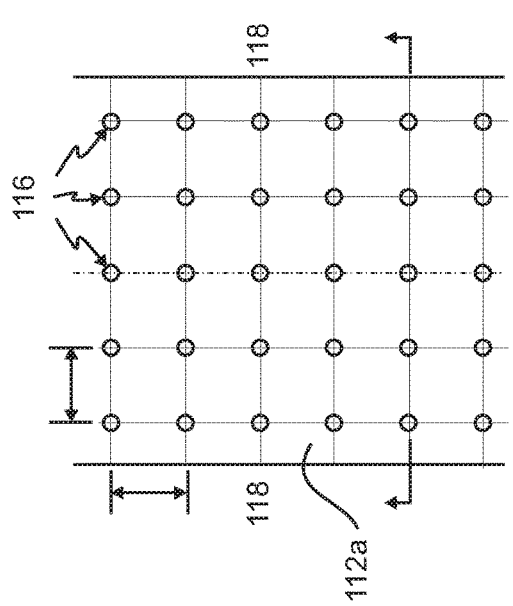
FIGURE 14 a-a
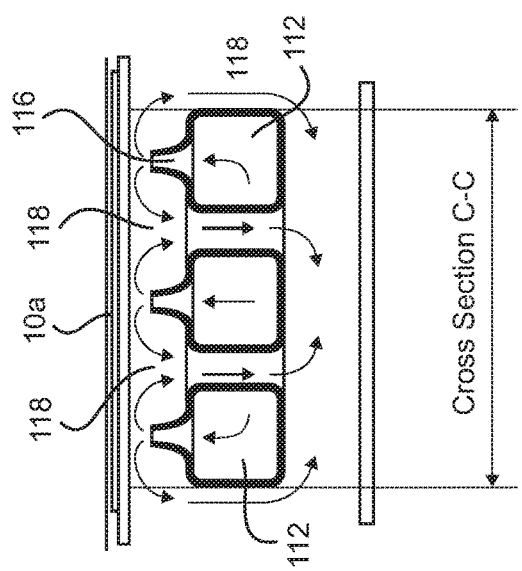
FIGURE 14 c-b
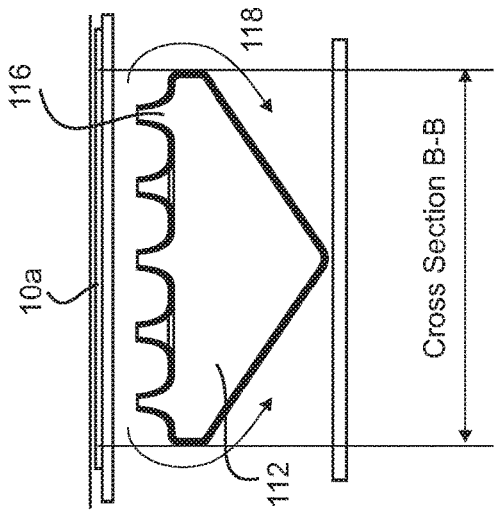
FIGURE 14 b-b
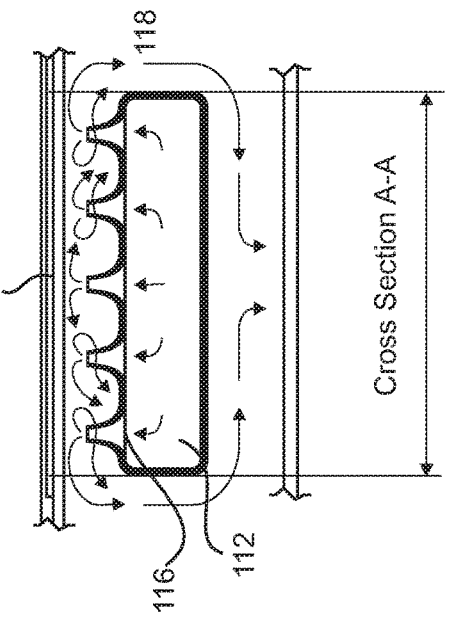
FIGURE 14 a-b

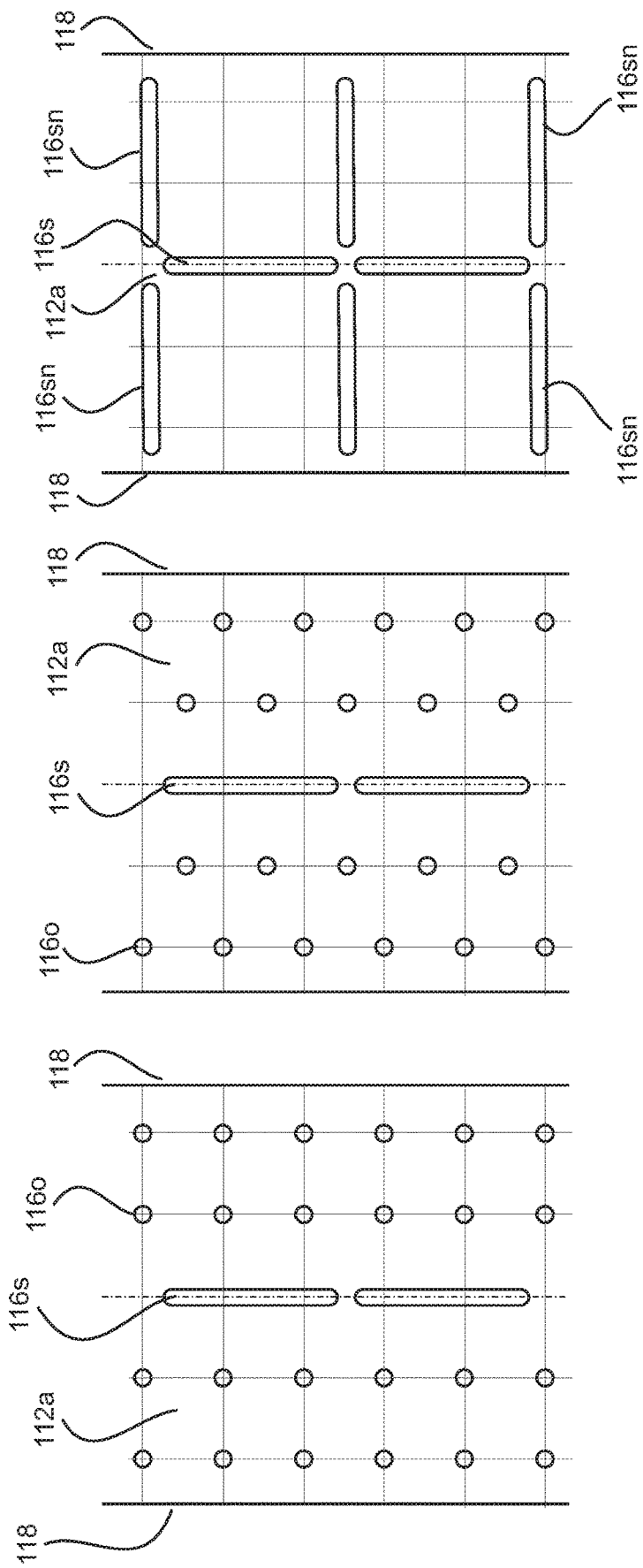

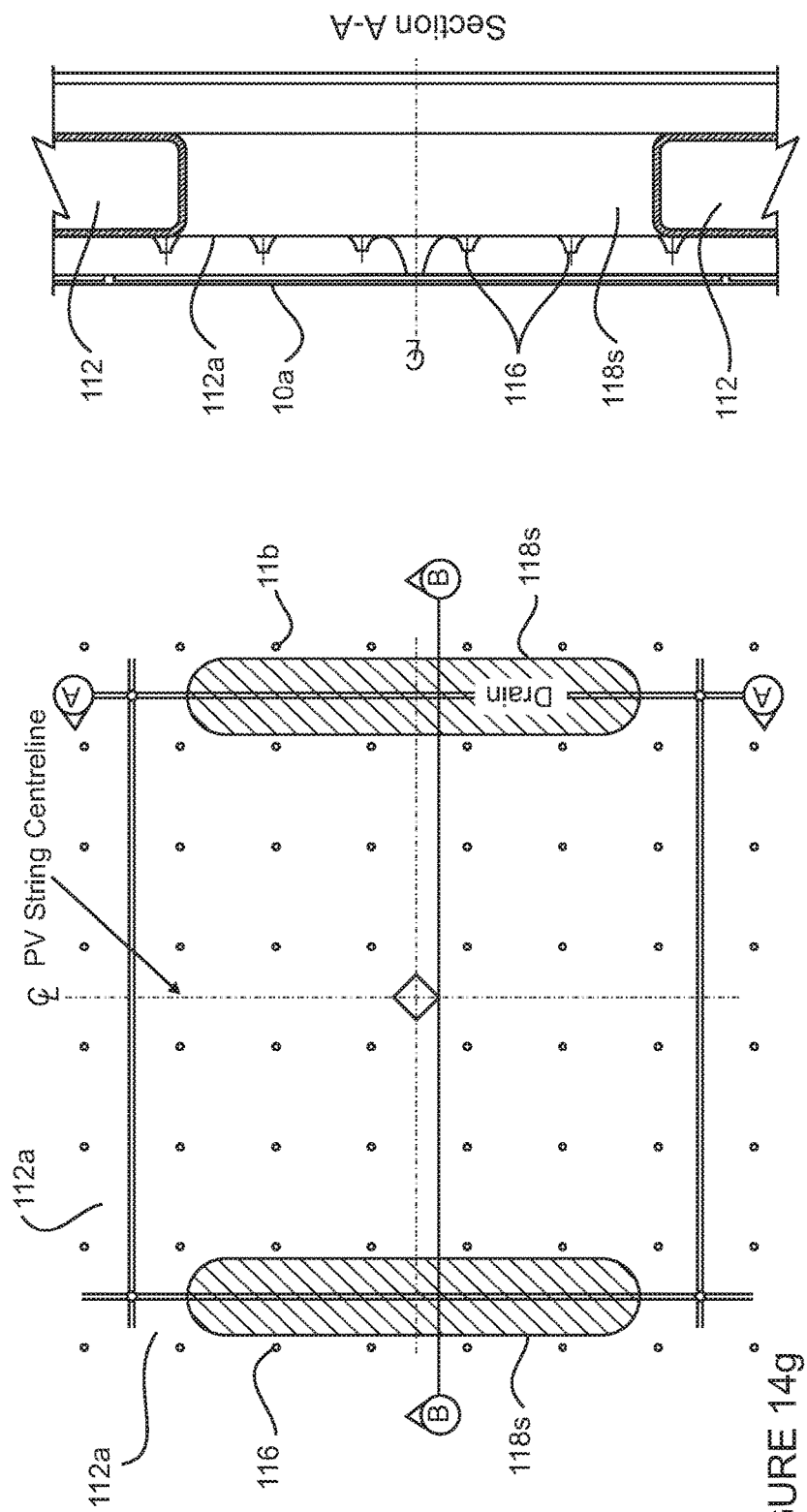

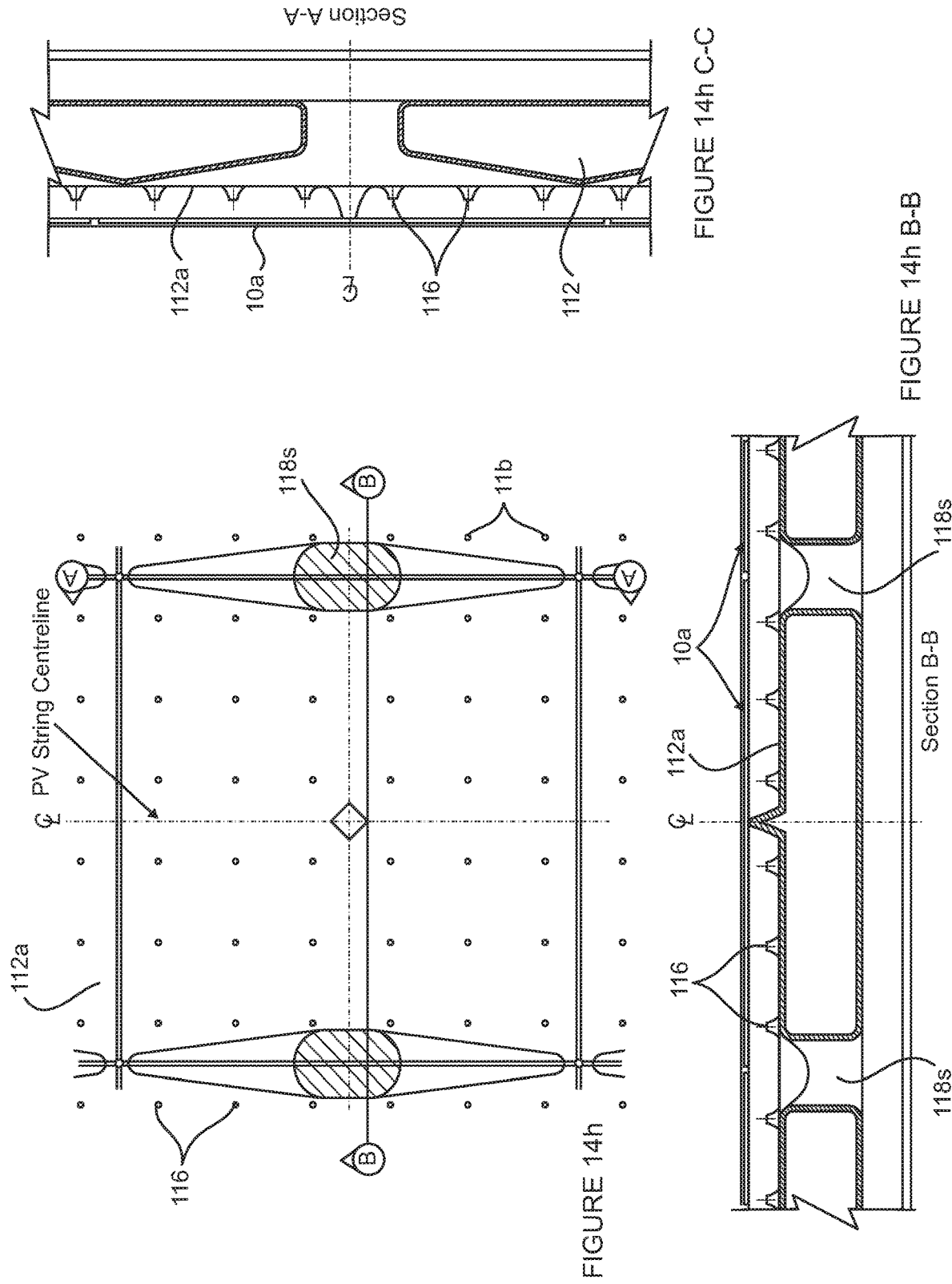

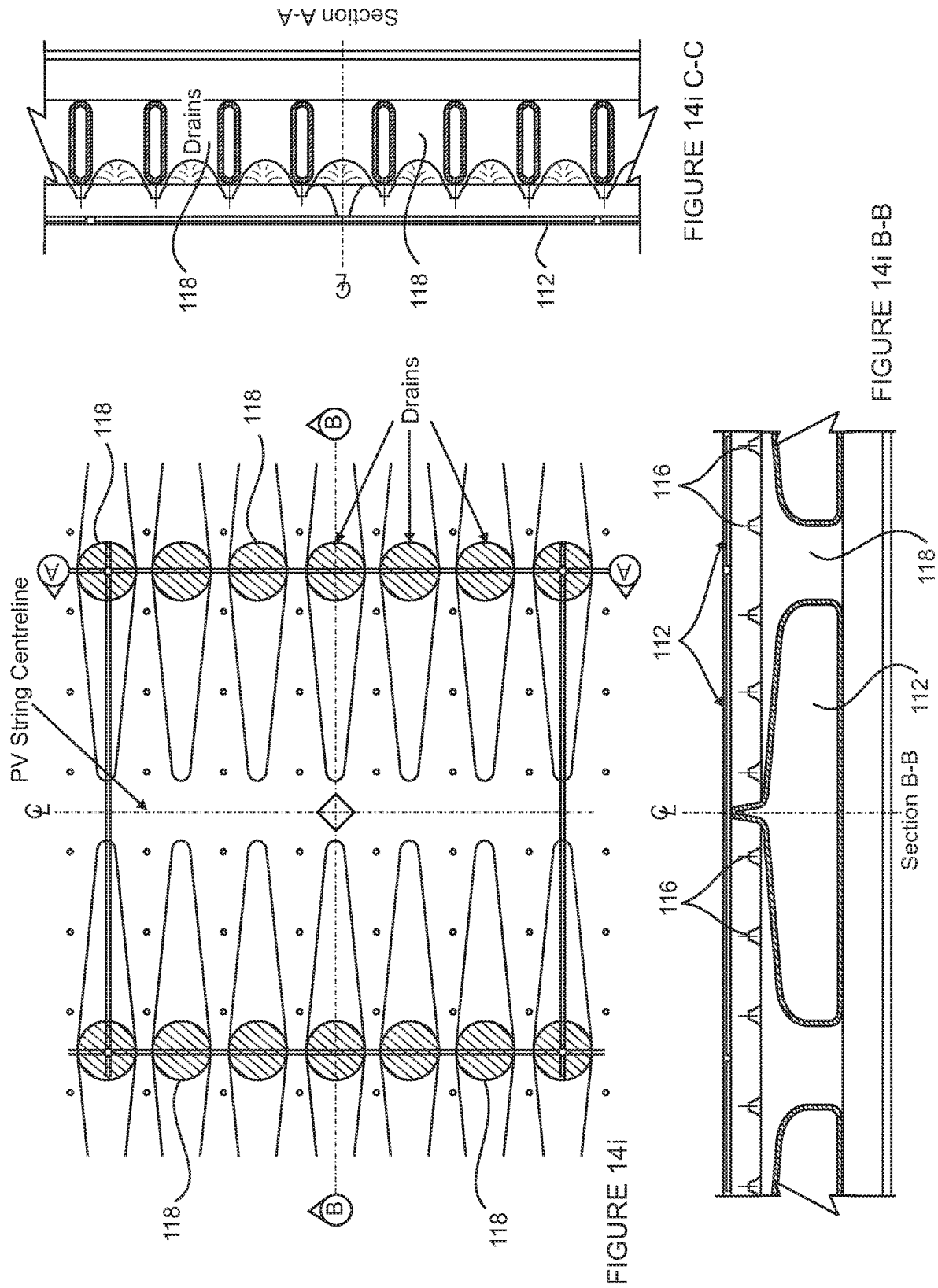

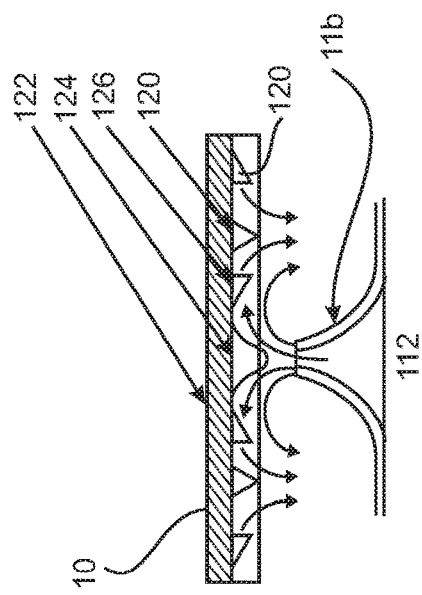
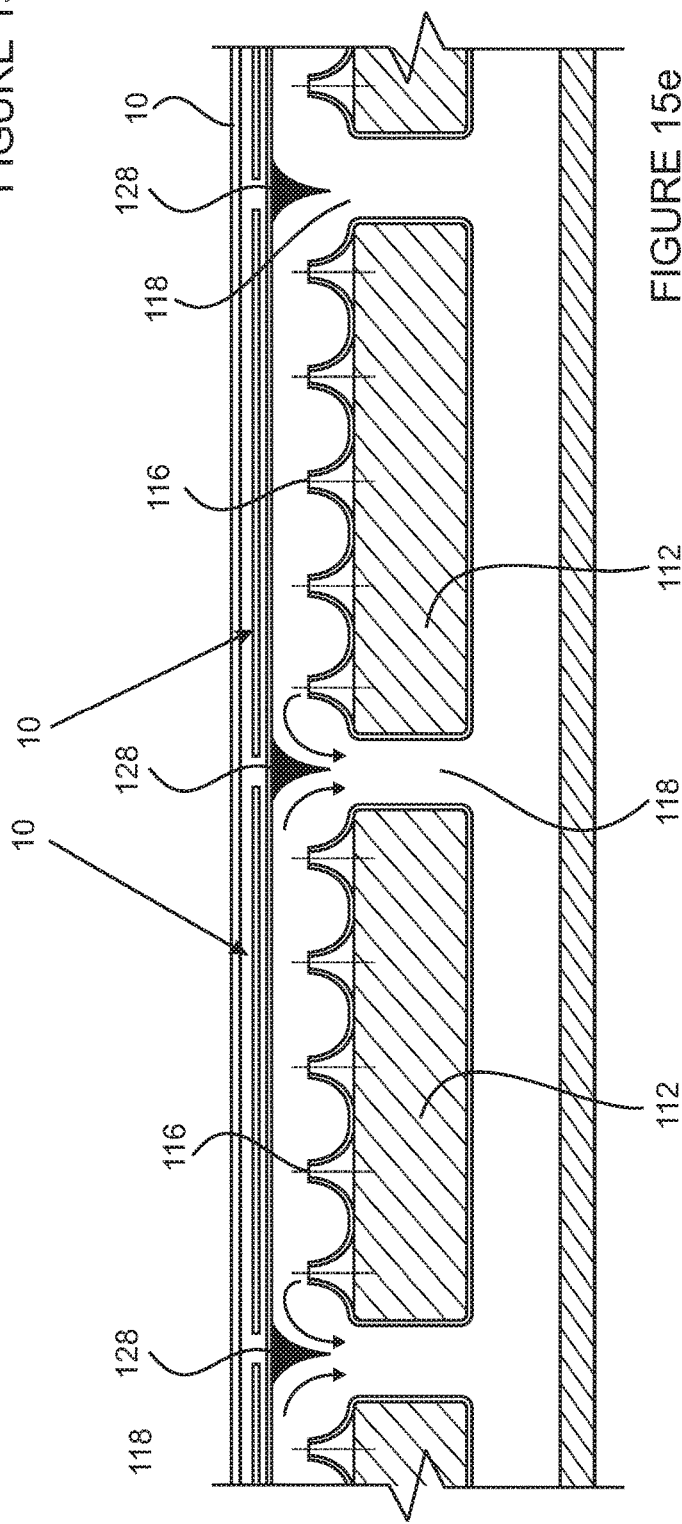

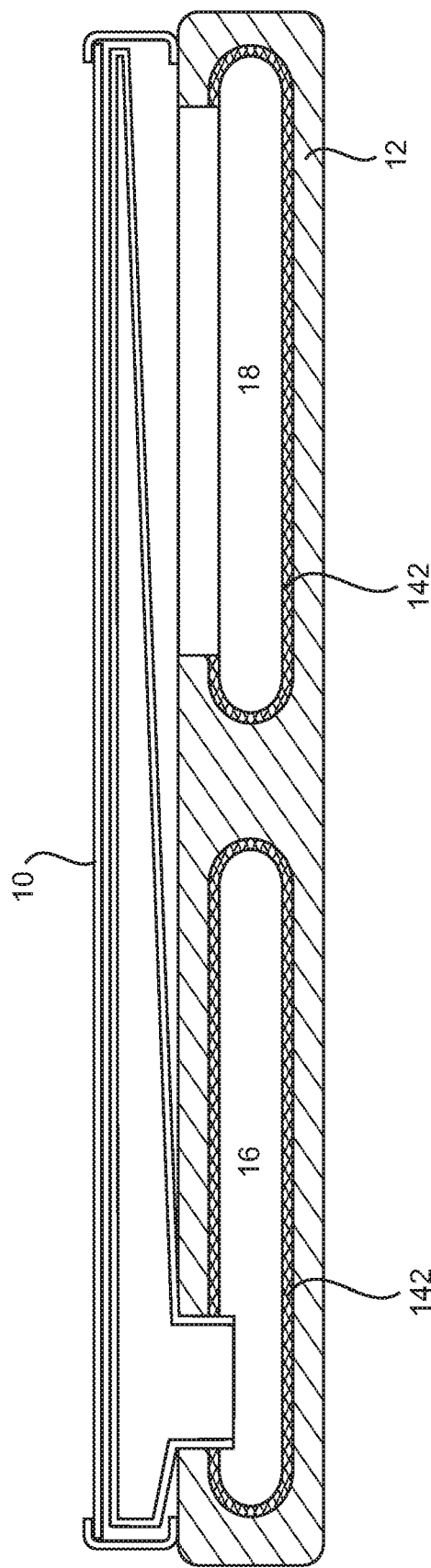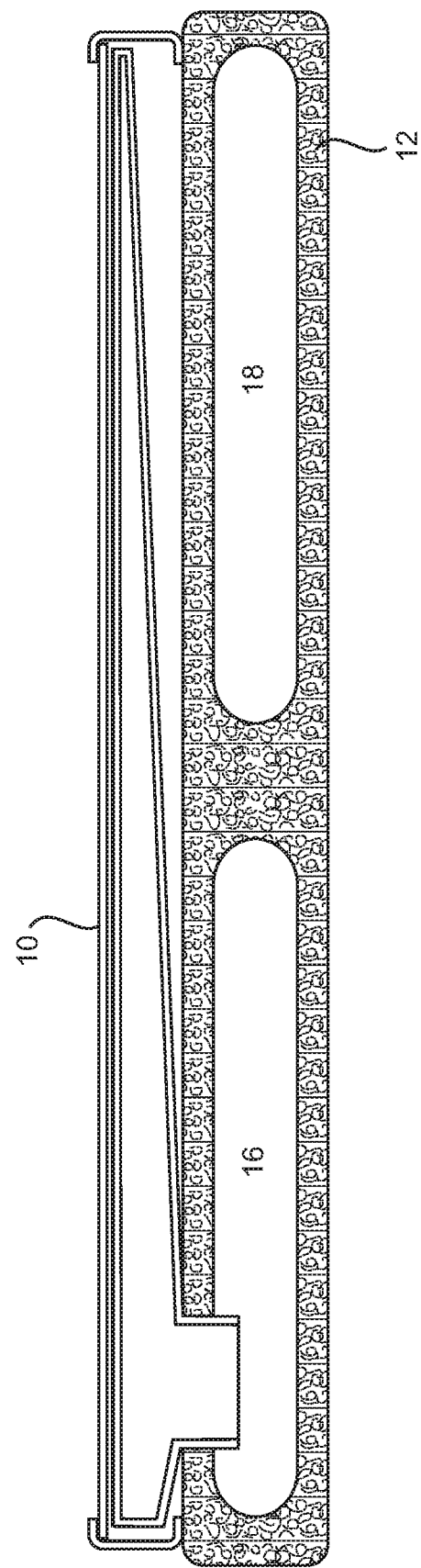

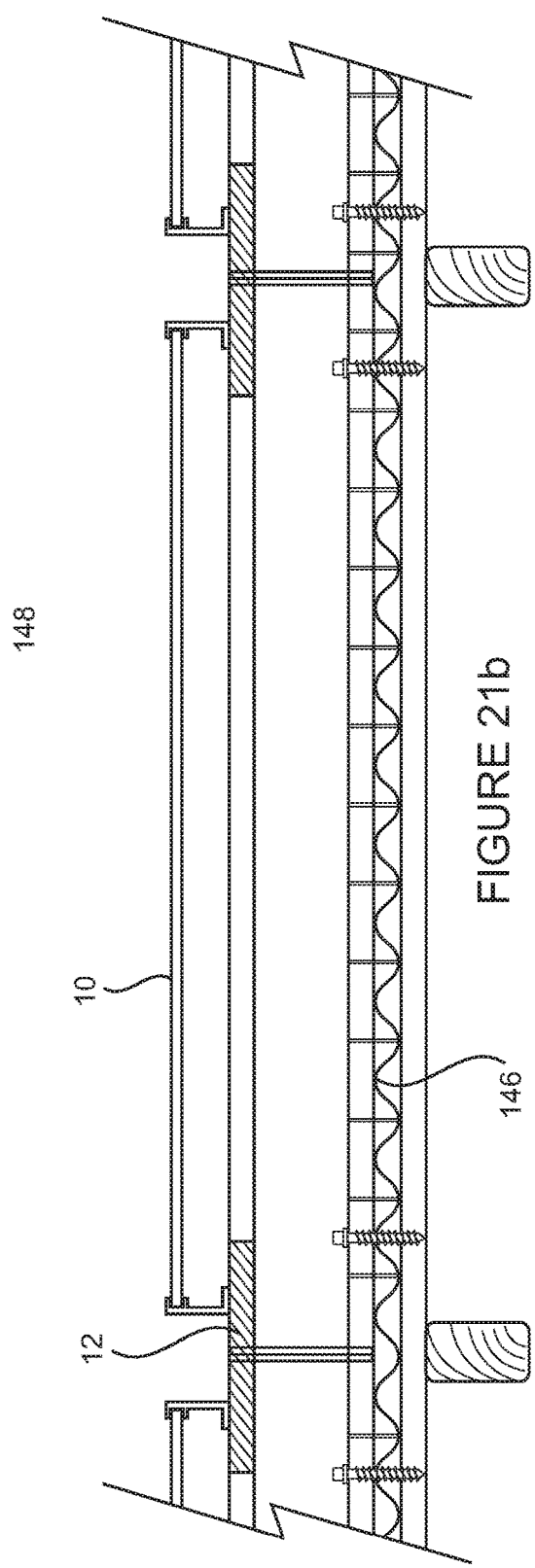
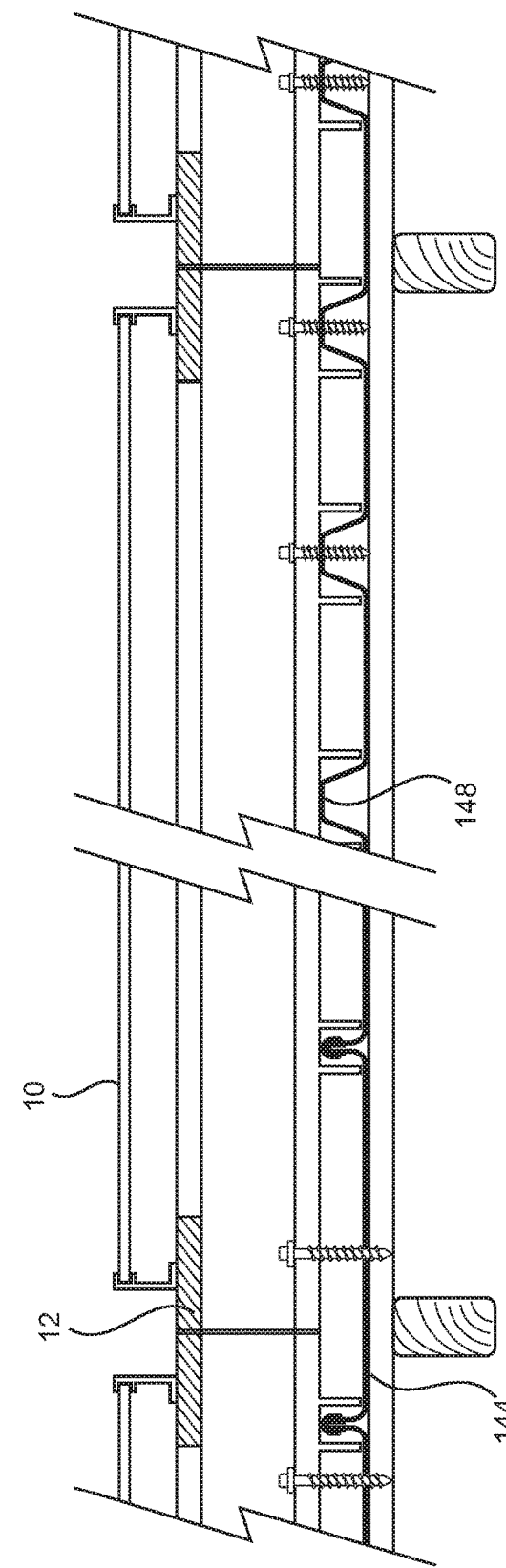

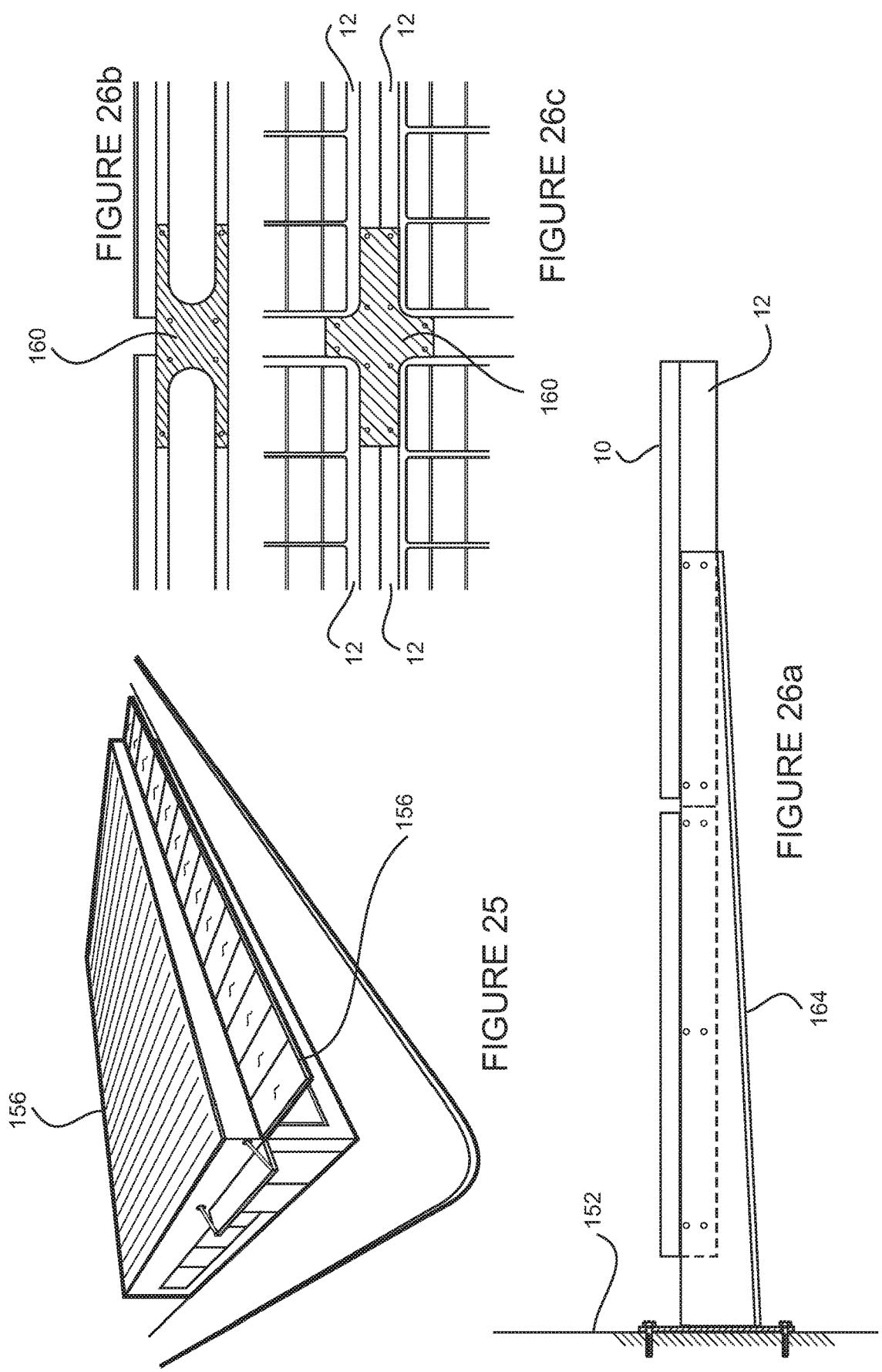

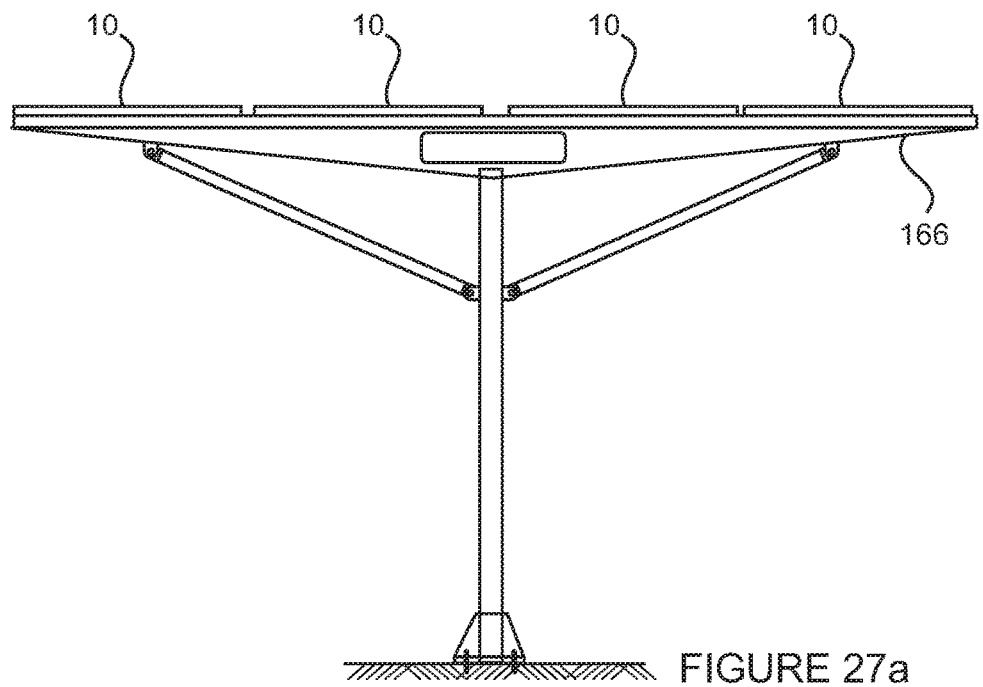
FIGURE 27a
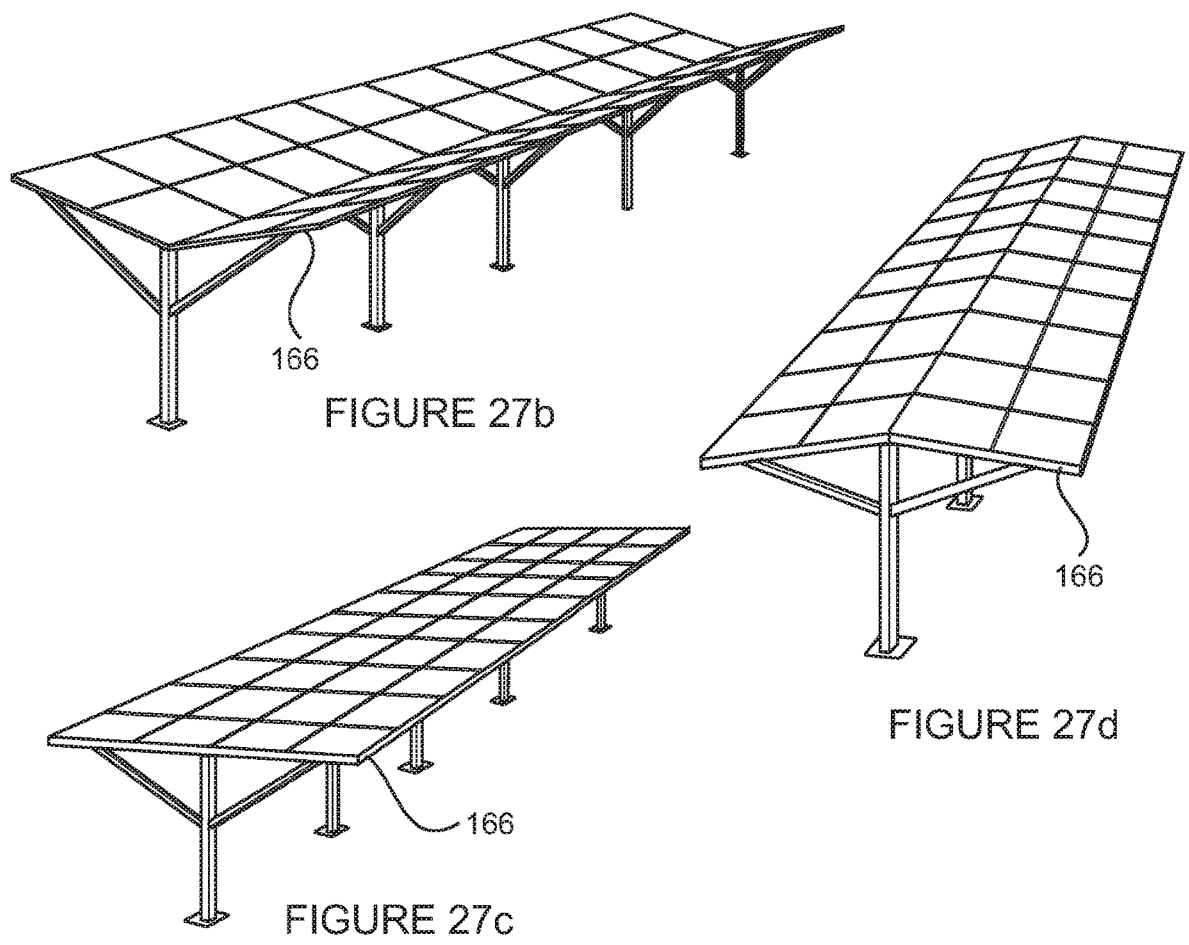
FIGURE 27b
FIGURE 27c
FIGURE 27d

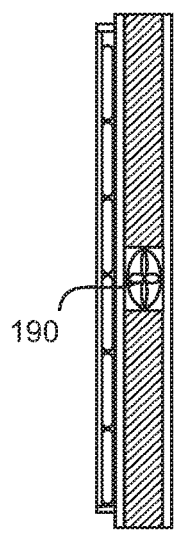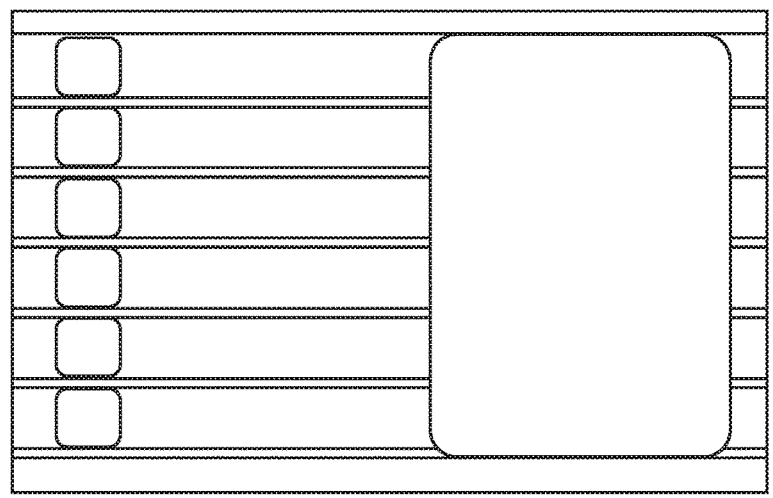
FIGURE 31a A2-A2 FIGURE 31a A1-A1
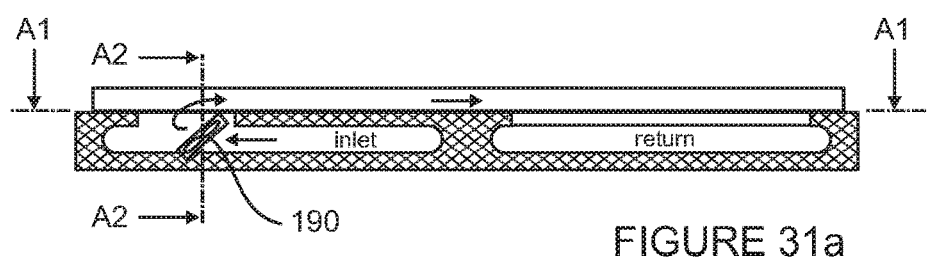
FIGURE 31a
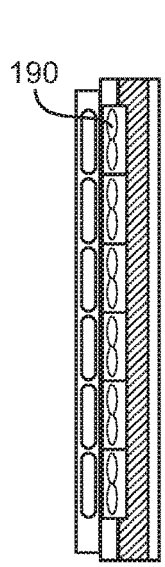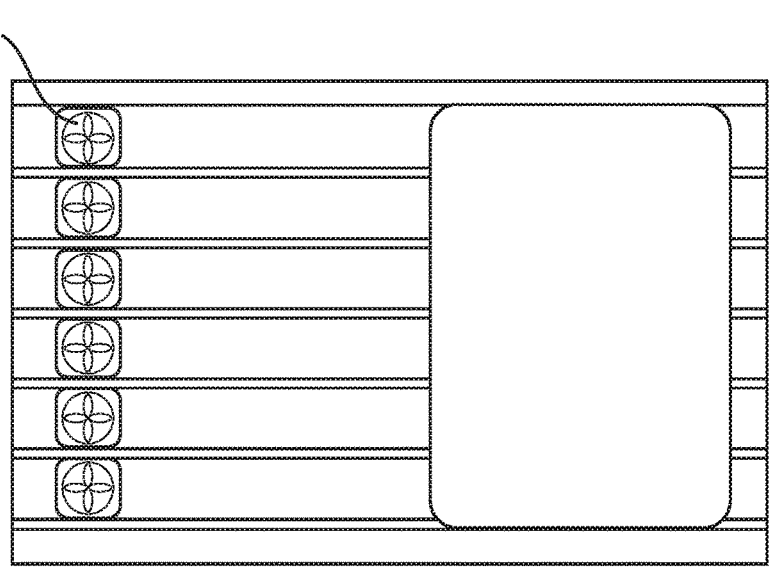
FIGURE 31b B2-B2 FIGURE 31b B1-B1
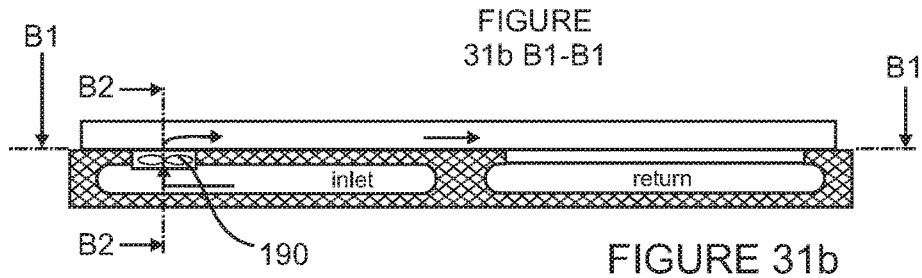
FIGURE 31b

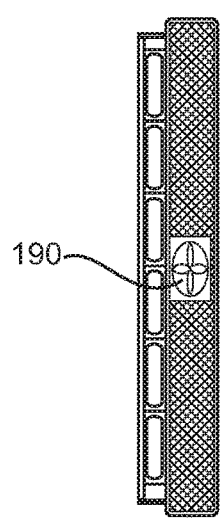
FIGURE
31c C2-C2
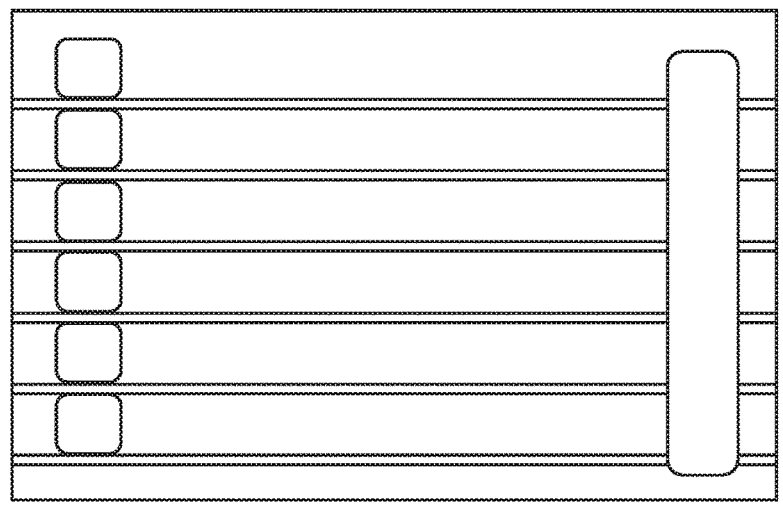
FIGURE
31c C1-C1
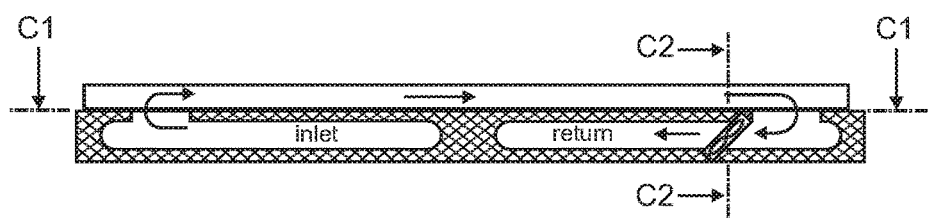
FIGURE 31c
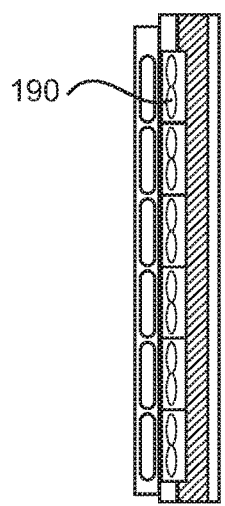
FIGURE
31d D2-D2
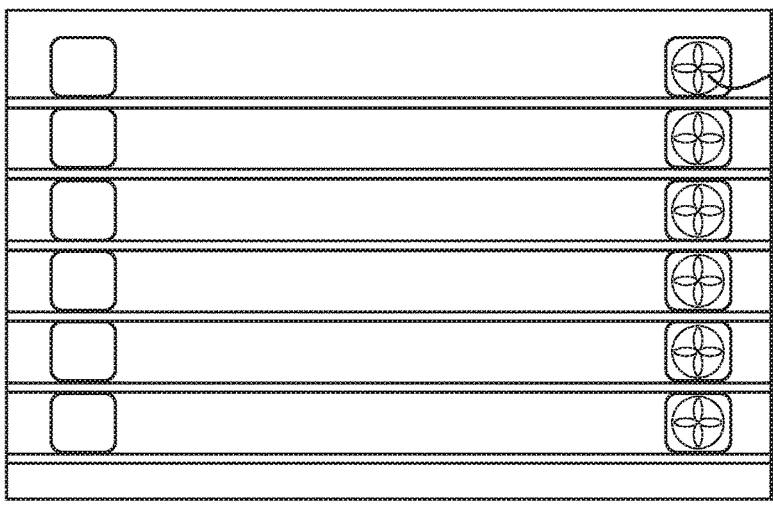
FIGURE
31d D1-D1
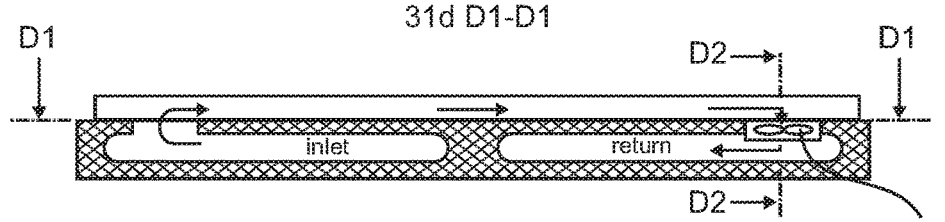
FIGURE 31d

SOLAR PANELS AND HARVESTING OF SOLAR DERIVED ENERGY

FIELD OF THE INVENTION

The present invention relates to apparatus and methods for harvesting solar energy.

One or more particular applications of the present invention relates to apparatus and methods, and improvements thereto, for use in harvesting thermal energy relating to solar panels, such as solar photovoltaic (PV) panels.

One or more particular applications of the present invention relates to improving efficiency of solar photovoltaic (PV) panels and solar panel systems.

BACKGROUND TO THE INVENTION

Mankind's activities have impacted the earth's climate. One part of this equation has been the use of and reliance on fossil fuels. It has been realised that there is a pressing need to transition to an energy supply chain utilising a greater proportion of renewable energy.

Solar energy from the Sun is the primary driving force of all of earth's energy systems and humans have utilised the potential of such solar energy in an evolving manner for years; such as employing mirrors, optical lenses, solar heating, drying and more recently; solar air, hot water heaters and photo-voltaic (PV) cells/panels.

The scale of solar energy use has increased dramatically in recent years from kW installations to now large PV fields in excess of 200 MW.

Enough energy falls on the earth's surface in 2 hrs to meet the annual global energy demand. However, it is a diffuse and uneven form of energy that does not have the ability to concentrate naturally like other forms of renewable energy (e.g. wind, waves and geothermal).

Solar energy is well recognised as a resource that can be widely deployed globally and can be scaled from several watts to multi-megawatt installations using essentially the same solar panel concept. This is supported by evidence from some markets showing sustained year on year growth rates, and such growth has been reported to be in excess 30% compound annual growth rate (CAGR) for installed capacity of PV. Solar thermal hot water systems have been affordable and available for much longer. As a result this market is more mature and sustains little growth but still sustains a significant market share with an annual value of in excess of $15 B. The latest 2016 statistics indicated total cumulative installed capacity for solar PV is 303 GW and solar thermal 456 GW.

Rooftop solar energy growth up until recent times was relatively unconstrained due to space as there was an abundance of area in which these systems could be located. Installations were built around existing roof structures and many single purpose installations occupied the same roof (i.e. PV and SHW) in a usually haphazard retrofitted way, with limited consideration for performance or aesthetics. However, as the built environment aspires to move towards zero emission buildings and 'smart building', and services and mobility become powered, there is an ever increasing demand for electricity and an increase in demand for greater performance of available solar resources.

The constraint of surface area demands that the amount of energy extracted from every square meter of roof space (or solar field) needs to be maximised. As these solar systems become ubiquitous across a variety of roof spaces it is likely there will also be an increasing demand to have these installations applied in a much more aesthetic way than the widely adopted approach of direct roof mounting.

Historically, electricity has been used to service both high end consumption devices such as driving electrical motors through to low grade devices in electric resistance space/water heating. As society moves to the electrification of everything the value attributed to electricity will increase proportionally to this demand. This will redirect electricity consumption away from these lower grade applications requiring the energy for these applications to be sourced from local readably available thermal sources such as ambient air or solar. Some of these heat sources could be used directly or may need upgrading to meet consumers' needs. Heat pump technology is commonly being deployed for these applications. Heat pumps typically consume a quarter of the electricity required to undertake the equivalent heating load in comparison to direct electrical resistance heating. Heat pump technology is increasingly being used to displace all forms of hot water heating, electric, gas/oil and in some cases roof top SHW. Heat pumps are also increasingly being used in space heating replacing electric resistance and gas/oil/wood central boiler systems. The performance of a heat pump system increases proportionally with a higher grade heat source. This enables less electricity to be consumed to deliver the same heating service. The increasing reliance on direct heating or heat pump assisted heating is expected to further increase demand on solar energy resources.

Great advances in the cost and performance of photovoltaic (PV) panels has been made in recent years resulting in significant market growth for the PV industry. However, commercially available solar panels still have a relatively low electrical conversion efficiency of between 15 to 22% (for both common and premium designs respectively). Leading pre-commercial technological research in this area is seeing panels with electrical conversion efficiencies in excess of 40%.

Given that roof space is limited, the efficiency of solar PV panels is of growing importance given the increasing need for electrical energy by buildings, equipment and people.

In current commercial PV products, 75-80% of the energy is converted to heat and subsequently lost to the surrounding atmosphere through radiation and convection effects. By way of example; for solar incident energy levels of 1000 $Wm^{-2}$, over ~750 $Wm^{-2}$, is being lost to atmosphere. The portion of the solar energy not used in electricity generation is converted to heat. As a result, the solar cell heats up to a temperature whereby the thermal losses are in equilibrium to the incident energy not converted. Solar cell temperatures have been measured in excess of 80° C., but are typically found to be 25° C. greater than the ambient temperature. The dominant influences on solar cell temperatures are affected by the incident solar radiation level, installation, ambient temperature and wind speed.

A deficiency in all solar PV cell technologies is the reduction in electrical conversion performance associated with increasing cell temperature. The common thermal degradation factor is nominally 5% reduction in rated performance for every 10° C. above a cell temperature of 25° C. Therefore, a solar panel with a cell temperature of 75° C. will show degraded performance of 25% of its rated capacity. This is a particular issue for hotter climates where the electrical capacity of a PV is degraded at the same time as electrical demand is peaking and cooling demand is greatest. Rather than addressing this issue of lost capacity through heat degradation, the approach to date has been to add more PV capacity.

Another unique property of PV systems is that their performance is very sensitive to a single variation across any one cell within a PV string. A PV panel typically consist of 60 or 72 cells per panel and a PV system connected to an inverter can have between 6 and 15 panels connected in a series per string. There could therefore be over 1000 solar cells connected in a series, and it only takes one cell to fail or underperform to affect the entire system's performance. It is for this reason that great care is taken to test each individual solar cell and grade them before the PV panel is manufactured. Solar cells of a common performance grading are matched and only used in a single panel. These panels are then subsequently grouped and rated accordingly. At the PV system level only the same rated panels are used for any one string of a system.

Inconsistency in solar radiation due to shading and/or panel installation angles or cell temperatures greatly impacts on system performance. To alleviate this, PV strings are usually installed at the same planer angle and with similar under solar panel cavity clearances. A critical outcome of any PV cooling systems, aiming to reclaim PV capacity, is to ensure that there is homogeneous cooling across all solar cells within a PV solar panel and across the complete PV string. This is a factor often overlooked or not appreciated with those trialling cooling concepts.

Rooftop Solar Hot Water (SHW) heaters have been available and widely used over many years. They come in many forms, with glazed flat plate and evacuated tubes being the dominant system in the market and adoption rates varying from country to country. Over time these systems have seen increased performance through enhancements such as double glazing, improved insulation, low emissivity glass and innovated absorber coatings. These systems typically have nominal conversion efficiencies greater that 50%. Although they have relatively good conversion efficiencies, they have a very low capacity factor. A typical system is designed around meeting winter demand. In winter the system capacity (utilisation) factor is high, in that it will take most of the day to meet the demand, however in su mm er this demand can be met in an hour or two leaving the balance of the days solar potential wasted. As the demand for electricity increases, this poor utilisation of limited useable roof space will no longer be seen as acceptable. It will be appreciated that not all roof space is practical for mounting solar PV panels due to, for example, valleys/hips/ridges in the roof, dormer windows projecting outward interrupting the roofline, skylight windows that need to remain uncovered etc., and therefore efficient systems are needed for such limited roof space 'real estate'.

Solar Air Heaters (SAHs) have been also used in cooler climates for space heating and drying of agricultural and commercial products. SAH design has typically been governed by cost and their applications. SAHs typically have high overall conversion efficiencies (greater than 50%); however, this has simply been enabled by high flow rates of the air where the grade of energy (outlet temperature) is less of a consideration. Some technological advances have been made in this market to increase the grade of energy (temperature) received off the absorber. These have included double-glazing, improved insulation, improved absorber coatings and methods to enhance the heat transfer coefficient between the absorber and the working fluid (air). Some of these enhancement methods have included drilling/slotting transpiration holes into the absorber plate, introduction of fins and other fixed external protrusions to the absorber plate, air turbulence enhancers such as baffles and flow diverters and the use of jet impingement onto the absorber plate. As the demand for high efficient SAH's producing high-grade heat is low, only limited advances in improvements have been made over time.

The above issues of; aesthetics, cost, commercial scalability, space constraints, low PV system conversion efficiencies, low thermal system capacity factors, increasing thermal demand, variable seasonal thermal demand and thermal degradation, need to be addressed concurrently.

It is widely accepted that electricity from PV is the most valuable, flexible and tradeable form of output from a solar system over thermal energy. The lowering costs of PV and the prioritisation of PV output has resulted in the emergence of early commercial Solar Photovoltaic Thermal (PVT) hybrid systems in the market representing a new field of renewable energy generation. This has been enhanced by the publication of overall efficiency gains of 3-4 times that of conventional PV only systems. This emerging PVT market has made good progress towards addressing some of the above stated issues, but no single product has been able to satisfy all of them.

The PVT market has two primary classifications of working fluid used in most systems—air and liquid. The PVT market is classified into two models—flat panel (PVT) or concentrator (CPVT).

To date, the liquid/refrigerant flat panel PVT systems have been the more widely commercialised option. This can be attributed to the fact that early developers and innovators in this space were looking to marry the existing SHW systems to the PV systems using their existing knowledge base.

The Liquid PVT systems generally consist of an absorber plate that is fitted to the back of a conventional PV panel at either the manufacturer premises (or retrofitted). This liquid is then plumbed up to an energy reservoir and a pump is used to control the volumetric flow and outlet temperatures. These systems achieve a better utilisation of available space and partially address aesthetics issues with uniform sized panels in a slim form factor (thin panel width). A number of factors limit these PVT systems;

The inability to deliver a uniform cell temperature across the entire panel resulting in a cell performance mismatch. The heat exchanger typically has a single inlet and outlet which is usually at opposing or adjacent corners of the panel. The heat exchanger is inherently limited in its design as the cells closest to the inlet are always going to be cooler than those closest to the outlet, and in unglazed panels, cell temperatures could be 25° C. more than ambient and higher again for double glazed panels.

Thermal contact between the heat exchanger and the back of the PV panel is critical to ensure acceptable heat transfer coefficients between the two. Industry research has shown that even with a small air gap the heat transfer drops exponentially with gap size. The introduction of a thermally conductive paste has been introduced by some manufacturers to alleviate this drawback; however, such a junction provided by the thermally conductive paste is always going to be subject to thermal changes and at risk of structural distortion.

The cell cooling potential is limited to the heat exchanger coverage. In the majority of prior art the heat exchanger does not cover the full extent of the panel, missing out areas surrounding the junction box and edge extents of the panel. This results in a much reduced cooling effect due to those uncovered areas relying on thermal conduction along the glass panel and any resultant convective and radiant heat loss alone. Thus, an inefficient thermal gradient between the adjacent actively cooled part of the cell/s and those not actively cooled is produced.

The need to introduce a heat exchanger to dispense additional heat (in excess of internal demand) and to ensure the panels maintain a cell temperature that is safe and still provides good performance.

In some cases, the need to introduce an intermediary glycol circuit to prevent the fluid freezing in cold climates.

In some cases, the use of refrigerant may require technicians with specialised training, licensing and handling. Leakages may also be hard to detect.

The introduction of conductive liquids with subsequent joint leakage potential into a confined high voltage DC environment.

The additional panel weight associated with the liquid heat exchanger.

Added complexity of plumbing requirements during installation.

Added difficulty in replacing panels or removing panels if roof entry is subsequently required post installation.

CPVT liquid systems are beginning to receive greater market acceptance in cooler climates where an existing thermal load dominates the installations consumption needs and is prioritised over electrical needs. CPVT liquid systems experience similar limiting factors to the PVT liquid system; however, the key distinguishing disadvantage is the relatively large comparative panel size in both area and depth (250 mm). This makes it difficult for the CPVT to meet aesthetic needs unless they are able to be integrated into the roof or located out of view. A distinguishing advantage is the ability to achieve a higher grade liquid outlet temperature through the use of mirror concentrators.

PVT air/gas systems typically consist of an enclosure that captures the heat radiated and convection from the underside of the PV panel. These systems have tended to be bulky in nature and the complexity associated with air ducting is believed to have restrained broader market adoption to date.

PVT air systems appear to have emerged from two streams of application, the first was simply capturing the available convective heat from the underside of the PV panel by boxing it in and transferring it via ducting. Enhancements of this process included insulation on the underside of the box to further capture the underside radiation element. The second appears to be the adoption of similar physical techniques applied in the SAH market to enhance the heat transfer coefficient between the air stream and the PV panel back surface.

Like SAH systems, PVT air systems can also achieve very high conversion efficiencies through the adoption of mass flow rates; however they have been limited in the ability to efficiently extract a higher grade of energy.

Air PVT Systems have either been deployed as open or closed loop systems. An open loop system introduces new air directly from the outside (such as disclosed in U.S. Pat. No. 9,103,563 B1), where, as in a closed loop system, the air is drawn from within the building. Both systems use the buoyant effect of hot air rising and place the inlets at the bottom of an inclined panel and the hot air exhaust at the top. The air is typically circulated using a fan incorporated into the ducting circuit and introduced into building during heating mode or vented to ambient when there is no thermal demand.

Some systems, such as described in a US patent application published as US2011/0120528 A1 have introduced an Energy Recovery Unit (ERU) which transfers the heat from the air stream to the fluid heating coils which can contain either water/glycol or refrigerant.

All current forms of Air PVT Systems use a heat transfer method that requires the air flow to pass over at least two adjacent PV cells. In a single PV panel the minimal adjacent PV cells on the short axis is 6 and 10 or 12 on the long axis. Either way this creates an unavoidable cell temperature differential across the air flow path. This is not conducive to maximising high grade and efficient thermal output or maintaining constant cell temperature to boost PV capacity. Other designs compound this issue by introducing additional panels in series to the flow path.

Additional means of increasing Air PVT heat transfer has been achieved through the employment of fixed fins to enable more heat to be conducted into the air flow pathway whilst additional flow obstructions have been added to increase the surface roughness. This results in increased fluid turbulence enabling the breakdown of the fluid boundary layer. The effectiveness of these techniques is highly dependent on air flow rates. In conditions where there is low solar incidence or very cold inlet conditions (and at the very time the air flow rate must be reduced to enable a viable outlet condition to be reached) the heat transfer effects of these measures are reduced exponentially. The reduced flow conditions also create the environment for unsteady flow whereby flow becomes variable (surging) and/or creates channelling pathways through the obstructions leading to further non-uniform heat transfer.

This issue is recognised and research is required to develop new techniques to enhance the heat and mass transfer. The use of jet impingement techniques to address this need has been considered. For example, U.S. Pat. No. 4,201,195 (Sakhuja) attempted to address this issue with a jet impingement plate located underneath the absorber plate with air forced along the longitudinal axis of the glazed panel. The air is introduced at one end underneath the jet impingement plate and then is forced through the jet impingement plate onto the absorber. The spent air is then exhausted through the air outlet. The limitation with this design and it various embodiments is that the spent air increasingly disrupts the jets located towards the exhaust end of the panel. This reduces the effectiveness of those jets, as does the additional heat transfer experienced as the air passes underneath the jet plate.

The power electronic and computing industry has experience exponential growth over the last decades. This sector has sought to employ new innovative techniques to dissipate more and more energy per unit of area as advances in the current carrying capacity of power electronics and the rate of switching of computer chips increases every year. Typical heat exchanger designs used in these applications are more concerned with maximising heat dissipation rates than they are in optimising the cooling fluids pumping power. The industry is investigating micro jets and micro-channelling as an approach to achieve this, with the potential of dissipating 150-200 $Wcm^{-2}$. This is far in excess of an equivalent solar thermal load of 0.1 $Wcm^{-2}$ under solar isolation conditions of 1000 $Wm^{-2}$.

An example of a power electronic cooling embodiment is expressed in a United States of America patent application published as US 2005/0143000 (Eisele). This example uses an array of liquid jets to cool the electronic components.

It is with the aforementioned systems and problems in mind that the present invention has been developed.

The present invention proposes a hybrid solar air photovoltaic thermal (PVT) collector.

SUMMARY OF THE INVENTION

With the aforementioned in view, an aspect of the present invention provides a heat transfer apparatus for use with at least one thermal and/or solar photovoltaic (PV) panel, the heat transfer apparatus including at least one gas passage for the gas to flow into, through or out of the apparatus, and gas flow modification means configured to direct flow of the gas to transfer heat to or from the thermal and/or PV panel.

A further aspect of the present invention or part of the aforementioned apparatus may include a hybrid solar air photovoltaic thermal (PVT) collector including at least one photovoltaic cell for receiving solar radiation, at least one air plenum providing a passage for inflow and outflow of air through the at least one air passage, chamber or plenum.

The apparatus or collector may include a mounting arrangement for mounting the apparatus to the thermal and/or PV panel and/or to a support.

Preferably the apparatus or collector includes a number or array of the photovoltaic cells provided in a PV panel.

The mounting arrangement may be provided as a unitary or modular system, such as at least one mounting cassette.

The apparatus or collector may include glazing over at least part of the at least one solar cell or panel, such that solar radiation passes through the glazing prior to reaching the PV cell(s).

The glazing may include multiple layers, such as double or triple glazing.

A gap between layers of glazing may include air, a vacuum or partial vacuum or an inert gas, such as nitrogen, or a combination thereof.

The at least one air passage, chamber or plenum may include multiple plenums/chambers through which air flows during use.

The multiple plenums/chambers may be arranged in series such that air flows from one to the other, or may be arranged in parallel such that air flow is shared/split through the plenums/chambers.

A hybrid apparatus or collector according to one or more forms of the present invention may be provided preassembled or may be modular in the sense of at least any two or more of the PV panel, the at least one air passage, chamber or plenum and optionally the at least one mounting arrangement.

A further aspect of the present invention provides a heat transfer apparatus for use with at least one solar photovoltaic panel, the heat transfer apparatus including at least one air plenum and a mounting arrangement.

One or more of the said heat transfer apparatus can hereinafter be described or defined as a PVT (PV thermal) HTM (heat transfer apparatus) or PVT-HTM for short.

The mounting arrangement of the PVT-HTM may include a mounting cassette configuration.

A ducting arrangement may be provided to recover thermal air flow from the plenum(s) and utilise the thermal airflow for heating or conversion to other energy sources or mechanical work. Such recovery may be fan assisted.

For example, supply and return ducting may be provided to supply airflow to the plenum(s) and for recovering the heated (thermal) airflow from the plenum(s) airflow. Fan assistance maintains a flow of the air, and can be used to control the rate of flow dependent upon the thermal heating characteristics of the collector/PVT-HTM, the time of day, weather etc. Fan speed or number of fans operating, or flow restriction/orifice control, may be employed to manage thermal air flow heat recovery.

It will be appreciated that, at night time, air flow through the plenum(s) can be used for cooling purposes by helping to transfer heat from the air within a building via the PVT-HTM/hybrid collector to the outside. This can be achieved by night radiative cooling.

The hybrid collector/PVT-HTM may be used to condense moisture from atmosphere at night during night radiative cooling operation. For example, an associated PV panel exposed to the night sky will induce a panel surface temperature less than that of the outside ambient air. Passing air through the plenum(s) and across the underneath surface of the associated PV panel can sufficiently cool the temperature of the air is below dew point and moisture condenses from the ambient air. This moisture can be collected for use.

Condensation collected by the system can be channeled, such as by channels or ducts provided on or within the PV panel, or connected to the PV panel.

A further aspect of the present invention provides at least one jet arranged and configured to direct a flow of gas toward an underside of a solar panel.

The at least one jet, nozzle or orifice may be used with one or more of the aforementioned heat transfer apparatus and collector.

Preferably the gas includes air or is air.

The at least one jet, nozzle or orifice may be provided as one or more slits, apertures or holes, or a combination of two or more thereof, and which may be raised from a base or level with a base.

The at least one jet may be in communication with a flow path for supplying the gas, such as at least one plenum, chamber, conduit, duct or tube, or a combination of two or more thereof.

The jet or jets may be mounted to a rear of a solar panel such that the flow of gas from the jet(s) is directed onto or at least towards the rear of the solar panel.

One or more forms of the present invention may include at least one jet, air nozzle or orifice. The term 'jet' will hereinafter be used for ease of reading, but it is to be understood, as mentioned above, that the term 'jet' or 'jets' refers to at least one opening (orifice) or nozzle, such as a nozzle or hole or slit, enabling air to flow therethrough.

The at least one jet creates an increase in air flow velocity.

The at least one jet may be provided between the at least one air passage, chamber or plenum and a rear of a said PV panel. For example, the at least one jet may be arranged to direct airflow from the at least one air passage, chamber or plenum onto the rear of the PV cell/panel to enable/enhance cooling of the PV panel and thereby increase PV efficiency of the cell/panel.

Control of the number of operational said jets in use at any one time and/or control of the velocity of air through the jet or each said jet can be used/optimised to manage cooling of the PV panel/string and therefore efficiency of the PV panel/string. For example, less cooling from use of the jet(s) may be needed at nighttime compared to day time.

Alternatively, or in addition, air flow through one or more jets behind hotter zones on the panel/string may need to be increased whilst air flow through one or more other jets behind cooler zones of the PV panel/string may need to be decreased.

One or more forms of the present invention therefore provides individually controlled jets or numbers or regions of jets. For example, air flow from the respective air passage, chamber or plenum to one or more jets in an jet region may be controlled by limiting or increasing air pressure within the respective air passage, chamber or plenum and/or restricting/opening the diameter/width or size of one or more of the jets in a said region and/or by allowing/preventing flow of air into or out of the one or more jets in the region.

It will be appreciated that the term plenum refers to one or more spaces or volumes providing a reservoir and/or distribution/supply within an air/gas supply system.

An jet pattern can be employed to control cooling and provide mean PV cell temperature across part or all of the PV panel/number of cells.

Preferably the jet or each jet has an opening/orifice width/diameter ('d') of between 0.5 mm and 5.0 mm. Preferably the diameter/width is about 2.5 mm.

The diameter/width may be a width of a slot jet, with a length ('l') longer than d.

The jet or each jet can have a sectional profile of parallel square edged profile, convex profile, concave profile, long radius nozzle square end exit profile, long radius nozzle profile (pencil end), long radius nozzle (expansion end), long radius nozzle (mitred end), or a number of the jets having a combination of two or more thereof.

Preferably the or each jet has a height ('H') relative to a flush mount jet height ('h') i.e. relative to a flat plane opening/orifice. The height H is therefore the height that the jet projects above the base plane/surface at the root of the jet. Preferably the height is between 3.0 mm and 25 mm, more preferably between 5 mm and 18 mm, and more preferably around 10 mm.

The height H may be expressed as a proportion relative to h, such as 50% so as to minimise spent fluid entrainment within the jet. The proportion may be between 20% and 80%, more preferably between 40% and 60%, and preferably around 50%.

The jets can be arranged in a regular or irregular array, or combination of irregular and irregular arrays, behind a panel. Furthermore, the spacing of the jets, and the number and arrangement of round, oval, slot and irregular openings of the jets can be selected to suit a particular application or cooling effect.

Preferably the array or jets relative to a particular PV panel may be aligned either side of a central axis, or either side of more than one axis relative to the panel.

Preferably a number of the jets is aligned collinearly with such an axis (preferably the centreline axis).

Additional jets may be positioned tangentially from the axis a distance 'x' and axially along the string centreline 'y'. The dimensions x and y can be referenced to a ratio of the jet diameter. A preferred ratio is 10, with a preferred range of 5 to 25.

Spent fluid drains enable removal of the air after impinging on the rear of the PV panel from the respective jets. Spacing between adjacent plenums and/or between at least one said plenum and a peripheral edge of the PV panel and or mounting cassette. Such spacing can be termed the drain width 'w'.

The drain width ('w') can be multiplied with the plenum length 'L' and expressed as a ratio of the plenum cross sectional area after the inlet which is normal to the PV panel surface. The preferred ration may be at least 1 and preferably within a range of 0.5 to 5.0.

A total sum of drain area 'D' may be expressed as a ratio of the plenum cross sectional area immediately after the inlet which is normal to the PV panel surface.

Surface treatment/coating of the rear of the PV panel may be applied which enhances the cooling effect of the jet air flow impingement on the rear of the panel.

Alternatively or in addition, surface treatment of the rear of the PV panel may include a textured surface, such as ridges, undulations, cross hatching, raised or indented/embossed/impressed patterning, random surface texture or roughening. Such surface texture may be applied onto or into the external layer of the PV panel or as an applied sheet.

Attachments or coatings applied to or behind the panel can be provided immediately underneath the jet flow axis, along the jet's surface trajectory and at the boundary between two or more interposing jet flows.

The mounting arrangement may include structural support or definition for the at least one air passage, chamber or plenum and structure for attachment of the hybrid collector or PVVT-HTM to a roof or other support structure.

Preferably the mounting arrangement includes a sealing arrangement to seal the PV panel thereto.

The or each plenum can include insulation, such as a reflective coating or layer, a foam cell wall structure, laminated structure, or combinations thereof.

A photovoltaic thermal system according to at least one form of the present invention may incorporate a power inverter, at least one photovoltaic thermal (PVT) apparatus and a primary air handling unit (AHU).

Preferably, the primary AHU includes at least one fan, ducting interconnections to the at least one PVT apparatus, ducting connections to a combined thermal transfer and storage module (CTTSM), ducting interconnections to an ambient air inlet and an ambient air exhaust. Preferably the AHU further includes at least one valve to direct air flow through a desired flow path for a required duty/service.

The CTTSM transfers the thermal energy (heating/cooling) within the PVT system return air into another medium (such as water, glycol, thermal oil, refrigerant, phase change material (PCM) and/or thermal mass) for use or storage e.g. acts as a heat exchanger.

Thermal storage can include one or more of hot/cooled storage reservoirs (such as water tanks), hot/cooled thermal mass (such as underground) and/or hot/cooled phase change materials (such as liquefiable salts).

Preferably the CTTSM includes at least one heat pump.

It will be appreciated that one or more forms of the present invention enable heating or cooling can be sourced from the PVT system and/or from the CTTSM system.

One or more forms of the present invention utilises an open loop or a closed loop thermal transfer mode. In an open loop mode, whereby ambient air passes through the system and exhausts back to atmosphere i.e. air passing through the at least one air passage, chamber or plenum is eventually exhausted to atmosphere. In a closed loop mode, there is no net air loss from the system, whereby exhausted air is returned to the inlet to pass again through the at least one air passage, chamber or plenum via a thermal load and/or building cavity.

A system incorporating a hybrid said collector, heat transfer apparatus or PVT-HTM of one or more forms of the present invention may monitor flow rate and/or temperature, such as within or through the at least one air passage, chamber or plenum or before or after the jets, or at an intake and/or outlet, or a combination of two or more thereof, and may control a blend of open and closed loop mode air, such that fresh ambient air may be added into closed loop air flow or vice versa, to achieve the required or optimum duty outcome for the system and demands thereon.

One or more forms of the present invention incorporates one or both of two primary modes; closed loop mode and open loop mode.

A further aspect of the present invention provides a method of optimising operation of a combined photovoltaic thermal (PVT) panel and heat transfer apparatus including the steps of either allowing air into the heat transfer apparatus, transferring heat to or from the air passing through the heat transfer apparatus and exhausting the air, or recirculating air within the heat transfer apparatus.

Preferably incoming and outgoing air flows are in balance. Inlet air can be drawn from outside, forced through the PVT circuit and spent air expelled back outside through the exhaust. Alternatively, air within the PVT system is recirculated.

The method may include reducing air flow to allow PV cells/panels to retain heat, such as a higher grade of heat.

The method may include controlling the system to select, as required, an open loop mode to draw in external air and expel spent air to exhaust, or a closed loop mode external air intake and exhaust is reduced and a greater proportion of air within the system is recirculated.

The method may include operating at least one fan to intake and/or exhaust air through the system and/or to force recirculate air through the system. The fan or each fan can be speed controlled to optimise air flow. Multiple fans may be operated in parallel and/or series to optimise air flow control.

The method may include using one or more fans to deliver air to other services such as the outside air exchange module; thermal storage modules; hydronic heat exchange modules, hot water heat exchange module, heat pump condenser/evaporator heat exchange module and internal air distribution.

When in closed loop mode, an air intake system can be operated to intake some external air to replenish or refresh recirculated air.

It will be appreciated that one or more forms of the present invention advantageously provides a heat exchanger with high heat transfer coefficient for planar surfaces with a relatively constant heat flux using a gaseous or liquid fluid as a heat transfer medium.

The heat exchanger can be reversible in that energy can be recovered from the surface from an inbound energy source (such as solar energy), or alternatively the energy within the fluid can be dissipated/rejected to a cold surface or black body like the night sky (e.g. night time cooling by emission of heat from the panel).

One or more forms of the heat exchanger can deliver an even flux of cooling across a complete uninterrupted planar surface that is exposed to a relatively even flux of heating, enabling the heated surface to maintain a relatively even surface temperature profile.

In the case of a solar PVT system, such even flux cooling is valuable to maximise electrical gains recovered through cooling of the cell below operational equilibrium.

To maximise electrical recovery the mean temperature of each cell within the panel string should be identical so that their voltage and current (V-I) characteristics are likewise identical. If they are not identical and there is a broad spread in temperature across the cells then the entire string will be limited by the lower V-I characteristics of the hottest cell/s. This feature is not technically achievable in any other heat exchanger that has a predominately transverse fluid flow path from the entry to the exit point across a planer surface that is greater than the PV cell dimension.

One or more embodiments of the present invention provides a transverse flow path less than the dimension of the item to be cooled, e.g. the PV cell. Increasing the number of flow entry points per unit area reduces the transverse flow path proportionally further increasing the homogeneity of the cooling effect.

One or more forms of the present invention provides a heat exchanger delivering a consistent flow rate from each fluid entry point (hole/jet) at a constant temperature and preferably receives the spent fluid after its traverse flow at a constant exit temperature.

One or more forms of the present invention provides a heat exchanger configured to maintain the consistent flow rate to the fluid entry points (holes/jets) over a range of system flow rates from just above stagnation to maximum flow.

This delivers even heat transfer and the ability to maximise the fluid exergy yield and/or energy yield.

One or more forms of the present invention provides a heat exchanger having a series of baffles reducing the buoyancy induced flow (uncontrolled transverse flow) that may occur on an inclined planar surface at times when exposed to lower flow rates where buoyancy forces maybe equivalent to or greater than the fluid driving force provided by a pump or fan.

One or more forms of the present invention provides a heat exchanger when applied to a uniformly heated planar surface achieves a thermal coefficient of performance greater than an order (1:>10) of magnitude. This is the product of the thermal energy recovered over the energy required driving the fluid e.g. 1:>10; 1:>20, 1:>30 etc.

One or more forms of the present invention provides a heat exchanger when applied to an electrical current generating device such as a Peltier or photovoltaic (PV) cell that can achieve electrical coefficient of performance in excess of the power required to drive it (1:>1). This is the product of the additional electrical energy recovered over the energy required driving the fluid e.g. 1:>1; 1:>2, 1:>3.

One or more forms of the present invention provides a heat exchanger design that incorporates surface features on the planar surface that further enhances the heat transfer rate along the individual transverse flow paths.

It will be appreciated that one or more forms of the present invention provides a PVT system configured to deliver both heating and cooling. Furthermore, when using air as the working fluid, the air can be applied directly and in a closed loop system. The system provides boosted electricity solar production and a source of thermal heat during the day, as well as cooling using the night sky radiation effect at night time.

A heat exchanger according to one or more forms of the present invention can be configured to utilise one or more PV panels currently existing to complete the PVT system.

For a PV panel (or thermal only) design that can be adapted to enhance the thermal yield by introducing a thermal gap between the PV cell (or thermal element equivalent) and an external glazing element. This reduces the conductive potential between the cell and the ambient conditions. The thermal gap can be achieved either by a stand-off secured to the glazing or the heat exchanger fixtures.

One or more forms of the present invention provides a mounting arrangement that incorporates a number of key integrated features including PV mounting and back face sealing, heat exchanger air plenum mounting and intake sealing, mainline supply and return ducts, and a conduit for electrical connections.

One or more forms of the present invention provides a mounting arrangement that is configurable to support a wide range of ducting options to accommodate complex installations.

One or more forms of the present invention provides a mounting arrangement that can be adapted to accommodate a number of fixing arrangements for a range of installation applications (from roof fixings through to free standing structures).

One or more forms of the present invention provides a heat exchanger using air as the fluid containing moisture incorporates internal condensate generation and collection features which can be used to harvest the water, and the water utilised during the night cooling mode or where ambient is cooler than the introduced air.

One or more forms of the present invention provides a control system that manages the interface with peripheral devices (HVAC, air flow, DHW, pool heaters, battery energy storage), overall PVT system performance, preferably utilising one or more algorithms to prioritize the thermal and electrical output to maximise energy yield and/or financial payback.

The control system preferably receives information received from temperature and fluid flow at various points in the system flow path, and can preferably use fan speed as the primary control to manage the air flow through the system including the heat exchanger.

It will be appreciated that one or more forms of the present invention finds application in:

systems for swimming pool or spa heating:
  directly heating through an air to fluid heat exchanger, with the fluid from the pool;
  indirectly heating via a heat pump extracting heat from the PVT output and transferring the energy to a fluid heat exchanger, with the fluid from the pool;
  a combination of the above.
Centralized District Heating (heat network) and/or Electricity Supply (electricity network):
  direct or indirect, or combination of both direct and indirect, heating as above and/or electricity supply whereby the PVT array is a supplier of heat and/or electricity
Distributed District Heating (heat network) and/or Electricity Supply (electricity network):
  Direct or indirect, or combination of both direct and indirect, heating, as above and/or electricity supply whereby the PVT array supplies the internal heat and/or electricity loads, and
  Preferably also interfaces with both the electrical and heat networks to export surplus PVT generated energy or source PVT shortfalls in matching internal customer requirements
Commercial/Industrial Drying/Heating:
  Direct or indirect (e.g. via the heat pump), or combination of both direct and indirect heating, whereby the PVT array is used to heat and/or dry a commercial or industrial process, such as a feedstock, reagent or product.
  Supply of hot water and steam, such as low-grade steam.

Equally, for one or more of the above heating process/system applications, a respective cooling process/system application can be provided by one or more forms of the present invention, such as by employing the night radiative effect through the PVT panel/system.

BRIEF DESCRIPTION OF THE DRAWINGS

FIG. 3b shows the same block diagram as FIG. 3a and further representing the closed loop mode with air being drawn in from the user space by the air handling unit then be driven through the PVT panel and then returned via the optional thermal transfer and storage module back to the user space according to a further embodiment of the present invention.

FIG. 4 shows a schematic section view of the main PVT components applicable to a building, and in particular illustrates the air flow pathways for an open loop arrangement configured for the PVT cooling mode with occupant air—conditioning (AC) closed loop cooling mode during day time according to at least one further embodiment of the present invention.

FIG. 5b shows a process flow block diagram illustration of the embodiment shown in FIG. 5a.

FIG. 7b shows a process flow block diagram illustration of an application of an evaporative cooler feed from a mains water supply to cool the ambient air inlet temperature in a PVT cooling, open loop, mode according to a further embodiment of the present invention.

FIG. 7c shows a process flow block diagram illustration of an application of an evaporative cooler feed from a chilled water storage supply to cool the ambient air inlet temperature in a day time PVT cooling, open loop, mode according to a further embodiment of the present invention.

FIG. 7d shows a process flow block diagram illustration of an application of an encased chilled mass or phase change material to cool the ambient air inlet temperature in a PVT cooling, open loop, mode according to a further embodiment of the present invention.

FIG. 7e shows a process flow block diagram illustration of the application of an encased chilled mass or phase change material to cool the air inlet temperature according to a further embodiment of the present invention, and in particular shows the chilled mass or phase change material integrated as part of the combine thermal mass and storage module. Unlike the embodiments shown in FIGS. 7b to 7c, the embodiment shown in FIG. 7e is configured to closed loop mode.

FIG. 11b shows a schematic of a partial longitudinal sectional view of the PVT panel arranged onto a mounting cassette according to an embodiment of the present invention. It is a sectional view that is perpendicular to that of FIG. 11a.

FIG. 14a-a shows a schematic of a partial plan view section of the upper surface of a cell air plenum that represents an arrangement incorporating a uniform grid pattern distribution of the jets with drains running down only two sides according to an embodiment of the present invention.

FIG. 14a-b shows a schematic of the cross sectional view of FIG. 14a-a showing the general profile of a square air cell plenum and the localised air flow according to an embodiment of the present invention.

FIG. 14b-a shows a schematic of a partial plan view section of the upper surface of a cell air plenum that represents the arrangement incorporating an offset grid pattern distribution of the jets with drains running down only two sides according to an embodiment of the present invention.

FIG. 14b-b shows a schematic of the cross sectional view of FIG. 14b-a showing the general profile of a triangular air cell plenum and the localised air flow according to an embodiment of the present invention.

FIG. 14c-a shows a schematic of a partial plan view section of the upper surface of a cell air plenum that represents an arrangement incorporating a grid pattern distribution of the jets and internal cell air plenum drains according to an embodiment of the present invention.

FIG. 14c-b shows a schematic of the cross sectional view of FIG. 14c-a showing the general profile of a square air cell plenum with the inclusion of additional drains through the body of the cell air plenum and the resultant localised air flow according to an embodiment of the present invention.

FIG. 14d-a shows a schematic of a partial plan view section of the upper surface of a cell air plenum that represents the arrangement incorporating a series of jet slots along the air cell plenum axial centreline and the incorporation of uniform grid pattern distribution of orifice jets either side of the slots and drains running down each edge according to an embodiment of the present invention.

FIG. 14e-a shows a schematic of a partial plan view section of the upper surface of a cell air plenum that represents the arrangement incorporating a series of jet slots along the air cell plenum axial centreline and the incorporation of offset grid pattern distribution of orifice jets either side of the slots and drains running down each edge according to an embodiment of the present invention.

FIG. 14f-a shows a schematic of a partial plan view section of the upper surface of a cell air plenum that represents the arrangement incorporating only a series of jet slots, with one set aligned with the air cell plenum axial centreline and the other slots normal to the centreline and extending towards the edge towards the drains according to an embodiment of the present invention.

FIG. 14g shows a schematic of a partial plan view section of the upper surface of a cell air plenum represented in FIG. 1d that illustrates an arrangement incorporating a uniform grid pattern distribution of the jets with segmented drains running down only two sides. Further included schematics of the cross sectional views B-B (FIG. 14gB-B) and C-C (FIG. 14gC-C) showing the general profile of an air cell plenum and the localised slotted drains for spent air flow according to an embodiment of the present invention.

FIG. 14h shows a schematic of a partial plan view section of the upper surface of a cell air plenum represented in FIG. 1e that illustrates an arrangement incorporating a uniform grid pattern distribution of the jets with segmented drains running down only two sides. Further included schematics of the cross sectional views B-B (FIG. 14hB-B) and C-C (FIG. 14hC-C) showing the general profile of an air cell plenum and the localised drains for spent air flow according to an embodiment of the present invention.

FIG. 14i shows a schematic of a partial plan view section of the upper surface of a cell air plenum represented in FIG. 1f that illustrates an arrangement incorporating a uniform grid pattern distribution of the jets with spoon drains incorporated between the jets normal to the PV cell centreline. The spoon drains cross-sectional area increases as it progresses from the PV cell centreline to the drain located on the PV cell perimeter. Drains run in an array down only two sides. Further included schematics of the cross sectional views B-B (FIG. 14iB-B) and C-C (FIG. 14iC-C) showing the general profile of an air cell plenum and the localised drains for spent air flow according to an embodiment of the present invention.

FIG. 15d shows a schematic illustration of a cross section view A-A of a single jet as referred to in the embodiment illustrated in FIG. 15c.

FIG. 15e shows a schematic illustrating a cross section of the PVT panel with the inclusion of a deflector ridge applied to the PV panel underside that is fitted coaxially along the full length of each drain between each cell air plenum according to an embodiment of the present invention.

FIG. 20a shows a schematic of a longitudinal cross sectional view of a PVT panel as illustrated in FIG. 17a. An insulating barrier is shown applied to the inner surface of the intake and return duct to prevent heat gain and loss.

FIG. 20b shows a schematic of a longitudinal cross sectional view of a PVT panel as illustrated in FIG. 17a. Insulating expanded foam is shown applied to the voids within the body of the mounting cassette intake and return duct to prevent heat gain and loss.

FIG. 21a shows a schematic of a cross sectional view of a roof mounting arrangement of a PVT panel according to an embodiment of the present invention. The PVT mounting cassette is shown mounted to a corrugated roof structure by utilising screw fasteners to secure into the roof battens/supports. The inclusion of underside ridges aligned with the corrugation valleys enables the fixing to the roof without deforming the corrugation.

FIG. 21b shows a schematic of a cross sectional view of a roof mounting arrangement of a PVT panel according to an embodiment of the present invention. The PVT mounting cassette is shown secured to a roof structure using a 'patio profile' by utilising the existing screw fasteners to secure into the roof battens/supports. The inclusion of underside ridges aligned to provide a standoff from the ridge, enables the fixing to the roof without deforming the joins of the patio profile.

FIG. 21c shows a schematic of a cross sectional view of a roof mounting arrangement of a PVT panel according to an embodiment of the present invention. It illustrates the securing of the PVT mounting cassette to a roof structure using a trim deck profile by utilising the existing roof fastening screws to secure into the roof battens. The inclusion of underside ridges aligned to provide a standoff from the ridge enables the fixing to the roof without deforming the joins of the trim deck profile.

FIG. 25 shows an isometric schematic illustrating the application of the cantilevered mounting option in a shop awning configuration.

FIG. 26a shows a schematic of a side view illustrating the cantilever mounting of a PVT panel to a vertical wall/structure according to an embodiment of the present invention. In this arrangement the mounting frame facilitates the joining of two PVT panels outward from the wall.

FIG. 26b shows a schematic of a detailed section side view illustrating the PVT panel joint referred to in the embodiment shown in FIG. 26a.

FIG. 26c shows a schematic of a detailed section plan view illustrating the PVT panel joint referred to in the embodiment shown in FIG. 26a.

FIG. 27a shows a schematic of a side view illustrating a freestanding structure which incorporates an array of PVT panels which is four panels wide according to an embodiment of the present invention.

FIG. 27b shows a schematic of an isometric view illustrating the embodiment shown in FIG. 27a with inclusion of an upward inclination of the panels away from the structures central spine.

FIG. 27c shows a schematic of an isometric view illustrating the embodiment shown in FIG. 27a.

FIG. 27d shows a schematic of an isometric view illustrating the embodiment shown in FIG. 27a with inclusion of a downward inclination of the panels away from the structures central spine.

The block diagram has two PVT arrays illustrated. FIG. 30a illustrates a primary fan 186 providing pressurised air to the inlet of both PVT arrays.

FIG. 30b shows a simplified block diagram illustrating a primary fan 186 drawing negatively pressurised air through the return of both PVT arrays according to an embodiment of the present invention.

FIG. 30c shows a block diagram illustrating dual primary fans 186 providing pressurised air to the individual inlets of both PVT arrays according to an embodiment of the present invention.

FIG. 30d shows a block diagram illustrating dual primary fans 186 drawing negatively pressurised air through the individual return ducts of both PVT arrays according to an embodiment of the present invention.

FIG. 30e shows a block diagram illustrating a primary fan providing pressurised air through the inlet of both PVT arrays with the assistance of secondary air fans located in the inlet duct which can be deployed to balance air flow across PVT panels within a string according to an embodiment of the present invention.

FIG. 30f shows a block diagram illustrating a primary fan drawing negatively pressurised air through the return duct of both PVT arrays with the assistance of secondary air fans located in the return duct which can be deployed to balance air flow across PVT panels within a string according to an embodiment of the present invention.

FIG. 30g shows a block diagram illustrating two primary fans 186 providing pressurised air through the inlets of both PVT arrays together with two additional primary fans 186 drawing air in from each return duct according to an embodiment of the present invention.

FIG. 30h shows a block diagram illustrating two primary fans 186 providing pressurised air through the inlets of both PVT arrays together with additional two primary fans 186 drawing air in from each return duct according to an embodiment of the present invention. Additional secondary fans 188 located in the inlet and return duct of each PVT panel array are illustrated for the purpose of additional air flow balancing.

FIG. 31a shows a schematic of the plan view and FIGS. 31aA1-A1 and 31aA2-A2 show respective sectional views of a mounting cassette only to illustrate the placement of an internal singular fan delivering pressurised air to all cell air plenum inlets through a manifold from the intake duct according to an embodiment of the present invention.

FIG. 31b shows a schematic of the plan view and FIGS. 31bB1-B1 and 31bB2-B2 show respective sectional views of a mounting cassette to illustrate the placement of an internal multiple fans delivering pressurised air to dedicated air plenum inlets directly from the intake duct according to an embodiment of the present invention.

FIG. 31c shows a schematic of the plan view and FIGS. 31cC1-C1 and 31cC2-C2 show respective sectional views of a mounting cassette to illustrate the placement of an internal singular fan drawing air from the PVT panel's internal cavity and delivering it to the return duct according to an embodiment of the present invention. The negative pressure developed in the PVT cavity induces flow through the inlet into the cell air plenum and out the respective jets.

FIG. 31d shows a schematic of the plan view and FIGS. 31dD1-D1 and 31dD2-D2 show respective sectional views of a mounting cassette to illustrate the placement of an internal multiple fans drawing air from the PVT panel's internal cavity and delivering it to the return duct according to an embodiment of the present invention. The negative pressure developed in the PVT cavity induces flow through the inlet into the cell air plenum and out the respective jets.

FIG. 35c shows an isometric schematic of the embodiment shown in FIG. 35b when packaged up for transport.

FIG. 36 shows an isometric schematic illustrating an installation of an integrated PVT roof on a commercial application according to an embodiment of the present invention.

DESCRIPTION OF PREFERRED EMBODIMENTS

Figure 1A:
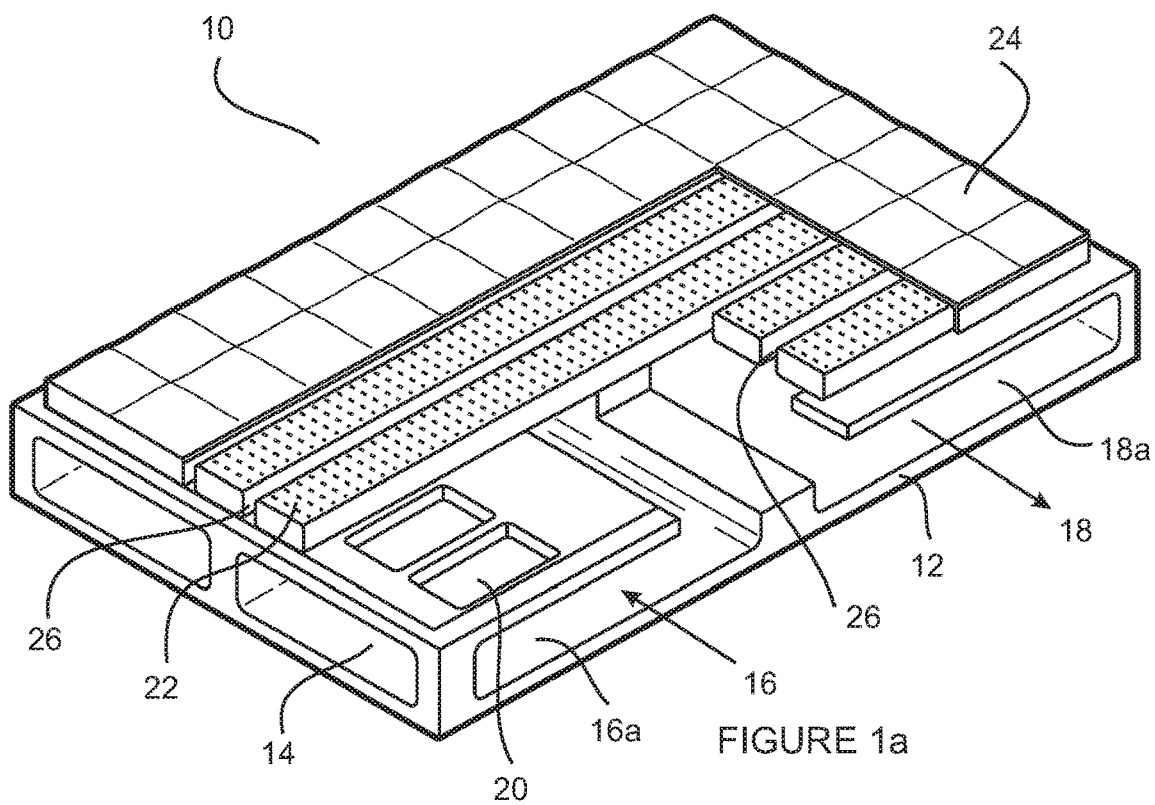
FIG. 1a shows a perspective top view with a pared back cut away section showing the main components; the mounting cassette with embodied ducting, the cell air plenums and the covering solar PV panel according to an embodiment of the present invention.

One or more forms of the present invention relates to a hybrid solar collector or heat exchanger, referred to as an AIR PVT.

It will be appreciated that one or more forms of the present invention marries two technologies, 1. Photovoltaic (PV) and 2. Solar Air Heater (SAH) into one assemblage, installation or panel.

One or more preferred forms of the present invention incorporates a PVT apparatus (PVTA) (1) which includes three elements;
1. PV panel,
2. cell air plenum(s), and
3. mounting cassette, and optionally double glazing, but is not limited to such an arrangement.

Electricity is provided with enhanced operational capacity and a very efficient and adaptable 'heat transfer mounting module' (HTMM). The HTMM is tunable to provide a high grade air heat source and/or flood the panel with evenly distributed cool air to the PV cells to increase electricity production.

One or more forms of the present invention utilises a very effective heat exchange process within the HTMM, which is much less energy intensive to operate, and maintains these conditions consistently across a wide range flow conditions.

In addition or alternatively, one or more forms of the present invention provides enhanced night time cooling using the radiative night cooling phenomena using the PVT apparatus. This same process can also be used to condense water from the atmosphere.

Some preferred embodiments of the present invention are illustrated in FIGS. 1a to 1f.

In particular, a PVT apparatus 10 includes a body 12 having a hollow interior 14 providing chambers/ducts 16a, 18a associated with respective air inflow/inlet 16 and air return 18 ports/channels.

A number of openings 20 convey air through jets 22 to cool an underside of a solar PV panel 24. Spaces between arrays of the jets provide drains 26 for warmed air to flow away via the return channel.

Figure 1B:
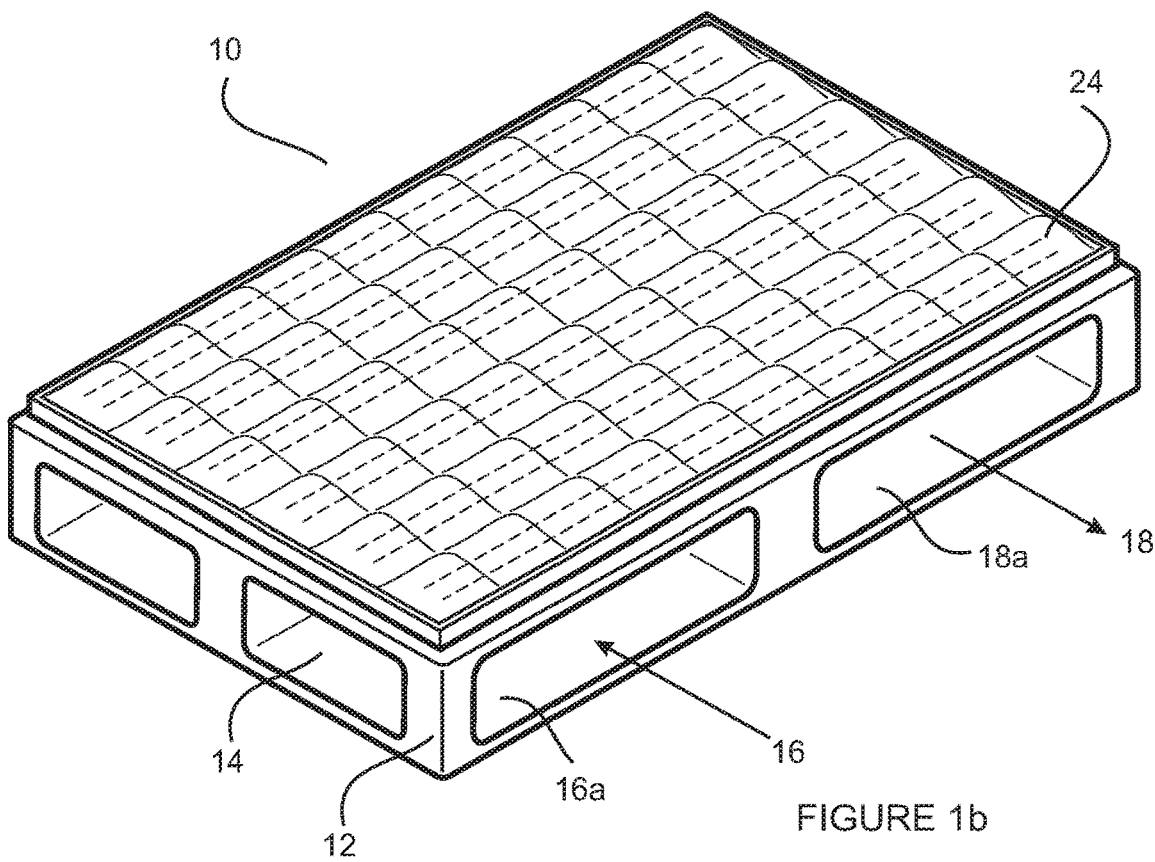
FIG. 1b shows a perspective top view of a complete assembled PVT panel and mounting cassette according to an embodiment of the present invention.

FIG. 1b shows an assembled PVT panel 10.

Figure 1C:
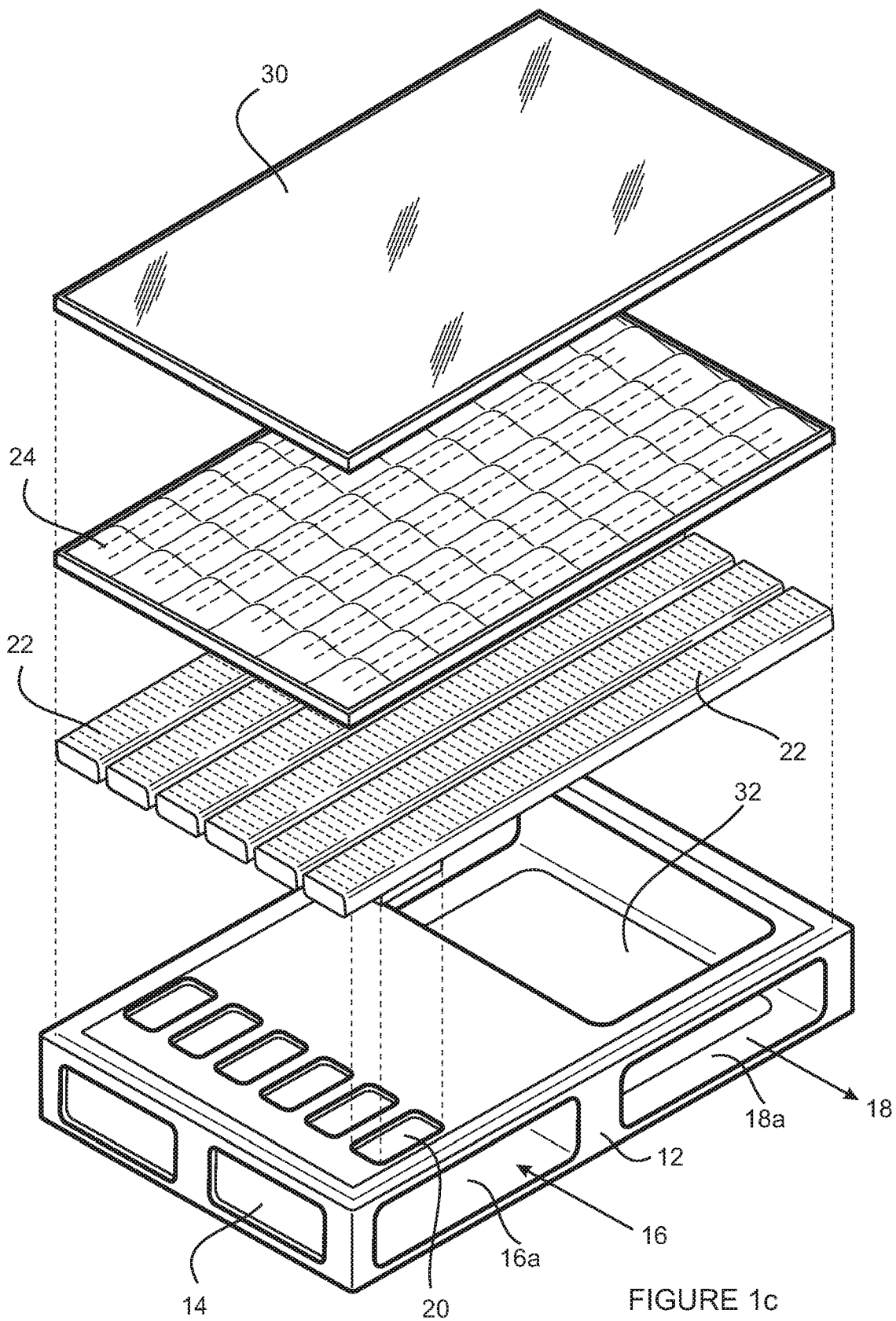
FIG. 1c shows an exploded schematic perspective top view as shown in FIG. 1a showing the main components; the mounting cassette, the cell air plenums, the covering solar PV panel and in this FIG. 1c an optional additional glazing sheet to enhance thermal performance according to a further embodiment of the present invention.

As shown in the exploded view of FIG. 1c, additional glazing 30 can be provided over the PV panel. The spacing between the arrays of jets provides drains 26 for outflow of warm air, which can flow to the return channel 18 via an opening 32.

Figure 1D:
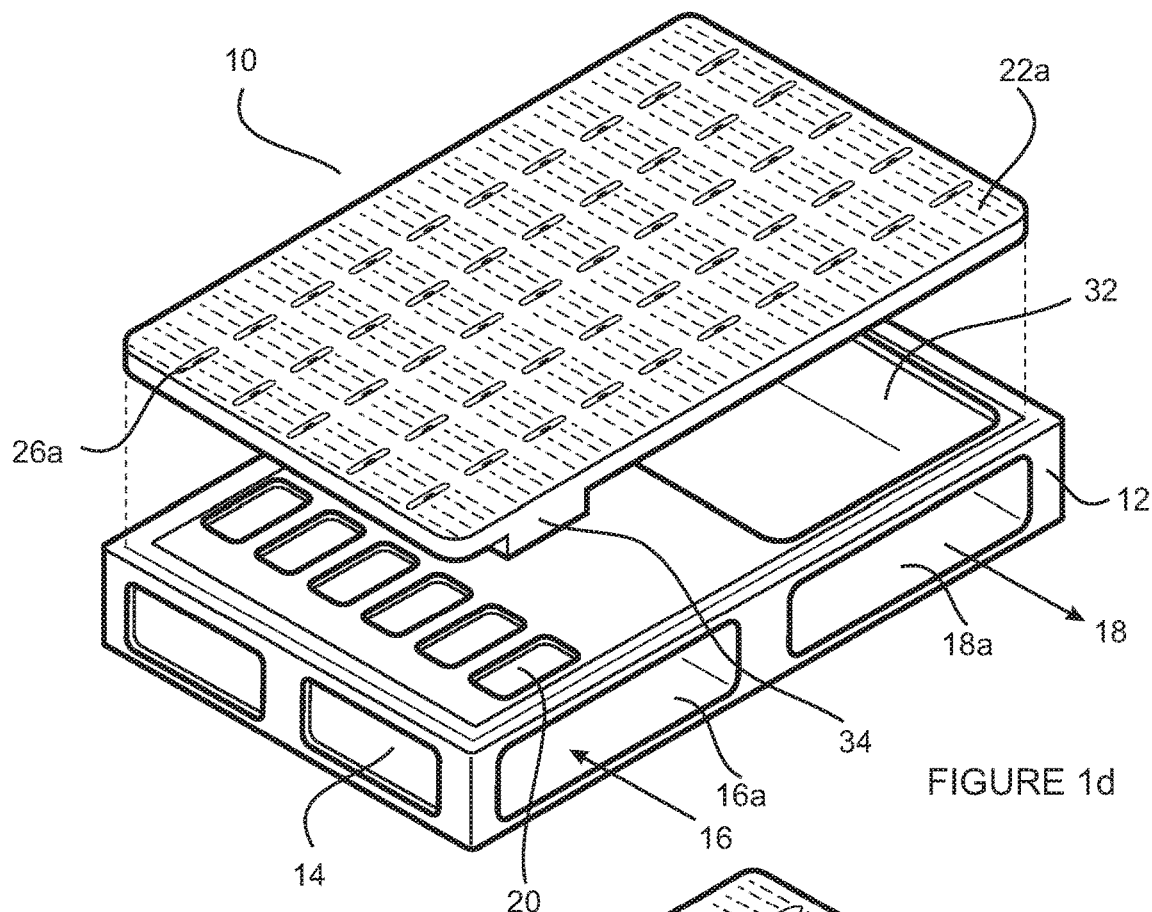
FIG. 1d shows an exploded perspective top view showing the mounting cassette and a single cell air plenum with planar upper surface and slotted drains according to an alternative embodiment of the present invention.

FIG. 1d shows an arrangement of drains 26a incorporated into a panel 22a incorporating arrays of the jets. The panel 22a includes an air interface portion 34 to connect to the inlet openings 20 to the panel of jets.

Figure 1E:
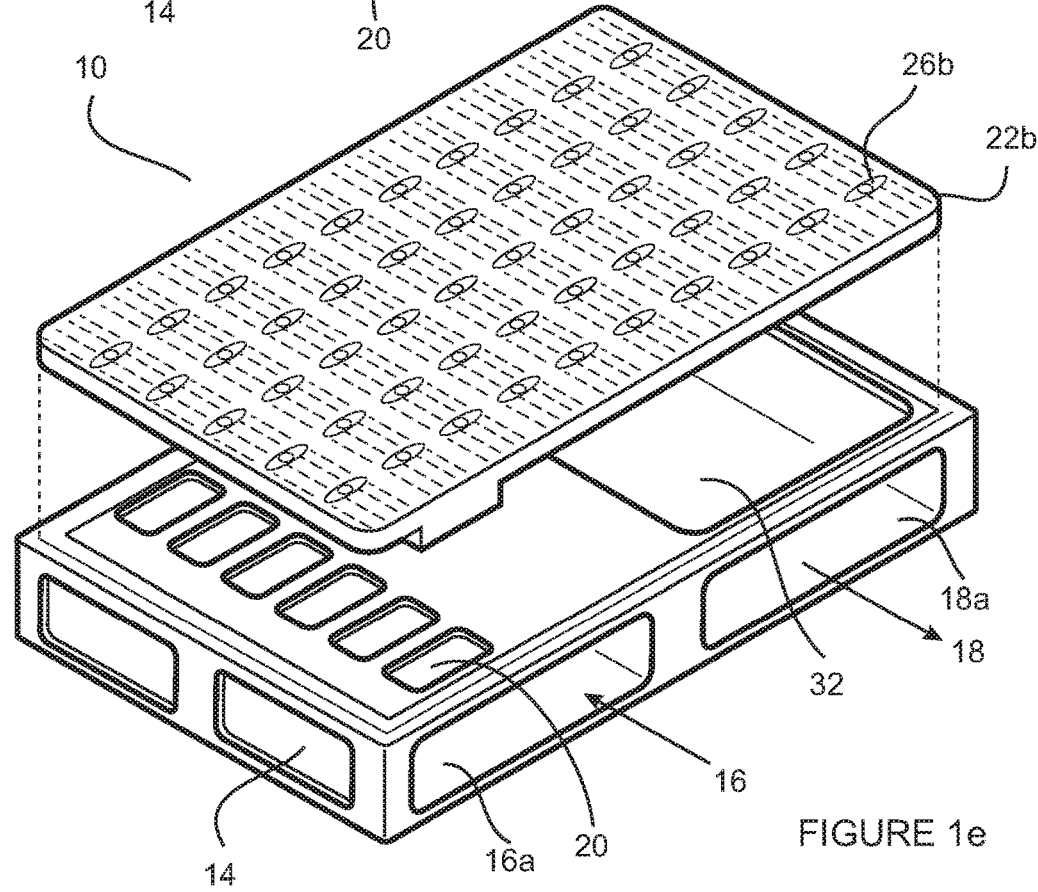
FIG. 1e relates to the exploded perspective top view showing the mounting cassette and a single cell air plenum with planar upper surface and circular drains feed with adjacent spoon drains to collect the spent air at the PV cell perimeter according to an alternative embodiment of the present invention.

FIG. 1e shows an alternative version of the embodiment of a PVT panel of FIG. 1d with larger 'spoon' drains 26b between arrays of the jets.

Figure 1F:
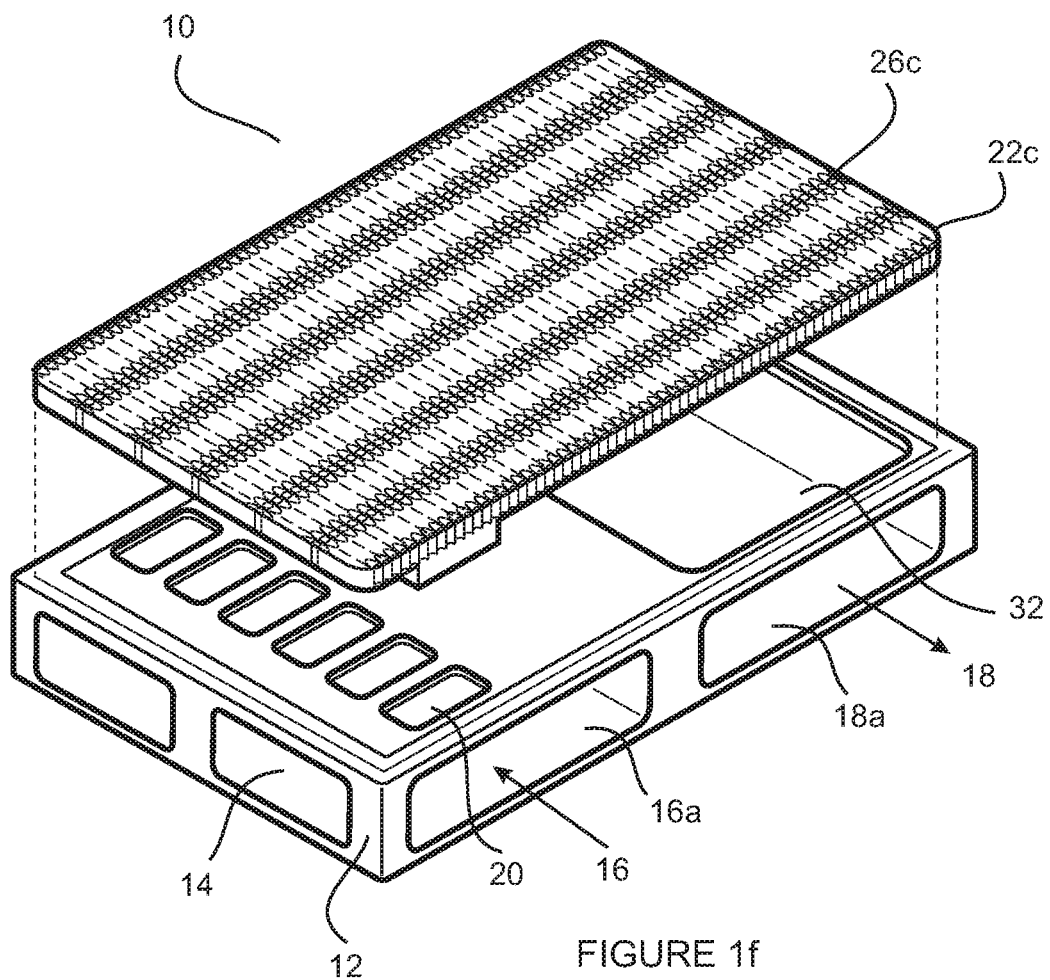
FIG. 1f shows an exploded perspective top view showing the mounting cassette and a single cell air plenum with spoon drains for the spent air incorporated in the planar upper surface. The spoon drains are located between each nozzle line that radiate out perpendicular to the PV string centreline. The spoon drain depth increases as it traverses from the centreline to the PV cell perimeter. At the PV cell perimeter the spoon drain supplies a single circular drain shared with the adjacent PV cell according to an alternative embodiment of the present invention.

FIG. 1f shows a further alternative embodiment of the PVT panel of FIG. 1d or FIG. 1e with larger 'spoon' drains 26c between arrays of the jets.

Figure 2A:
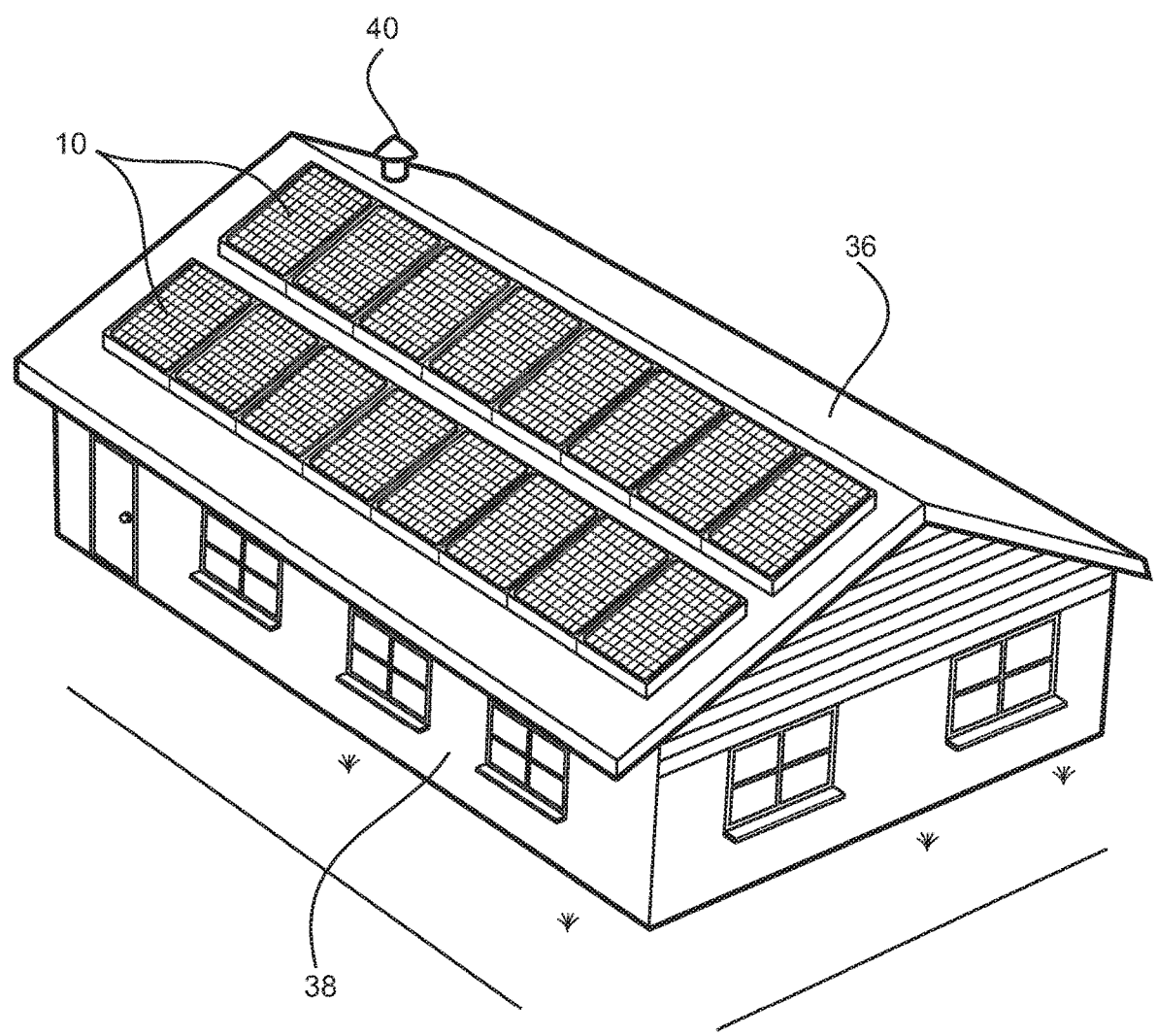
FIG. 2a shows a schematic three dimensional top view of two complete PVT panel array strings in accordance with an embodiment of the present invention shown installed on the roof of a building.

An application of a preferred embodiment of a PVT apparatus 10 is shown mounted to a roof 36 of a building 38 in FIG. 2a.

Figure 2B:
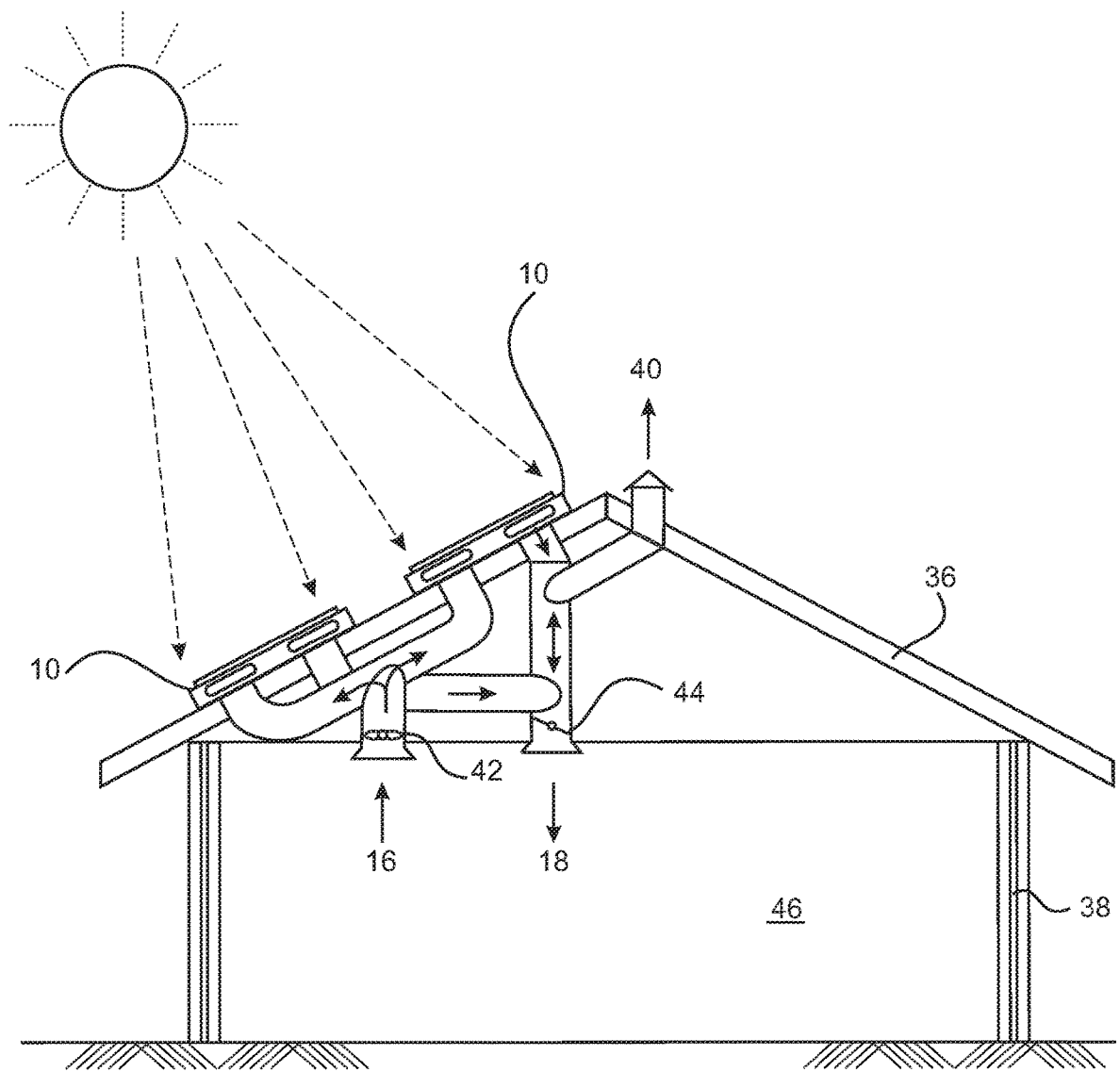
FIG. 2b shows a schematic section view of FIG. 2a showing a simplified ducting arrangement connecting two complete PVT panel array strings with the internals of a building.

FIG. 2b shows a typical arrangement of a system embodying one or more forms of a PVT panel 10 of the present invention in a common domestic roof 36 application on a building 38. Excess heat can be vented to atmosphere via an exhaust 40.

An inflow fan 42 and a return control valve 44 control cycling of cooling/heating into the room(s) 46 of the building.

Figure 3A:
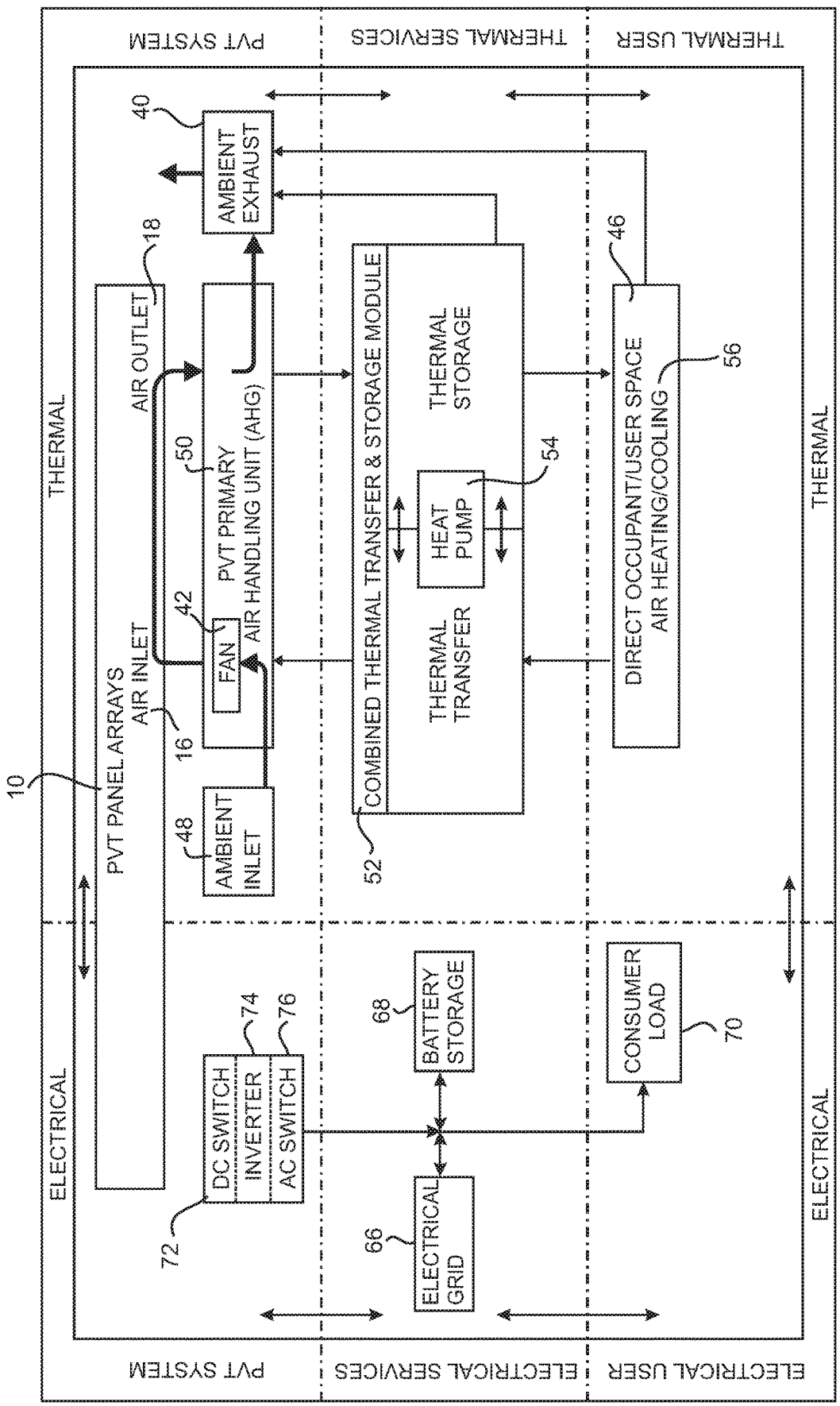
FIG. 3a shows a block diagram representing a complete integrated thermal and electrical system for a typical installation shown separately for both electrical and thermal functions as applied in at least one further embodiment of the present invention.

FIG. 3*a* shows a block diagram representing a complete integrated thermal and electrical system for a typical installation. The block diagram separately presents these for both electrical and thermal functions. The block diagram illustrates the functional relationship between the PVT system; the conversion, transfer and storage systems; and the end user systems.

FIG. 3*a* further represents the open loop mode with air being drawn in from ambient by the air handling unit to then be driven through the PVT panel and then returned to ambient via the exhaust.

FIG. 3*b* shows a similar block diagram as FIG. 3*a* and further representing the closed loop mode with air being drawn in from the user space by the air handling unit then be driven through the PVT panel and then returned via the optional thermal transfer and storage module back to the user space. In closed loop mode there is no net air volume transfer between the user space and ambient.

Electrical supply can come from or to an electrical grid 66. The PVT system can supply electricity to battery/capacitor storage 68 and/or to a consumer load 70. DC electrical supply 72 from the PVT panels 10 can go through an inverter 74 and AC switching 76 to supply the grid 66 and/or the storage 68

FIG. 4, illustrates the air flow pathways for an open loop arrangement configured for the PVT cooling mode with occupant air—conditioning (AC) closed loop cooling mode during day time according to at least one further embodiment of the present invention.

Ambient air flows into an ambient air inlet 48, drawn in by a fan 42. The fan pushes the air into the inlet 16 of the PVT panel(s) 10 via the primary air handling unit (AHU) 50.

Return warm air flows via the PVT primary AHU 50 to escape via the ambient exhaust 40.

A combined thermal transfer and storage unit 52 determines whether air from the PVT panel(s) is diverted to the interior of the building—depending on whether the air is warm or cool and whether the building needs heating or cooling.

A heat pump 54 associated with a heat exchanger 56 (e.g. a cooling coil) can also or instead be used for heating/cooling. UV sanitation lights 58 can be provided to sanitise the air/moisture conveyed through the system. Air can be supplied 60 to/from the heat exchanger. Filters 64 remove particulates from the air.

Figure 5A:
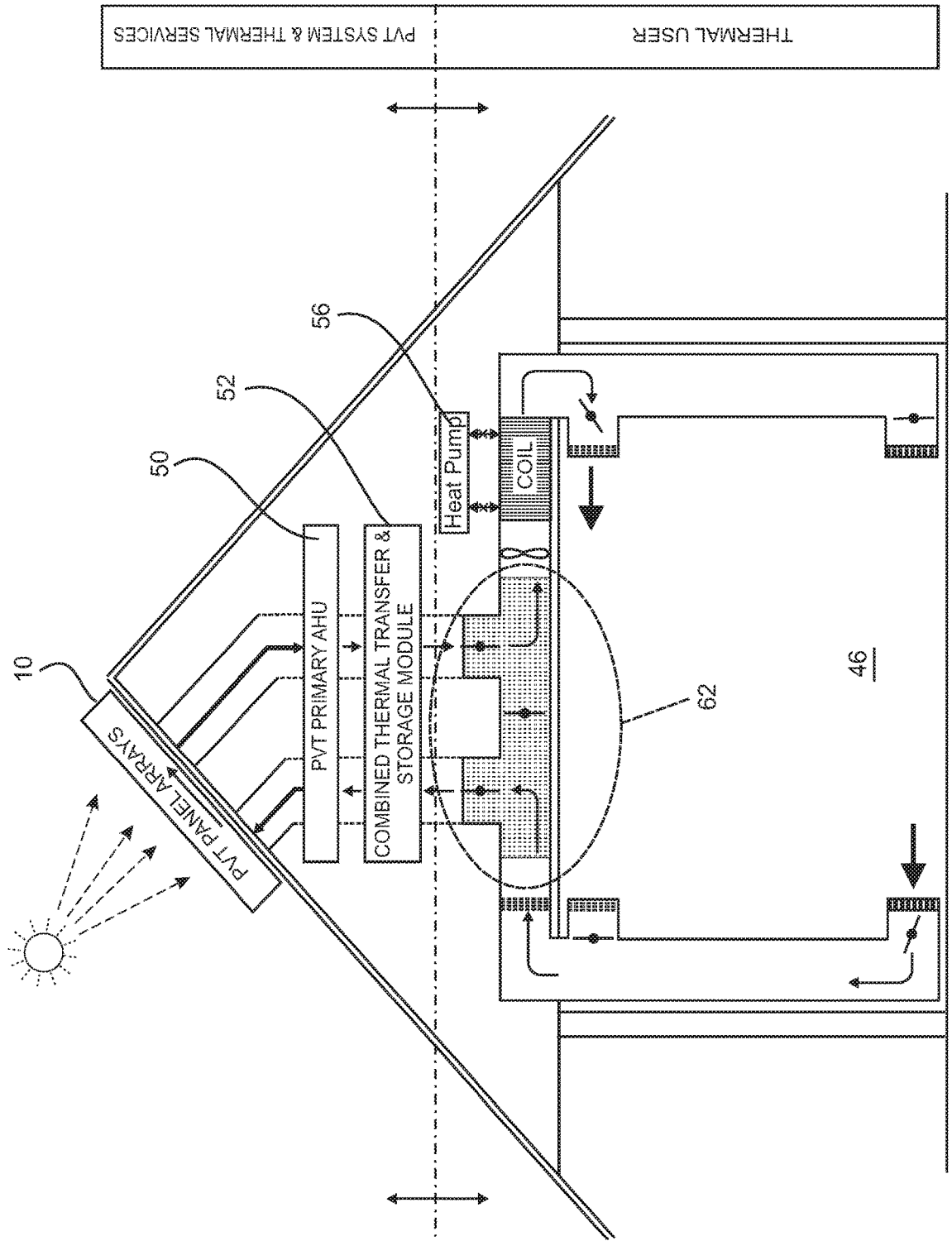
FIG. 5a shows a schematic section view of the main PVT components for a building application (such as a dwelling), and in particular illustrates the air flow pathways for a closed loop arrangement configured for heating mode during day time according to a further embodiment of the present invention.

In a closed loop system shown in FIG. 5*a* by way of example, a PVT to heating, ventilation, and air conditioning (HVAC) interface module 62 can be provided.

Figure 5B:
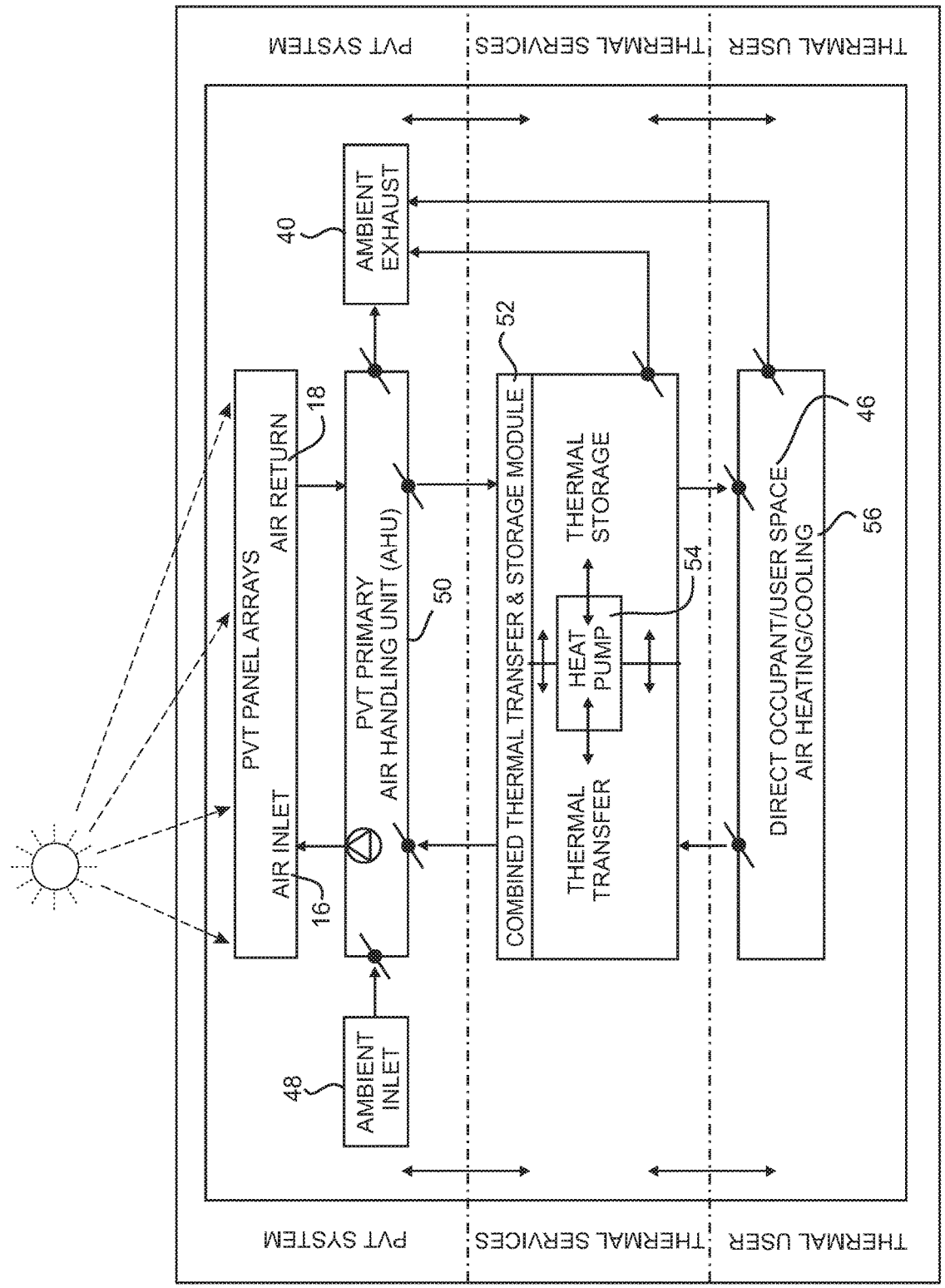
Figure 5C:
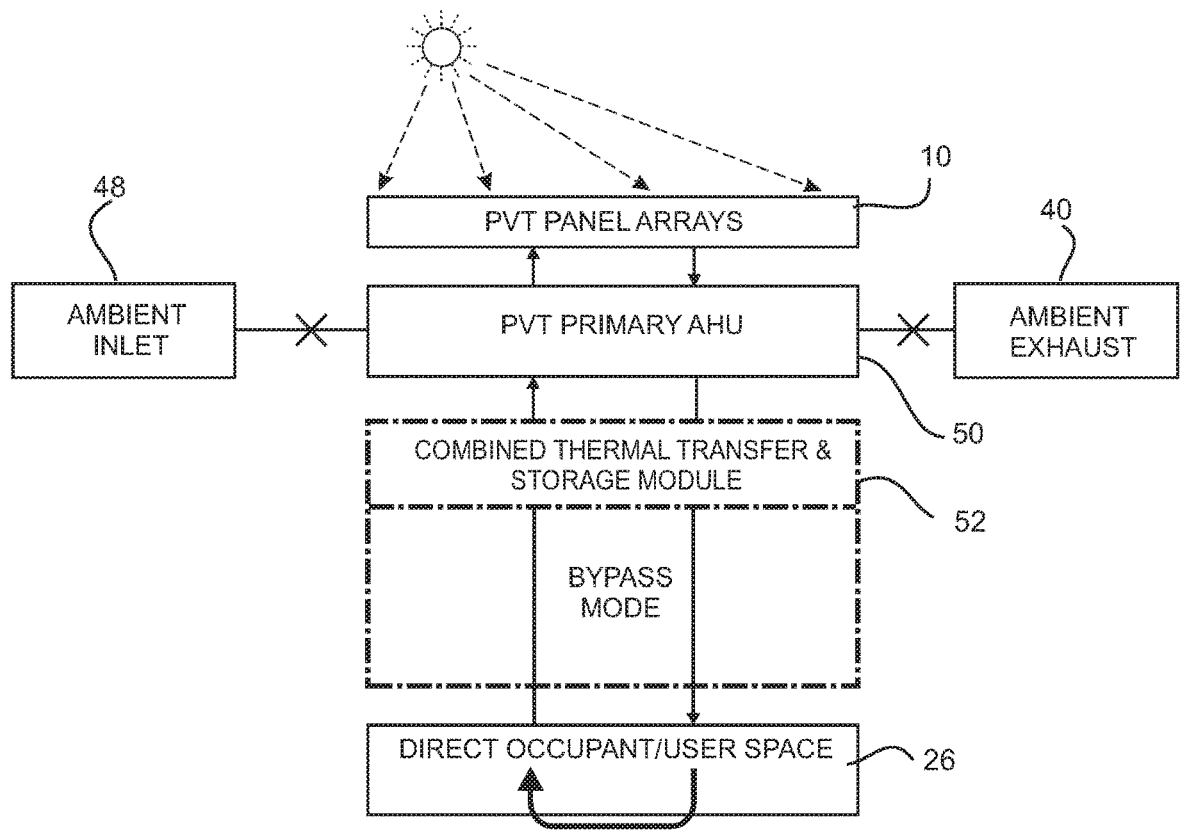
FIG. 5c shows a process flow block diagram illustration of FIG. 5b configured for direct occupant heating mode in closed loop mode. It illustrates the option of a thermal transfer and storage module being bypassed or in some applications the option of a thermal transfer and storage module not being supplied as part of the installation.
Figure 5D:
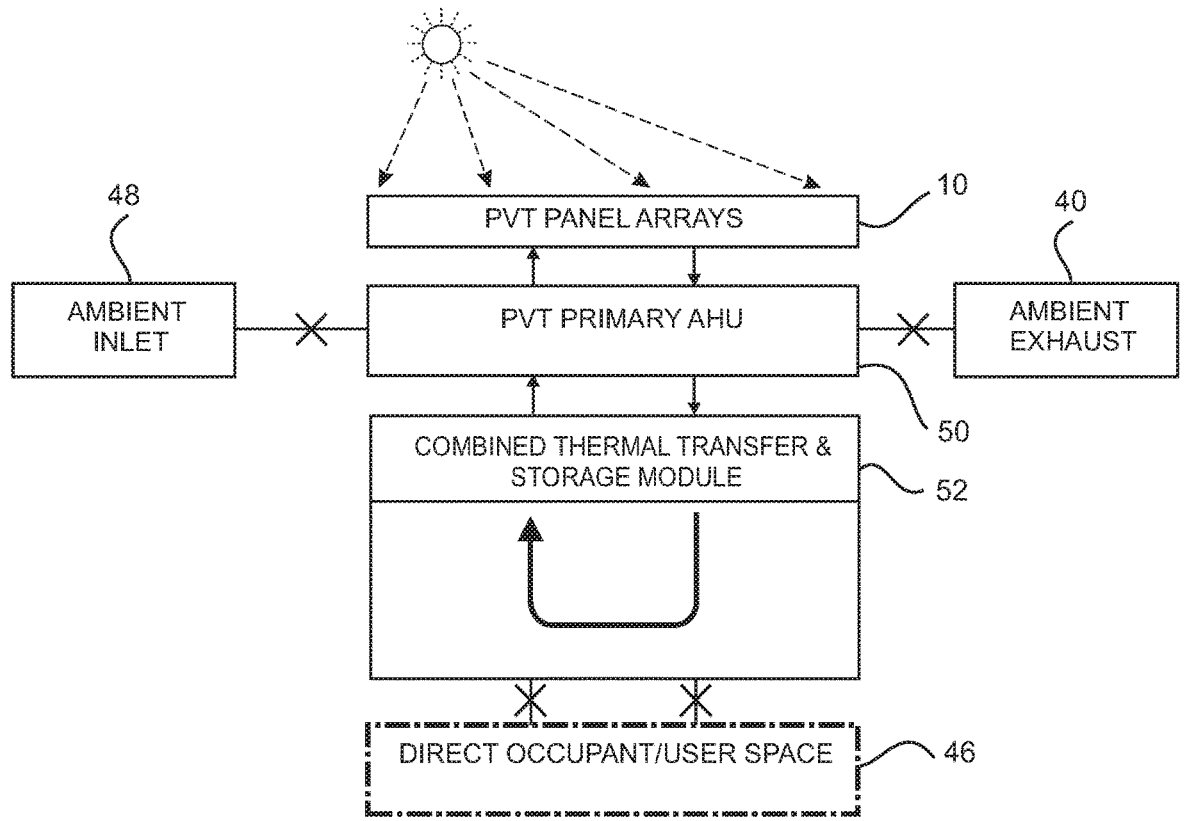
FIG. 5d shows a process flow block diagram illustration of FIG. 5b configured for direct thermal transfer and storage heating mode in a closed loop mode, and in particular illustrates the occupant/user space being isolated or not being supplied as part of the installation according to a further embodiment of the present invention.
Figure 5E:
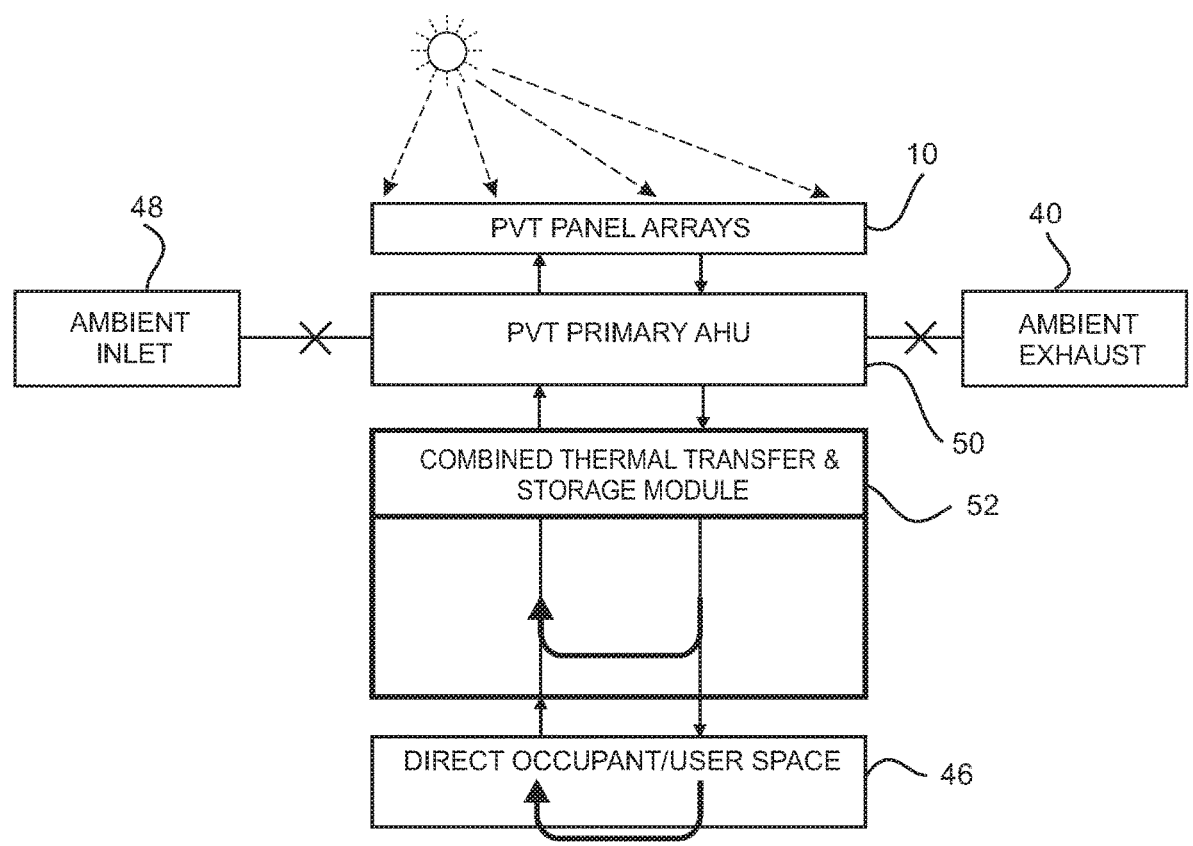
FIG. 5e shows a process flow block diagram illustration of FIG. 5b configured for both direct occupant/user heating mode and thermal transfer and storage heating mode (combined heat mode), and in particular illustrates the option to vary the flow between the two thermal demands to best match the user's requirements according to a further embodiment of the present invention.

FIG. 5*b* shows an example of daytime PVT flow options. FIG. 5*c* shows an occupant heat mode whilst FIG. 5*d* shows a thermal storage mass (in the combined storage and heating module 52) heating mode FIG. 5*e* shows an example of conducting both thermal mass storage and closed loop occupant heating.

Figure 6A:
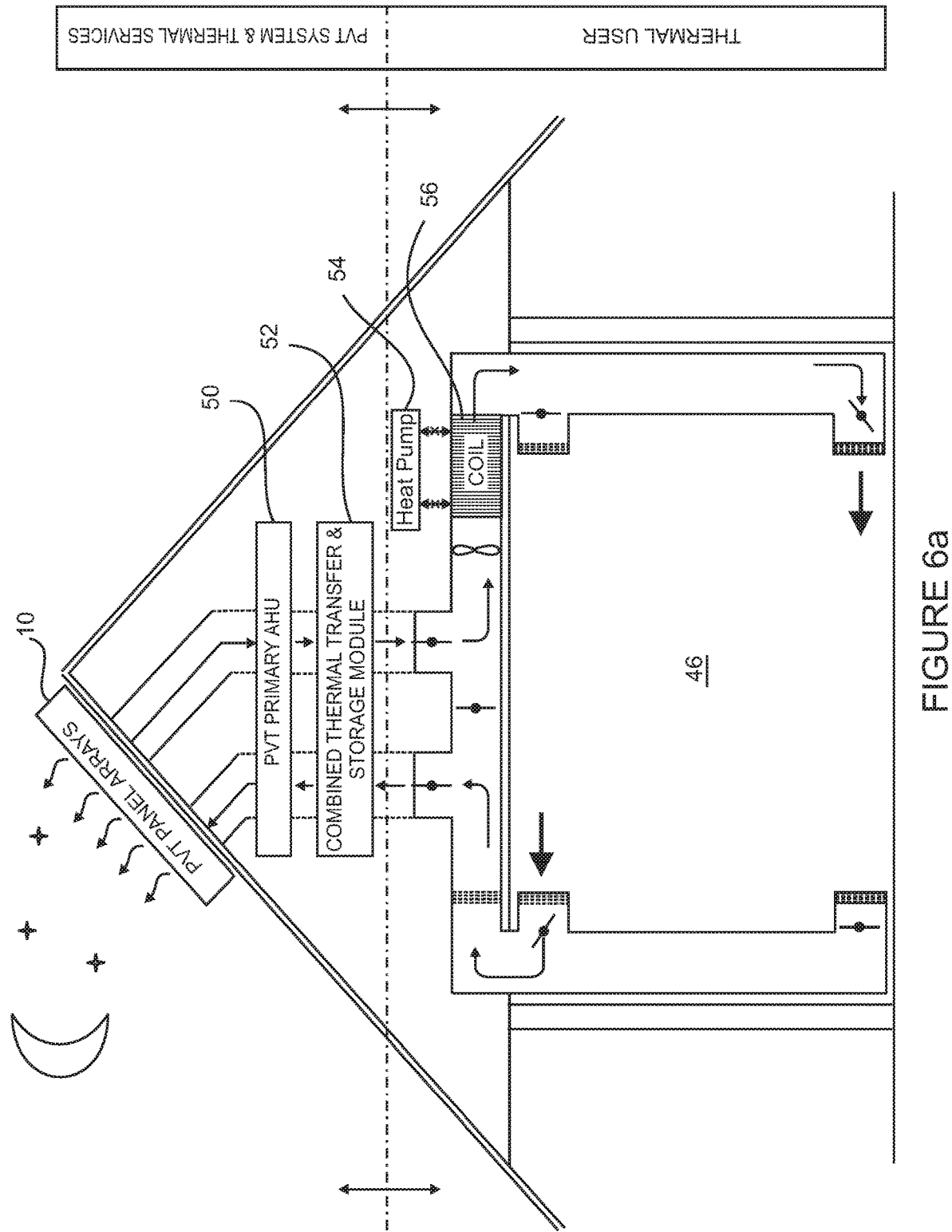
FIG. 6a shows a schematic section view of the main PVT components for a building application, and in particular illustrates the air flow pathways for a closed loop arrangement configured for night cooling mode according to a further embodiment of the present invention.

A night time/evening arrangement is shown in FIG. 6*a*. During the cooler evening/dark hours, the PVT panels 10 can radiate heat, which can be removed from within the building and cooler air pumped into the rooms 46.

Figure 6B:
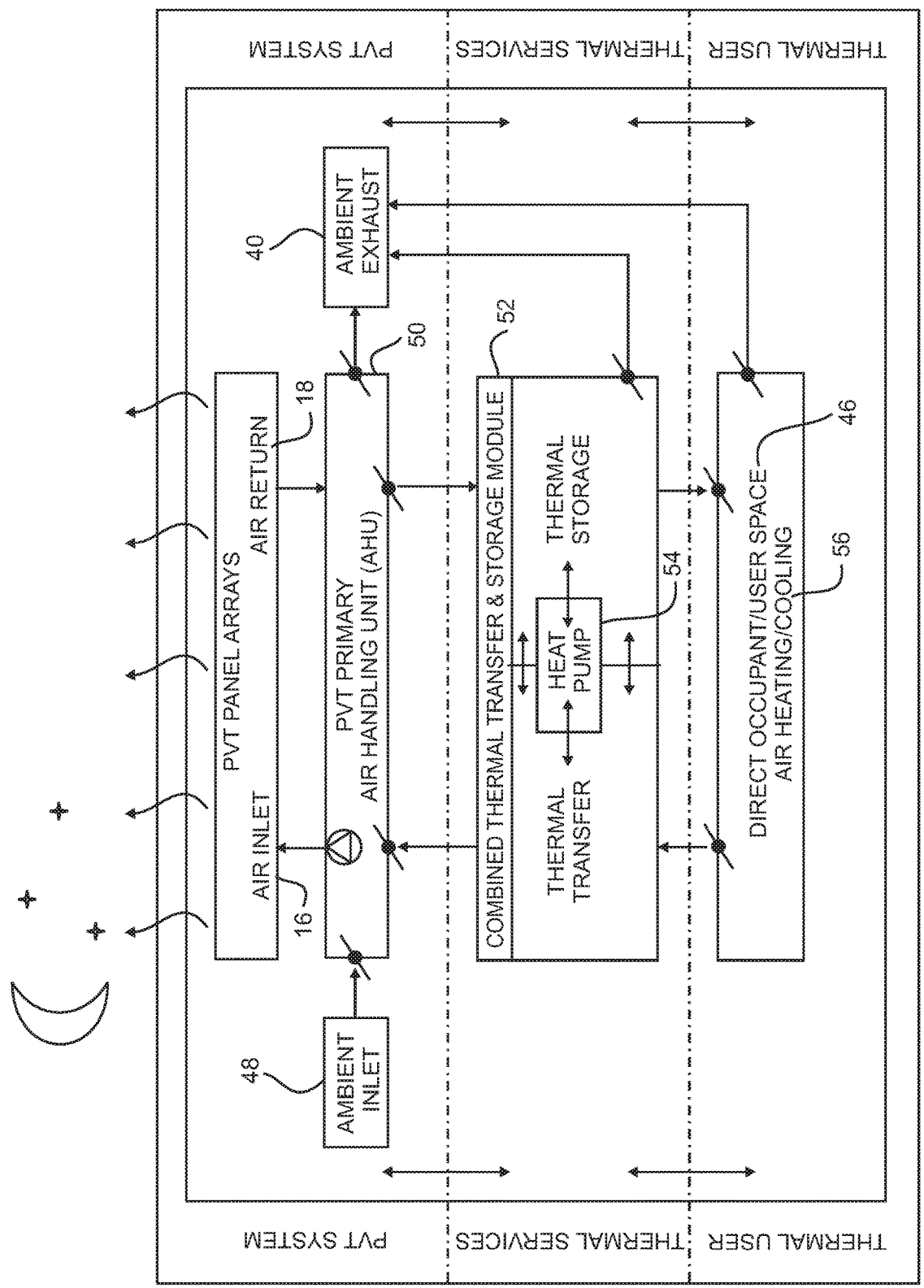
FIG. 6b shows a process flow block diagram illustration of a PVT installation of FIG. 6a showing process options.

FIG. 6*b* shows a diagra mm atic arrangement of cooling processes employed during evening/night time.

Figure 6C:
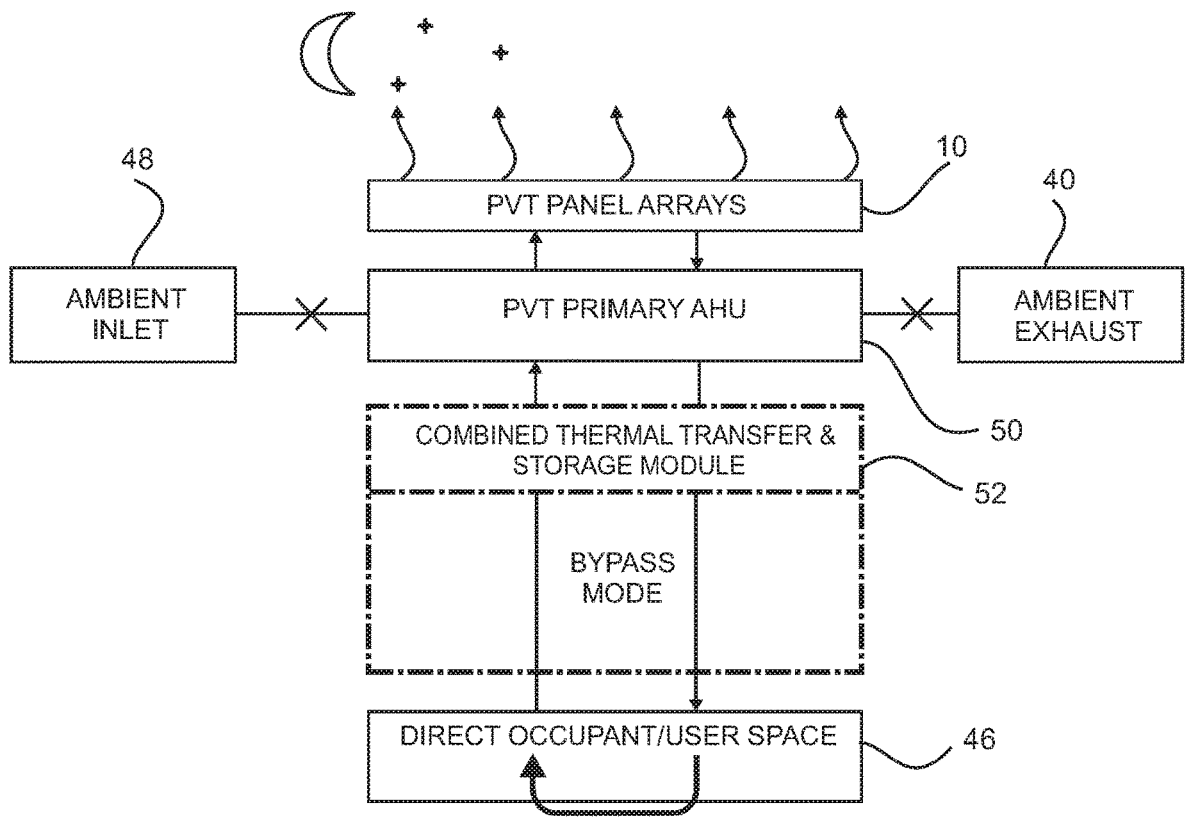
FIG. 6c shows a process flow block diagram illustration of FIG. 6b configured for direct occupant cooling mode, and in particular illustrates the option of a thermal transfer and storage module being bypassed or not being supplied as part of the installation according to a further embodiment of the present invention.
Figure 6D:
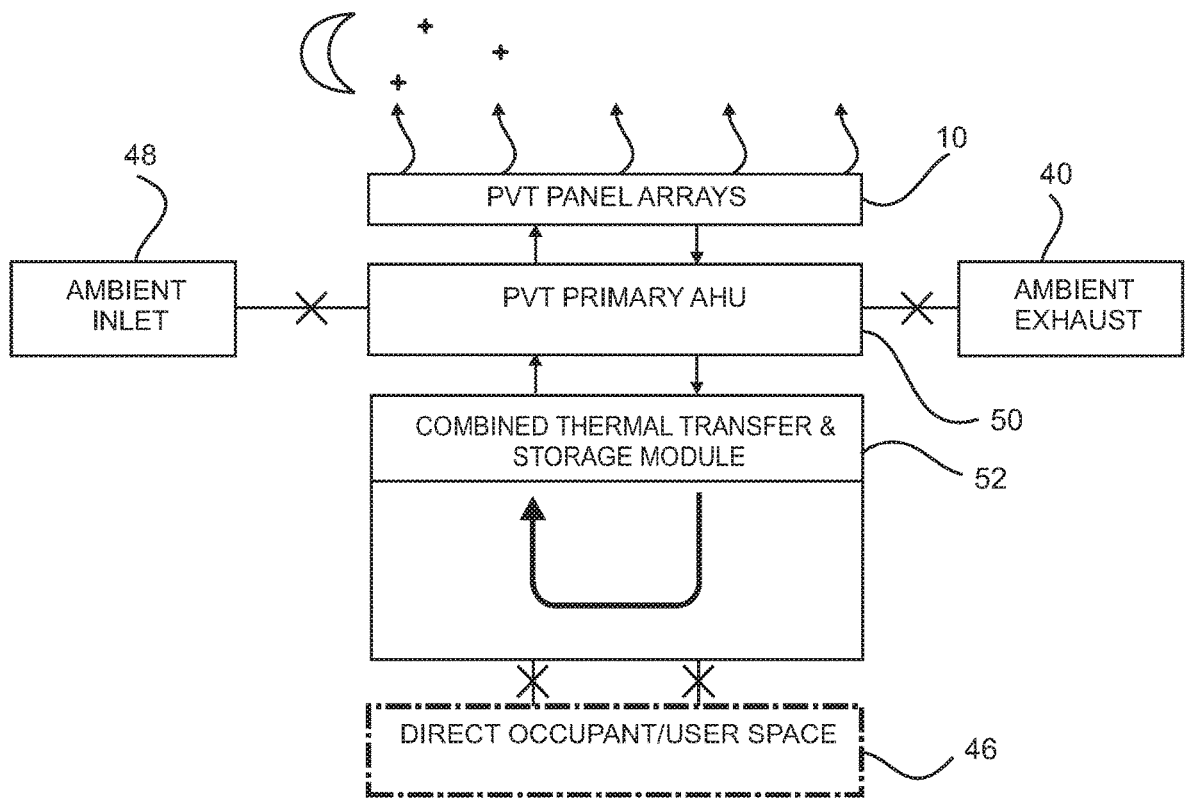
FIG. 6d shows a process flow block diagram illustration of FIG. 6b configured for direct thermal transfer and storage cooling mode, and in particular illustrates the occupant/user space being isolated or not being supplied as part of the installation according to a further embodiment of the present invention.

FIGS. 6*c* and 6*d* show respective occupant cooling mode and thermal mass cooling mode applications.

Figure 6E:
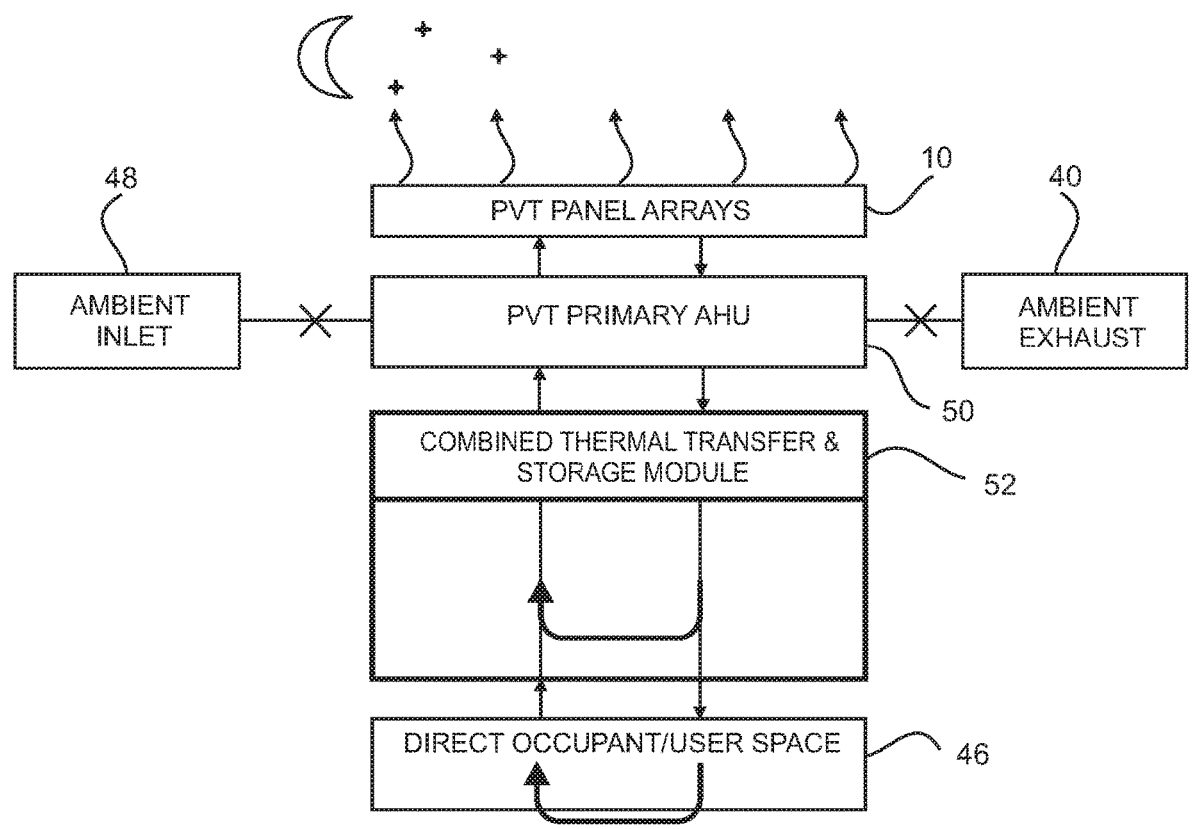
FIG. 6e shows a process flow block diagram illustration of FIG. 6b configured for both direct occupant cooling mode and thermal transfer and storage cooling mode (combined cooling mode), and in particular illustrates the option to vary the flow between the two thermal cooling demands to best match the user's requirements.

FIG. 6*e* shows an example of combined cooling for the thermal mass and the occupants.

Heat Transfer Apparatus:

One or more forms of the present invention employs a jet arrangement that delivers equal cooling potential through a series of cell air plenum's to each individual solar cell. This ensures an equivalent mean cell temperature across the entire panel and PV panel string.

The heat transfer apparatus can employ a process called jet impingement which enables very high heat transfer rates to be achieved in comparison to other heat transfer processes (such as natural and force convention or radiative effects). This allows for compact packaging to be achieved with the potential for the cell air distribution plenums to be completely housed within the existing PV panel envelope. See, for example, FIG. 1*c* showing a plenum arrangement.

The additional benefit of jet impingement cooling (e.g. when coupled with the proposed arrangement of the jets on the cell air plenums and the adjacent drains created between each cell air plenum) is that the air flow can be controlled across the entire flow regime.

Achieving stable air flow ensures stable and efficient heat transfer across operating regimes, such as from low flow high grade heating process conditions through to high volume air flow cooling process enabling PV power capacity boosting.

Figure 11A:
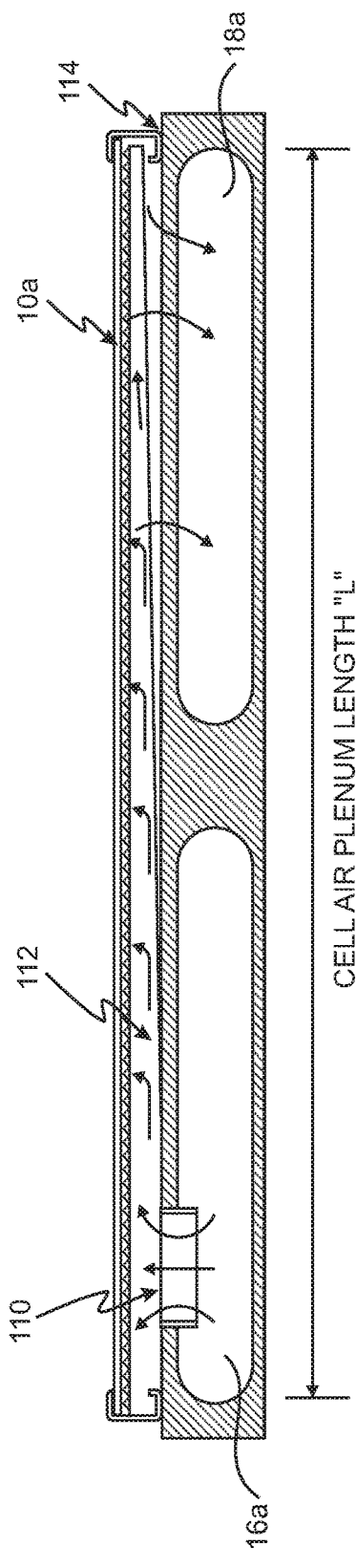
FIG. 11a shows a schematic cross section view of the PVT panel arranged onto a mounting cassette, and in particular illustrates air flow initiating from the supply duct and flowing up into the cell air plenum inlet according to an embodiment of the present invention.
Figure 11B:
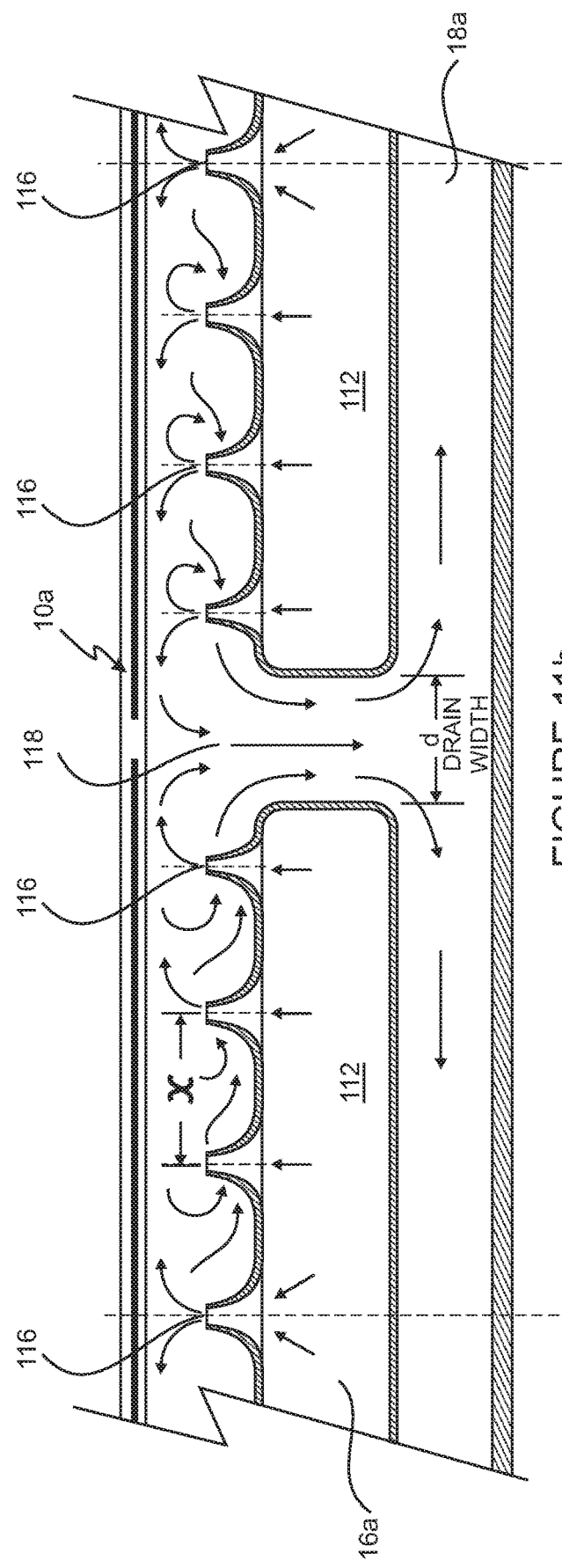

See for example, the flow paths in FIG. 11*a* and FIG. 11*b*. A supply duct 16*a* provides inlet air from the inlet 16 to an inlet port 110 suppling a cell air plenum 112 of the PV cell 10*a*. The PV cell is sealed to the body 12 by a seal 114. Return air from the PV cell air plenum flows into the return duct 18*a* and can then flow from the return outlet 18 to be utilised.

FIG. 11*c* shows a longitudinal cross section of a PVT apparatus according to an embodiment of the present invention. Air flows from the PV cell air plenum via jets/nozzles 116, absorbs heat radiating form the underside of the PV panel 10*a*, and returns via at leats one drain 118 to the return duct 18*a*.

Figure 12A:
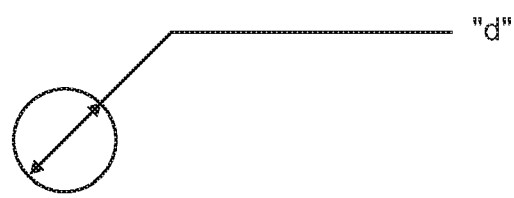
FIG. 12a shows a schematic of an orifice jet with a hole diameter "d" according to an embodiment of the present invention.
Figure 12B:
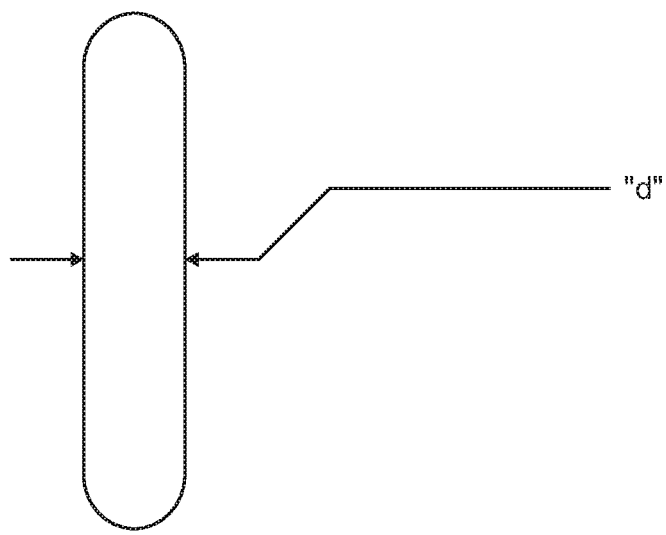
FIG. 12b shows a schematic of a slot jet with a slot diameter/width "d" according to an embodiment of the present invention.

A jet/nozzle 116 can be provided by one or more profiled orifices/holes (x), such as shown in FIG. 12*d* or as a slot (x) as shown in FIG. 12*b*.

A diameter "d" of each jet/nozzle orifice/holes(or width of a jet slot) that can be applied ranges between 0.5 to 5.0 mm in increments of 0.5 mm. A preferred orifice/hole diameter or slot width is 2.5 mm.

Figure 13:
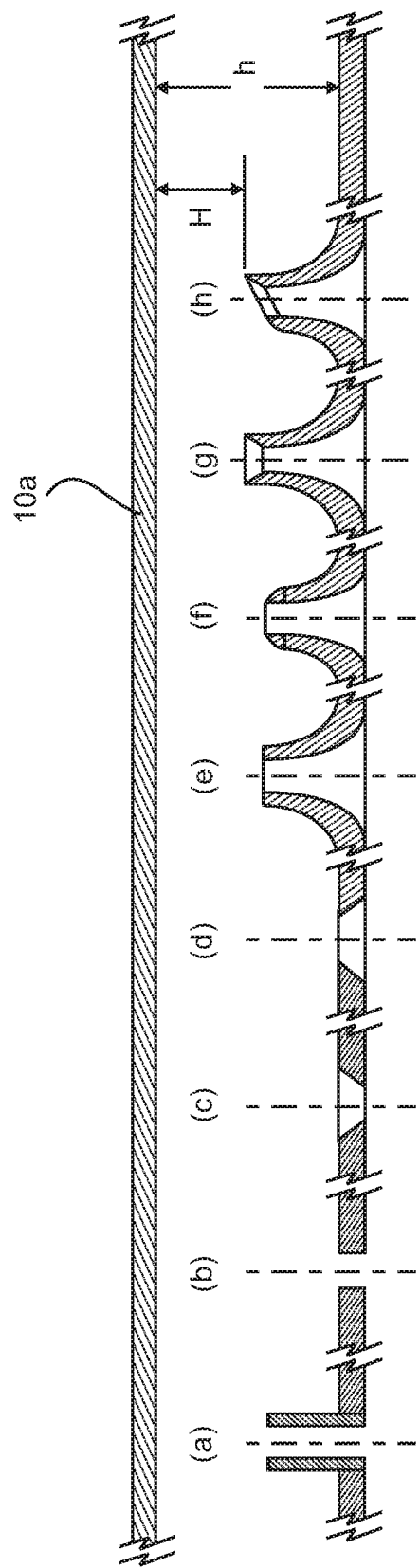
FIG. 13 shows a cross sectional schematic of the profile of various jets, including orifice jet or slot jet (a) generated with a thin wall tube, orifice jet or slot jet (b) generated with a parallel walled drilled or punched hole or slot, an orifice jet or slot jet (c) generated with a countersunk hole or slot with the jet outlet diameter/width being greater than the jet inlet diameter/width, an orifice jet or slot jet (d) generated with a countersunk orifice or slot with the jet inlet diameter/width being greater than the jet outlet diameter/width, an orifice jet or slot jet (e) generated with a converging nozzle with square ends on the outlet normal to the outlet flow, an orifice jet or slot jet (f) generated with a converging nozzle with tapered ends on the outlet, an orifice jet or slot jet (g) generated with a converging nozzle with countersunk end on the outlet, an orifice jet or slot jet (h) generated with a converging nozzle with and angled chamfer on the ends on the outlet, according to at least one embodiment of the present invention.

A cross-section of the jet/nozzle 116 can be can be expressed in several ways; extended straight wall (FIG. 13(*a*)); parallel squared edge profile (FIG. 13(*b*)); convex profile (FIG. 13(*c*)); concave profile (FIG. 13(*d*)); long radius nozzle-square end exit(FIG. 13 €); long radius nozzle—pencil end (FIG. 13(*f*)); long radius nozzle—expansion end (FIG. 13(*g*)); long radius nozzle—mitred end (FIG. 13(*h*)). Reference to a jet also encompasses a nozzle and other orifices/openings for high velocity airflow.

A preferred embodiment of the jet is the application of the long radius nozzle together with a pencil end. Such a cross-section provides for a low friction head loss factor, which reduces the fan power. It also provides for a method to reduce the distance between the jet outlet and the impinging PV cell, whilst providing a larger void for the spent jet fluid to discharge into and drain away through.

Another advantage is that it reduces the entrainment of spent fluid into the jet, resulting in fewer disturbances to the jet structure and improved heat transfer performance.

Height of the jet is defined as "h" for a flush mounted jet. The height of a jet type that is protruding away from the surface is defined as "H" and the route of the jet is defined as "h", such as illustrated in FIG. 13*h*.

The height of the jet "h" is a variable parameter that is dependent on the application. It is a consideration of manufacturability, performance and restriction associated with the available space underneath the panel. The preferred jet height for is 10 mm, with a preferred height range of 5-25 mm.

The height of a protruding jet "H" can be expressed as a proportion of "h". The preferred proportion for this application is 50% to minimise spent fluid entrainment into the jet, with a preferred range of 20 to 80%.

The jet arrangement pattern is based upon generally achieving a consistent repeatable pattern for each PV cell along a PV panel string, with slight modification only being required to be applied in areas such as panel edges, PV panel string ends and obstructions such as PV junction boxes.

The jet arrangement pattern is preferably configurable using combinations of holes and slots of differing diameters and spacing.

The jet arrangement pattern will generally conform to a pattern that can be mirrored about the centreline axis of the PV panel string and will have a series of jets positioned collinearly with this centreline.

The purpose of this arrangement is to divide the flow across the PV cells in half and to initiate the flow regime tangentially out from the centreline to the edge drains to enhance heat transfer and minimise the input power required. The additional jets are spaced tangentially from the centreline at a distance "x" and axially along the string centreline "y". The dimensions "x" and "y" are commonly referenced to a ratio of the jet diameter to enable performance comparison to be undertaken. A preferred ratio is 10, with a possible applicable range of 5 to 25.

FIGS. 14$a$ to 14$i$ illustrate examples of the preferred options of this embodiment, with FIG. 14$e$ showing a particularly preferred embodiment.

In particular, FIG. 14$a$-$a$ shows a schematic partial plan view section of the upper surface of a cell air plenum 112 that represents an arrangement incorporating a uniform grid pattern distribution of the jets 116 with drains 118 running down only two sides according to an embodiment of the present invention. FIG. 14$a$-$b$ shows a schematic of the cross sectional view of FIG. 14$a$-$a$ showing the general profile of a square air cell plenum 112 and the localised air flow according to an embodiment of the present invention.

FIG. 14$b$-$a$ shows a schematic partial plan view section of the upper surface of a cell air plenum 112 that represents the arrangement incorporating an offset grid pattern distribution of the jets 116 with drains 118 running down only two sides according to an embodiment of the present invention.

FIG. 14$b$-$b$ shows a schematic of the cross sectional view of FIG. 14$b$-$a$ showing the general profile of a triangular air cell plenum 112 and the localised air flow from jets 116 according to an embodiment of the present invention. FIG. 14$c$-$a$ shows a schematic of a partial plan view section of the upper surface of a cell air plenum 112 that represents an arrangement incorporating a grid pattern distribution of the jets 116 and internal cell air plenum drains 118 according to an embodiment of the present invention. FIG. 14$c$-$b$ shows a schematic of the cross sectional view of FIG. 14$c$-$a$ showing the general profile of a square air cell plenum 112 with the inclusion of additional drains 118 through the body of the cell air plenum 112 and the resultant localised air flow according to an embodiment of the present invention.

FIG. 14$d$-$a$ shows a schematic of a partial plan view section of the upper surface 112$a$ of a cell air plenum 112 that represents the arrangement incorporating a series of slotted jets/nozzles 116$s$ along the air cell plenum axial centreline and the incorporation of uniform grid pattern distribution of orifice jets 116$o$ either side of the slotted jets/nozzles 116 and drains 118 running down each edge according to an embodiment of the present invention.

FIG. 14$e$-$a$ shows a schematic of a partial plan view section of the upper surface 112$a$ of a cell air plenum 112 that represents the arrangement incorporating a series of slotted jets 116$s$ along the air cell plenum axial centreline and the incorporation of offset grid pattern distribution of orifice jets 116$o$ either side of the slotted jets 116$s$ and drains 118 running down each edge according to an embodiment of the present invention.

FIG. 14$f$-$a$ shows a schematic of a partial plan view section of the upper surface 112$a$ of a cell air plenum 112 that represents the arrangement incorporating a series of slotted jets 116$s$, with one set aligned with the air cell plenum axial centreline and the other slots 116$sn$ normal to the centreline and extending towards the edge towards the drains according to an embodiment of the present invention.

FIG. 14$g$ shows a schematic of a partial plan view section of the upper surface 112$a$ of a cell air plenum 112 represented in FIG. 1$d$ that illustrates an arrangement incorporating a uniform grid pattern distribution of the jets with segmented drains running down only two sides. Further included are schematics of the cross sectional views B-B (FIG. 14$g$B-B) and C-C (FIG. 14$g$C-C) showing the general profile of an air cell plenum 112 and the localised slotted drains 118$s$ for spent air flow according to an embodiment of the present invention.

FIG. 14$h$ shows a schematic of a partial plan view section of the upper surface of a cell air plenum 112 represented in FIG. 1$e$ that illustrates an arrangement incorporating a uniform grid pattern distribution of the jets 116 with segmented drains 118$s$ running down only two sides. Further included schematics of the cross sectional views B-B (FIG. 14$h$B-B) and C-C (FIG. 14$h$C-C) showing the general profile of an air cell plenum 112 and the localised drains 118$s$ for spent air flow according to an embodiment of the present invention.

FIG. 14$i$ shows a schematic of a partial plan view section of the upper surface of a cell air plenum represented in FIG. 1$f$ that illustrates an arrangement incorporating a uniform grid pattern distribution of the jets with spoon drains incorporated between the jets normal to the PV cell centreline. The spoon drains cross-sectional area increases as it progresses from the PV cell centreline to the drain located on the PV cell perimeter. Drains run in an array down only two sides. Further included schematics of the cross sectional views B-B (FIG. 14$i$B-B) and C-C (FIG. 14$i$C-C) showing the general profile of an air cell plenum and the localised drains for spent air flow according to an embodiment of the present invention.

Spent jet fluid drains and their placement are valuable features of one or more embodiments of the present invention. The drains determine how the fluid is removed from jet discharge and conveyed towards the outlet port. The drains are generally achieved as a result of the spaces that are developed between adjacent cell air plenums and the PV panel edge.

Drain width "d" (FIG. 11$b$) when multiplied with cell air plenum length "L" can be expressed as a ratio of the cell air plenums cross sectional area immediately after the inlet which is normal to the PV panel surface. A preferred ratio is at least 1, with a possible range of 0.5 to 5.

An alternative arrangement of one or more embodiments of the present invention includes the adoption of a single air cell plenum for the complete PV panel (instead of a PV string). Such an arrangement can include the provision of drains through the plenum. An example of this is illustrated in FIG. 1d.

The total sum of drain area "D" can be expressed as a ratio of the cell air plenum's cross sectional area immediately after the inlet which is normal to the PV panel surface.

The invention's HTM flow path geometry aims to maintain near constant air velocity from inlet to outlet except in the actual jet. The purpose of this is to keep losses to a minimum and to achieve common pressure profile in any single planar cross-section that is perpendicular to the PV cell surface and perpendicular to the longitudinal axis of the air plenum. This is the primary reason for the tapering down of the cell air plenum from its inlet. See for example FIG. 11d.

One or more forms of the present invention realizes that the heat transfer capacity of the jet can be further enhanced with the adoption of surface treatments on the PV cell 10 backing sheet and/or physical attachments. This feature is not limited to the application of PV heat transfer. For example, see FIG. 15a to FIG. 15e.

The surface treatments referred to include impression(s) or ridges/roughness introduced into the external plastic layer of the PV encapsulation process most widely adopted by industry (aka Du Pont 'Tedlar®' durable, weather-resistant pv backsheet for photovoltaic PV solar panels/modules). These impressions, ridges and/or roughness can be further arranged to mirror and align with the jet 116 pattern. In such arrangement when employing ridgelines 120, the ridgelines could radiate out linearly from the jet centreline/plane (FIG. 15a) or radiate out curvilinear to form a spiral pattern (FIG. 15b).

Figure 15C:
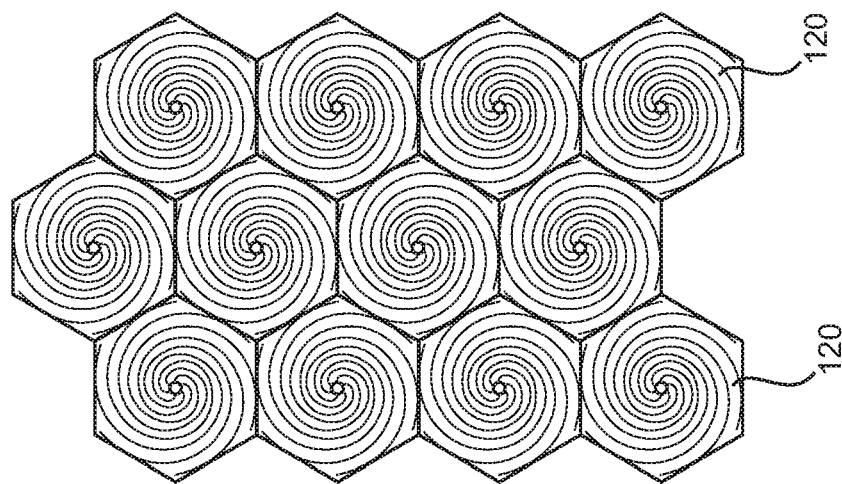
FIG. 15c shows a schematic of a partial plan view section illustrating an alternative surface treatment according to an embodiment of the present invention.
Figure 15B:
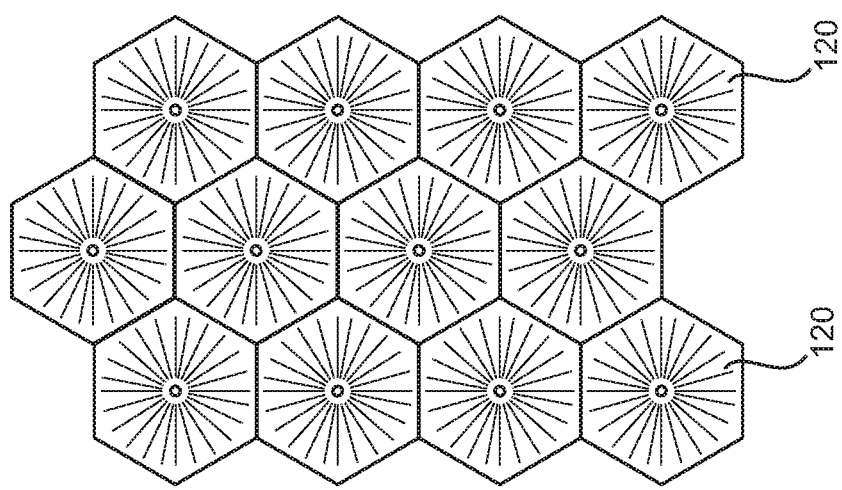
FIG. 15b shows a schematic of a partial plan view section illustrating an alternative embodiment surface treatment pattern of spiralling ridges to be applied to the underside of a conventional PV panel to enhance the heat transfer to the impinging jet according to an embodiment of the present invention.
Figure 15A:
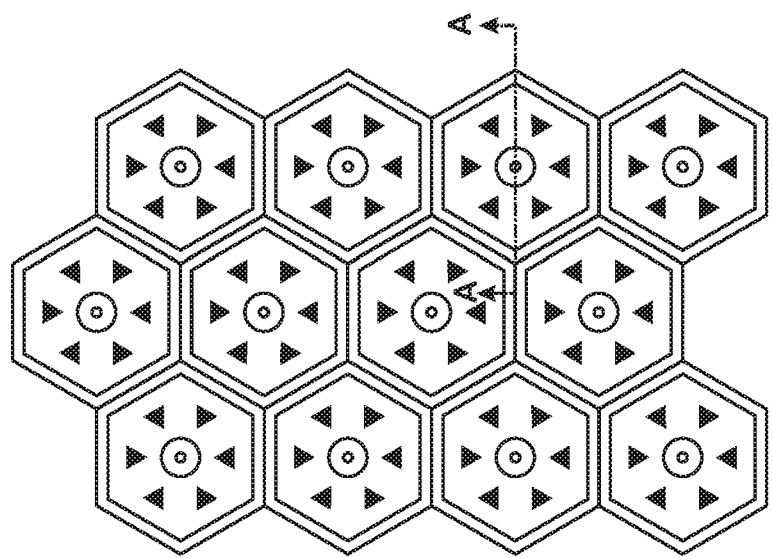
FIG. 15a shows a schematic of a partial plan view section illustrating the surface treatment pattern of radiating ridges to be applied to the underside of a conventional PV panel to enhance the heat transfer to the impinging jet according to an embodiment of the present invention.

The physical attachments referred to can be employed in three general areas of the jet 116 path; immediately underneath the jet axis, along the jet's surface trajectory and at the boundary between two interposing jets (See FIG. 15c and FIG. 15d).

The attachments located underneath the jet can be profiled to provide infinite control to the direction and volume of flow upon impingement with it. This can range from concentric flow (nipple like profile) through to a complete jet change of direction (bucket like profile).

Attachments that are fixed along the jets surface trajectory are employed to induce turbulence in the jet and breakdown the jet boundary layer to replenish it with fresh working fluid.

The attachments located at the jet boundary layers introduce additional surface area to increase thermal conduction and also initiate the direction of the spent fluid away from the heat transfer surface.

Additional physical attachments, such as deflector ridges/projections 128, can be employed directly above the drains 118 to redirect the spent air into the drain 118 to minimise turbulence, such as shown for example in FIG. 15e.

As shown by way of example in FIG. 15d, a deflector 124 can be provided directly above the exit to the jet/nozzle 116. Airflow so directed can be influenced by one or more turbulators 126 introducing turbulence into the airflow. A deflector ridge 120 can redirect the airflow towards the drain 118

Cell Air Plenums 112: The cell air plenums 112 can be manufactured in large quantities using a plastic blow moulding technique commonly employed in forming intake air plenums on engines and within the air conditioning circuit for the automotive industry. Additives can be included in the plastic formulation to enable polymer cross-linking to increase thermal and structural rigidity and increase resistance to fire and UV degradation. The manufacture of the cell air plenums is not limited to this technique, and other techniques, such as injection moulding, vacuum moulding and fabrication, are envisaged.

The cell air plenums for each panel's internal string are in principal the same. Modifications to the mould can be easily implemented to facilitate the customisation of a plenum to accommodate the protruding panel junction box and additional edge jets for extending air coverage when accommodating panels with broad panel frame flanges.

Additional jets 116 can be included around the junction box to increase cooling if required.

PV panel designs envisaged within the present invention may have the junction box omitted from the panel back altogether and include smaller panel flanges reducing the need to customise the plenums.

Figure 16B:
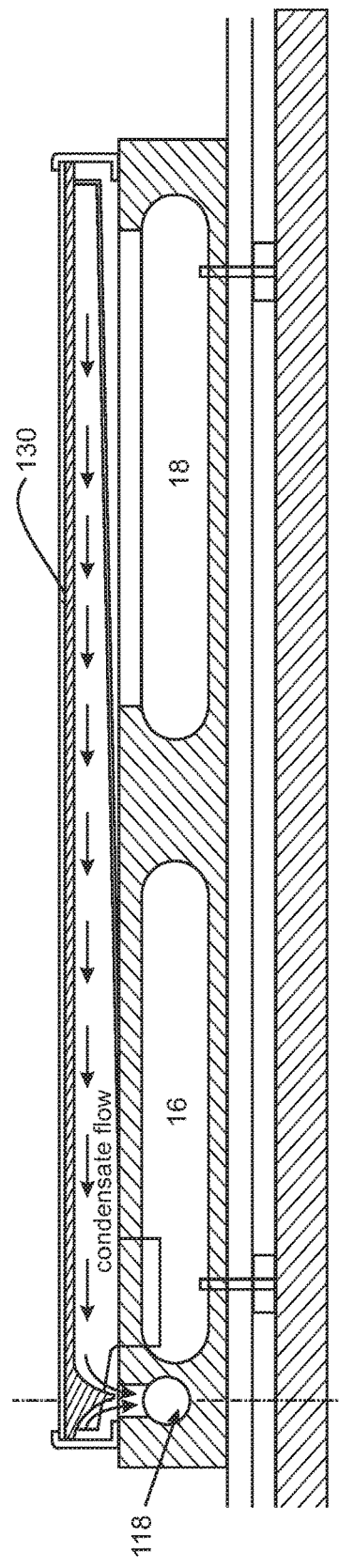
FIG. 16b shows a cross section view schematic of FIG. 16a illustrating the condensate flow pattern along the underside of the panel towards the condensate collection drain via the condensate collection channel according to an embodiment of the present invention.
Figure 16A:
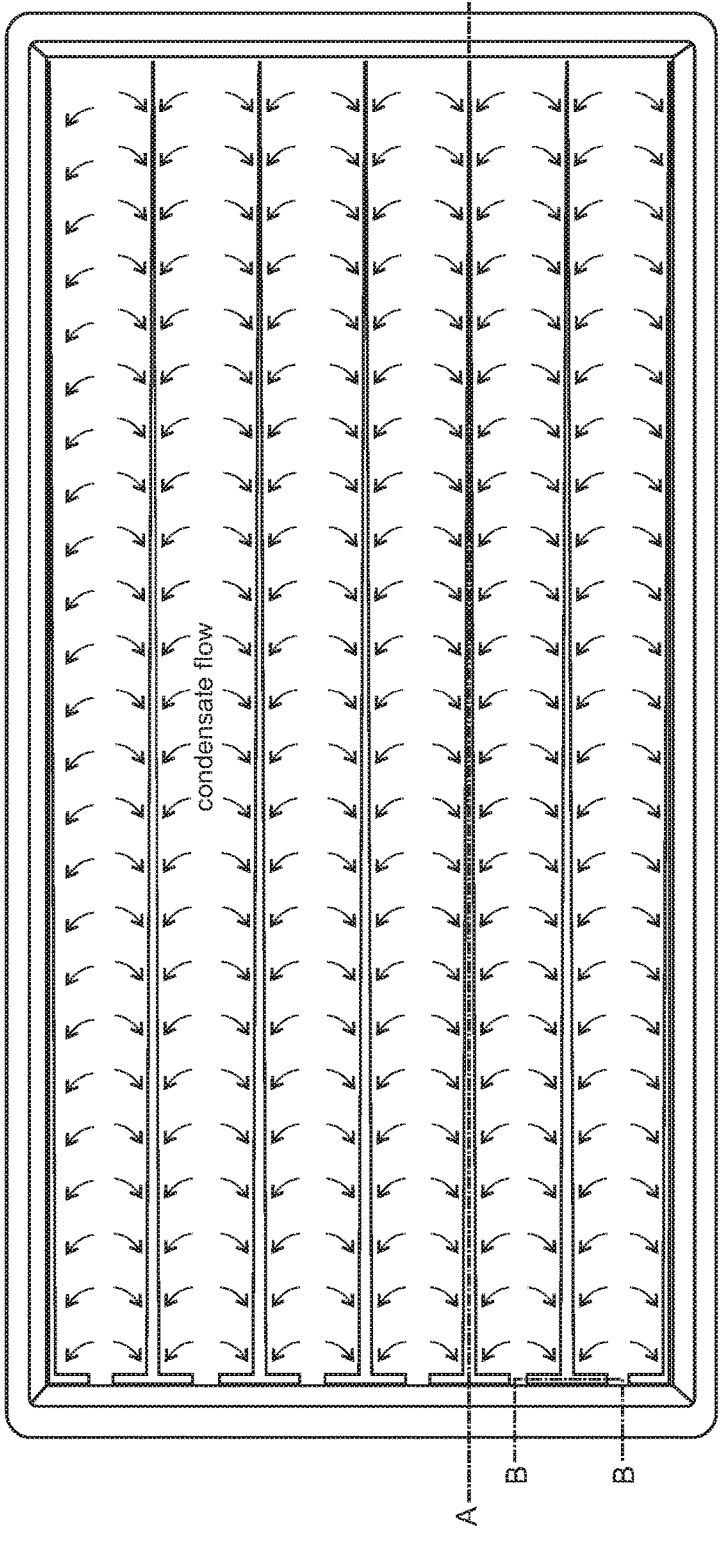
FIG. 16a shows a plan view schematic of the upper surface of the PVT panel illustrating the condensate flow pattern generated from a slightly inclined panel when operating in the night radiative cooling mode according to an embodiment of the present invention.
Figure 16C:
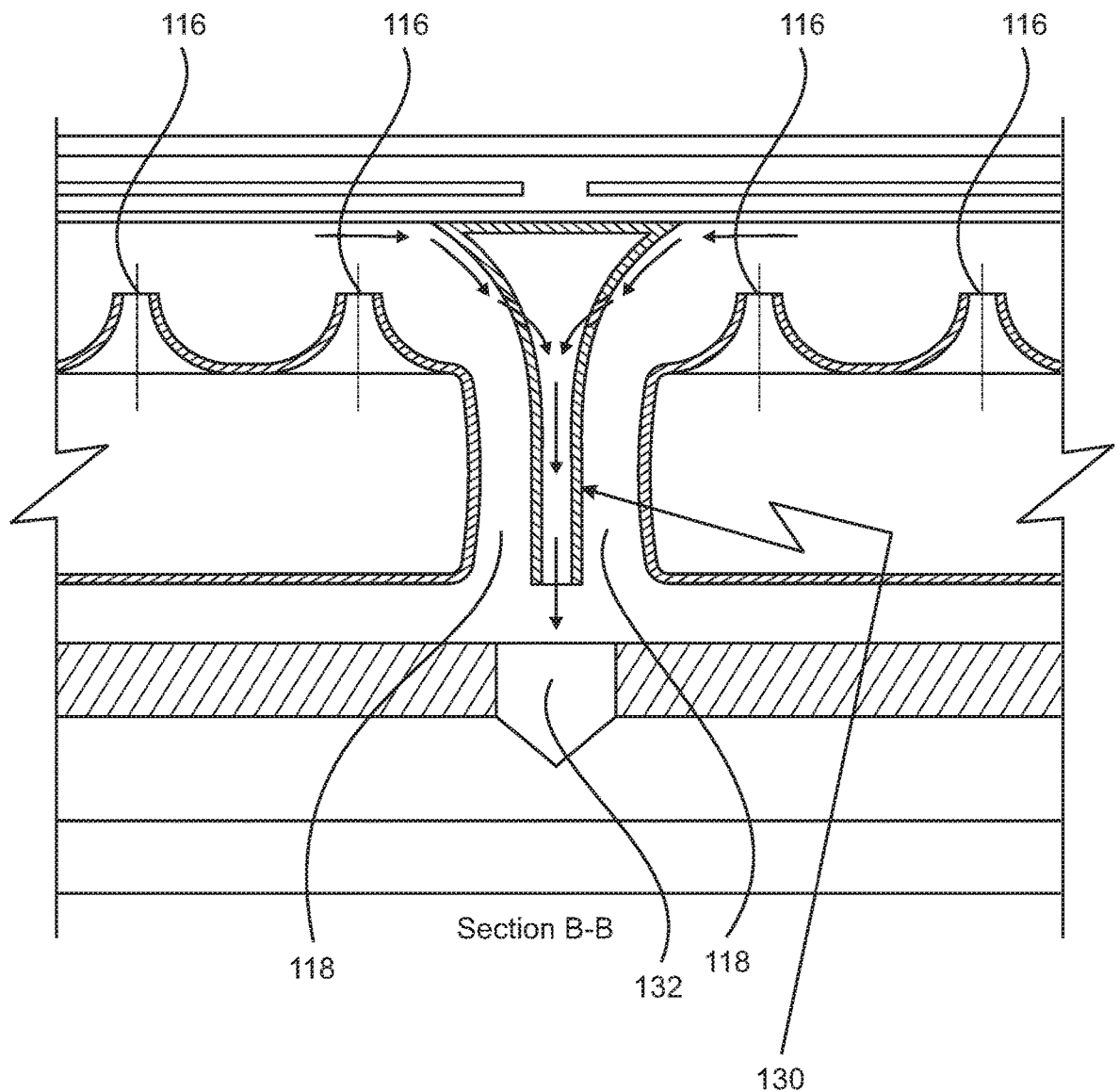
FIG. 16c shows a detailed cross section view schematic of FIG. 16b illustrating the fixture of the condensate channel to the underside of the PV panel and how the flow is directed into the channel and then delivered to the collection drains according to an embodiment of the present invention.
Figure 17A:
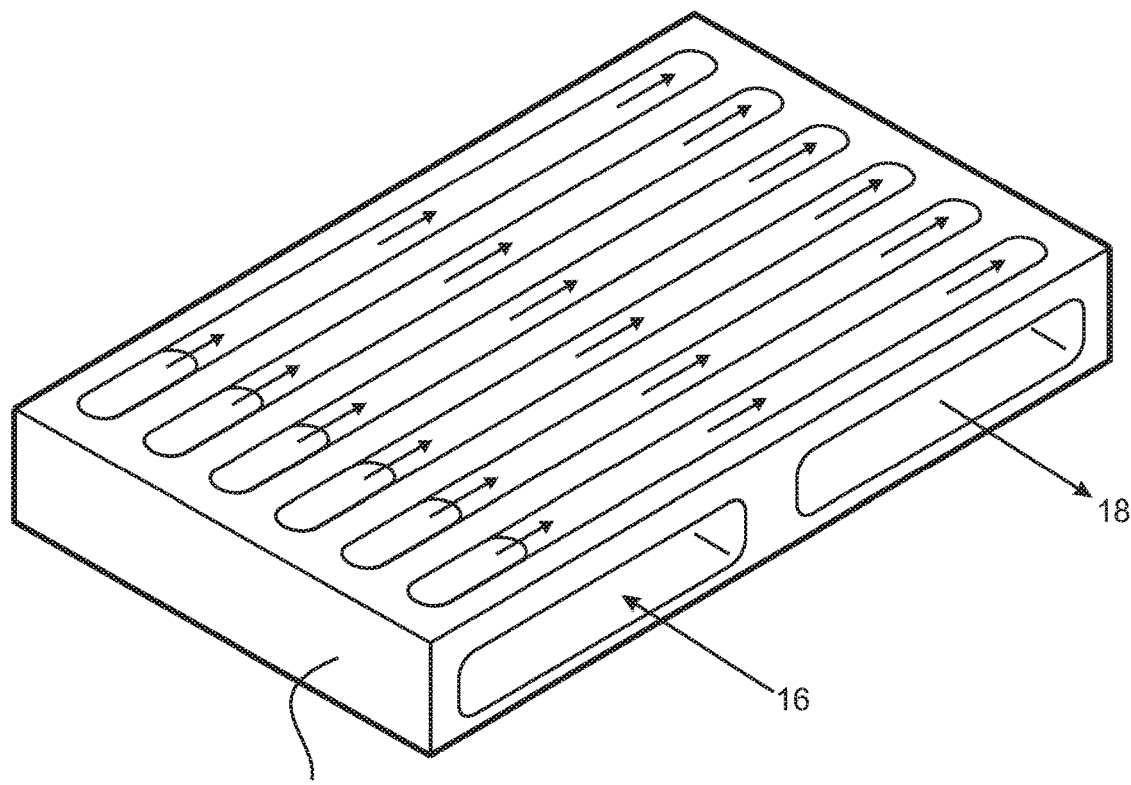
FIG. 17a shows a simplified isometric schematic of a ducting arrangement within the mounting cassette and the resultant cell air plenum configuration and air flow patterns according to an embodiment of the present invention. This figure illustrates the preferred embodiment of single supply and return duct centrelines being orientated parallel with the short axis of the PVT panel and with the cell air plenums (nominally 6) extending the full length of the PVT panel longitudinal axis.
Figure 17B:
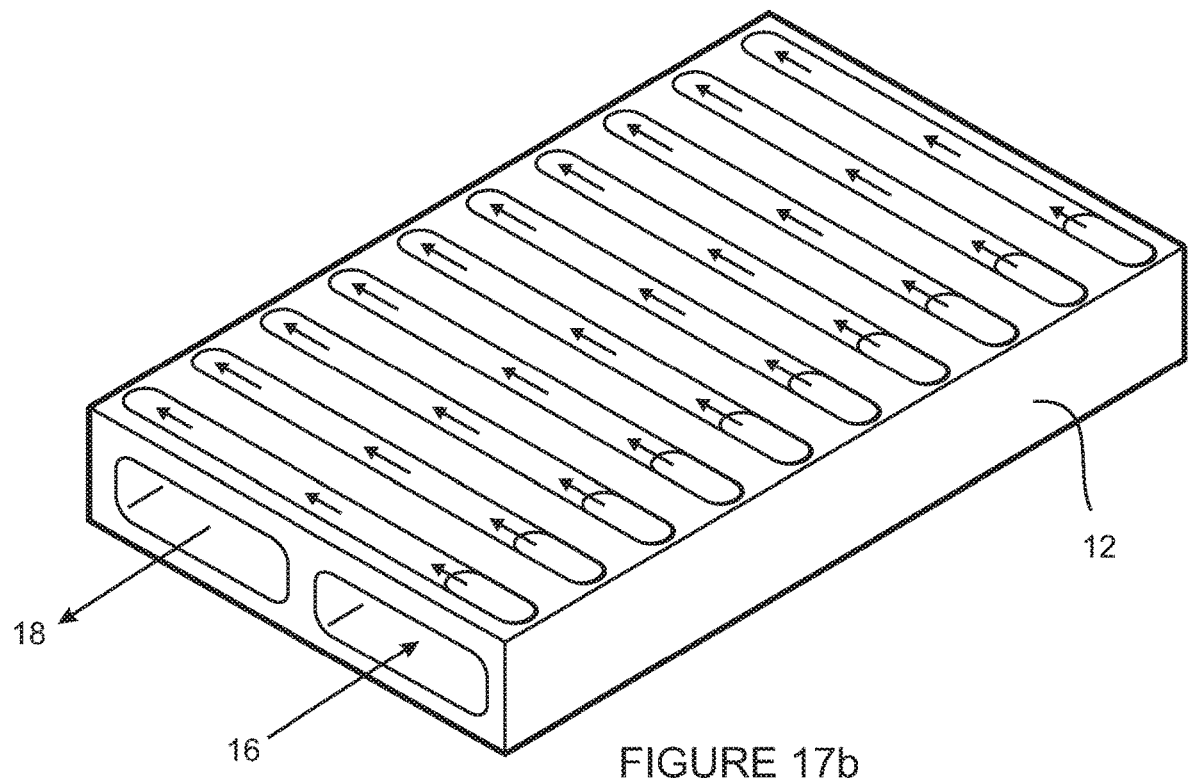
FIG. 17b shows a simplified isometric schematic that illustrates an alternative embodiment of single supply and return duct centrelines being orientated parallel with the long axis of the PVT panel and with the cell air plenums (nominally 10 or 12) extending the full length of the PVT panel short axis according to an embodiment of the present invention.
Figure 17C:
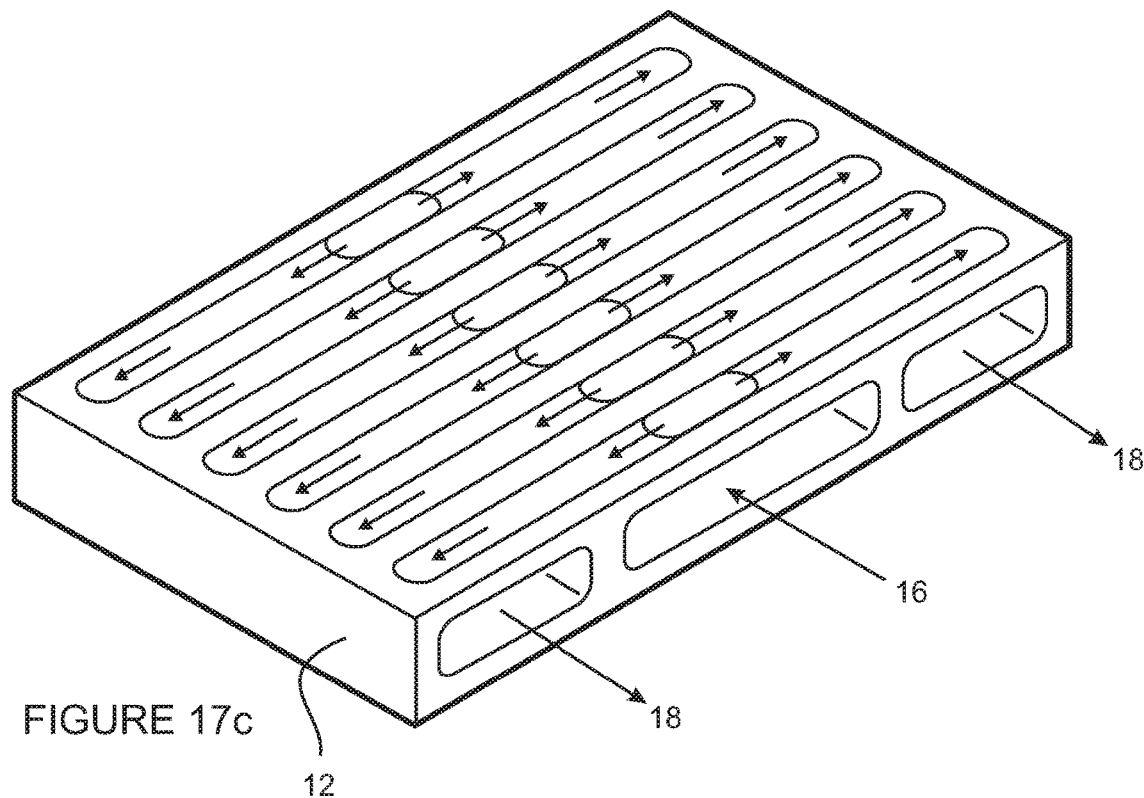
FIG. 17c shows a simplified isometric schematic that illustrates an alternative embodiment of single supply (centre) and dual return ducts (outside) with centrelines being orientated parallel with the short axis of the PVT panel and with the cell air plenums (nominally 6) extending from the centre in equal length to each end of the of the PVT panel long axis according to an embodiment of the present invention.
Figure 17D:
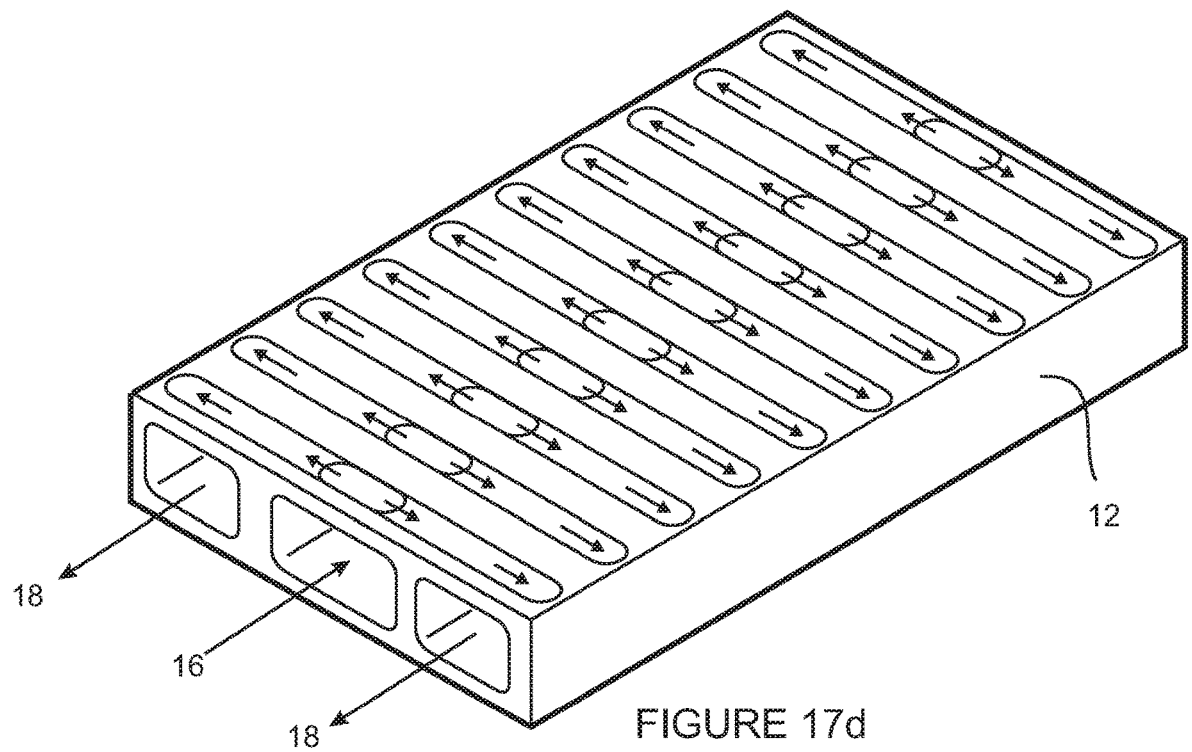
FIG. 17d shows a simplified isometric schematic that illustrates an alternative embodiment of single supply (centre) and dual return ducts (outside) centrelines being orientated parallel with the long axis of the PVT panel and with the cell air plenums (nominally 10 or 12) extending from the centre in equal length to each end of the of the PVT panel short axis according to an embodiment of the present invention.

As shown by way of example in FIGS. 16a-c, one or more condensate flow channels 130 may be provided within the PV panel 10. Such condensate flow channels 130 may have a pattern generated from a slightly inclined panel when operating in the night radiative cooling mode according to an embodiment of the present invention. The condensate flow channels 130 can be along the underside of the PV panel 10 towards the condensate collection drain 132 via the condensate collection channel 130 according to one or more embodiments of the present invention.

FIG. 16c shows a detailed cross section view B-B schematic of FIG. 16a (FIG. 16b being a cross section A-A of FIG. 16a) illustrating the fixture of the condensate channel to the underside of the PV panel and how the flow is directed into the channel and then delivered to the collection drains according to an embodiment of the present invention.

The cell air plenums are generally preferred to be arranged in line with the PV string orientated to the inclined plane with the inlet vent/s located on the lower inclined end. This facilitates the evacuation of the spent air towards the panel outlet vents through the buoyancy effect of the air which incrementally improves the systems performance. Generally there is one cell air plenum for each string in widths to accommodate 5 and 6 inch cell sizes. See FIG. 1c and FIG. 17a to FIG. 17d showing an array of plenum arrangement options.

The cell air plenum can be further insulated with insulation 134 below the cell plenum to increase performance of the system by reducing the heat gain of the spent air as it flows along the back of the air cell plenum towards the vent maintaining the constant air temperature to the cells, such as shown in FIGS. 18a to 18d.

Figure 18A:
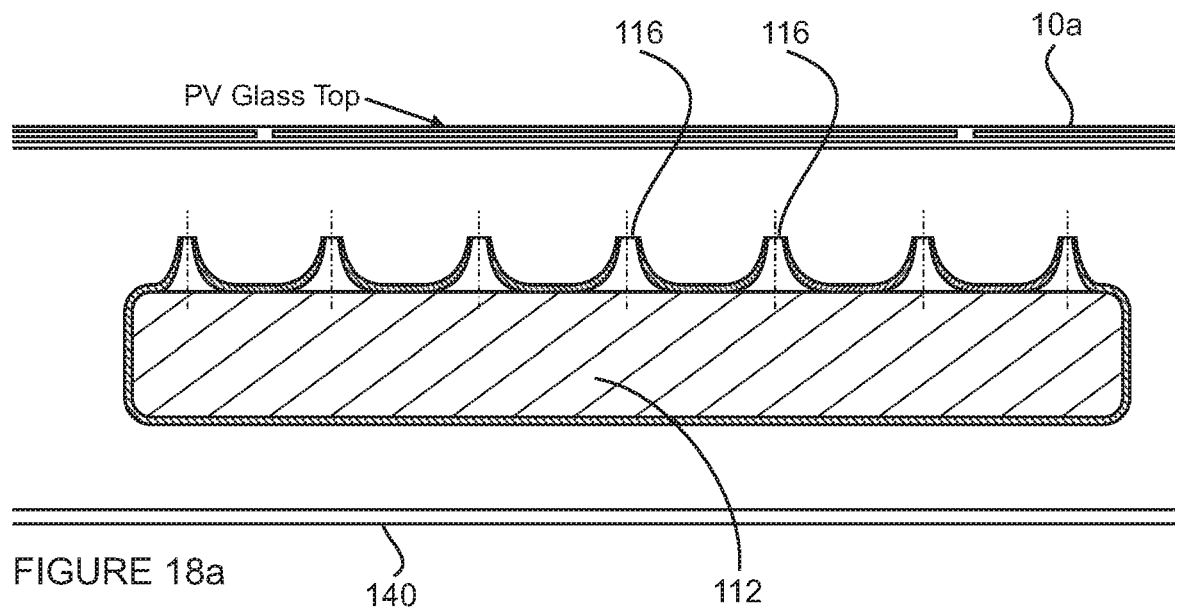
FIG. 18a shows a schematic of a cross sectional view of a single standard air cell plenum arranged within the PVT panel enclosure according to an embodiment of the present invention.
Figure 18B:
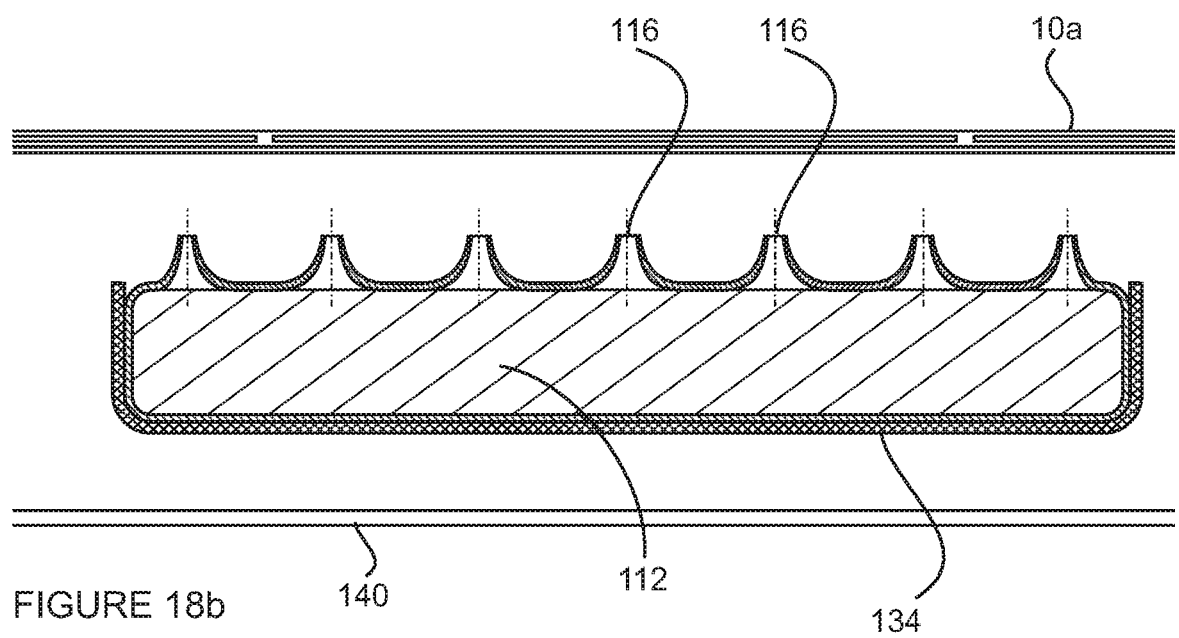
FIG. 18b shows a schematic of a cross sectional view of a single standard air cell plenum (as in FIG. 18a) arranged within the PVT panel enclosure with the addition of insulation to the underside of the plenum to reduce the transfer energy from the spent air to the incoming air according to an embodiment of the present invention.
Figure 18C:
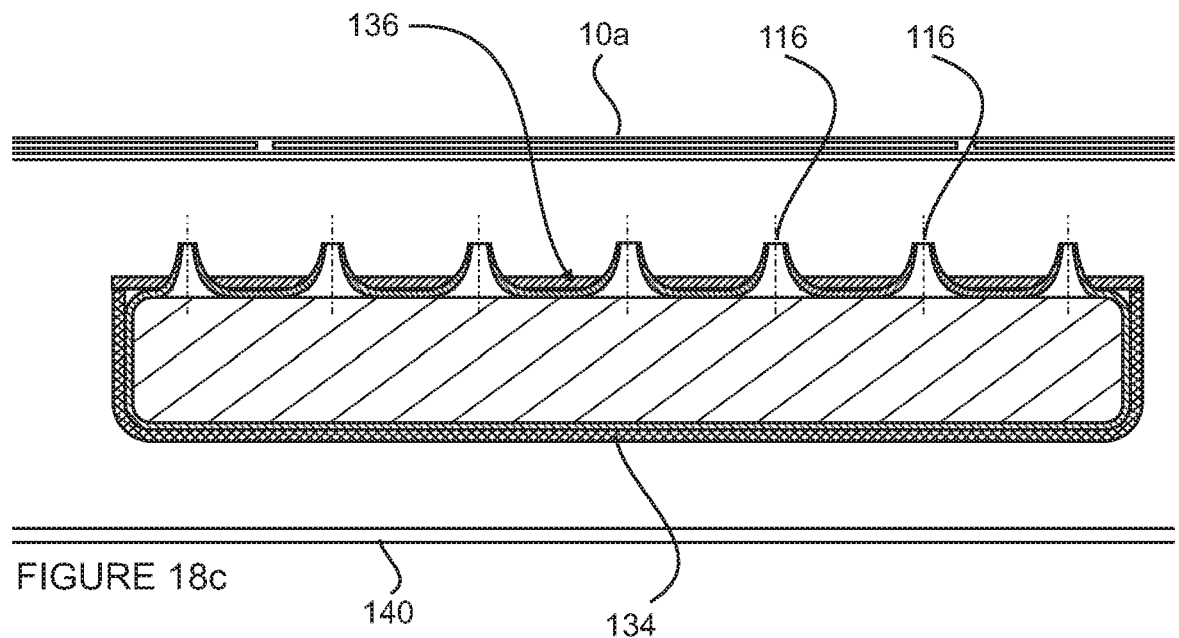
FIG. 18c shows a schematic of a cross sectional view of a single air cell plenum (as in FIG. 18b) arranged within the PVT panel enclosure with the addition of insulation to the upper surface of the plenum also to further reduce the transfer energy from the spent air to the incoming air according to an embodiment of the present invention.
Figure 18D:
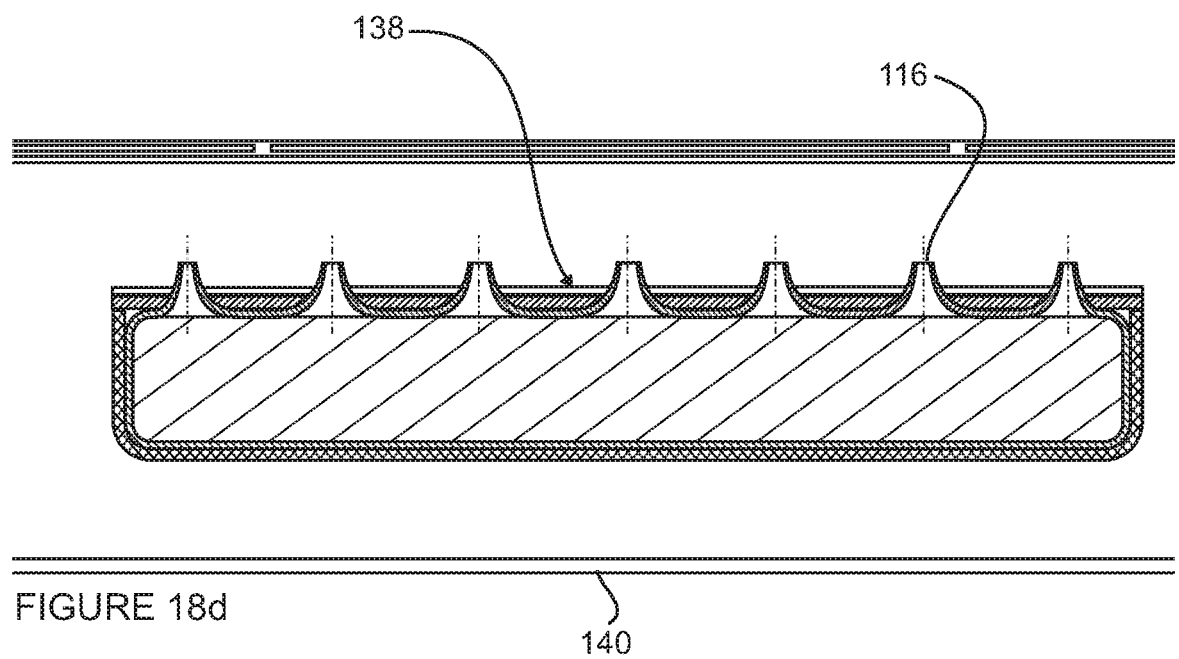
FIG. 18d shows a schematic of a cross sectional view of a single air cell plenum (as in FIG. 18c) arranged within the PVT panel enclosure with the addition of a radiation adsorption sheet to the upper surface insulation of the plenum according to an embodiment of the present invention. This arrangement enhances capture of the back thermal radiation and increases the capacity to be recovered in the spent air flow path and prevent it from ingress into the incoming air.

Additional insulation 136 can be applied to the upper surface to further reduce heat ingress into the plenum, such as shown in FIG. 18c The cell air plenums can further enhance the recovery of radiative energy with the inclusion of an insulated selective infrared radiation absorber material 138 onto the jet 116 face 112a of the plenum. This is employed to capture the radiated energy and prevent it from heating the intake air before it is expelled into the jet. The spent jet air then cools the absorber plate before it is expelled through the drains and into the outlet vent, such as shown in FIG. 18d.

The height (depth) of one or more cell air plenum can taper from the inlet to the outlet port to provide for the increasing volume required for the flow rate in the spent fluid stream as it moves towards the outlet port. This approach ensures that the flow rate of the spent air is stable across the length of the panel.

A bottom panel enclosure sheet 140 can be provided below the PV panel and plenums.

Figure 19A:
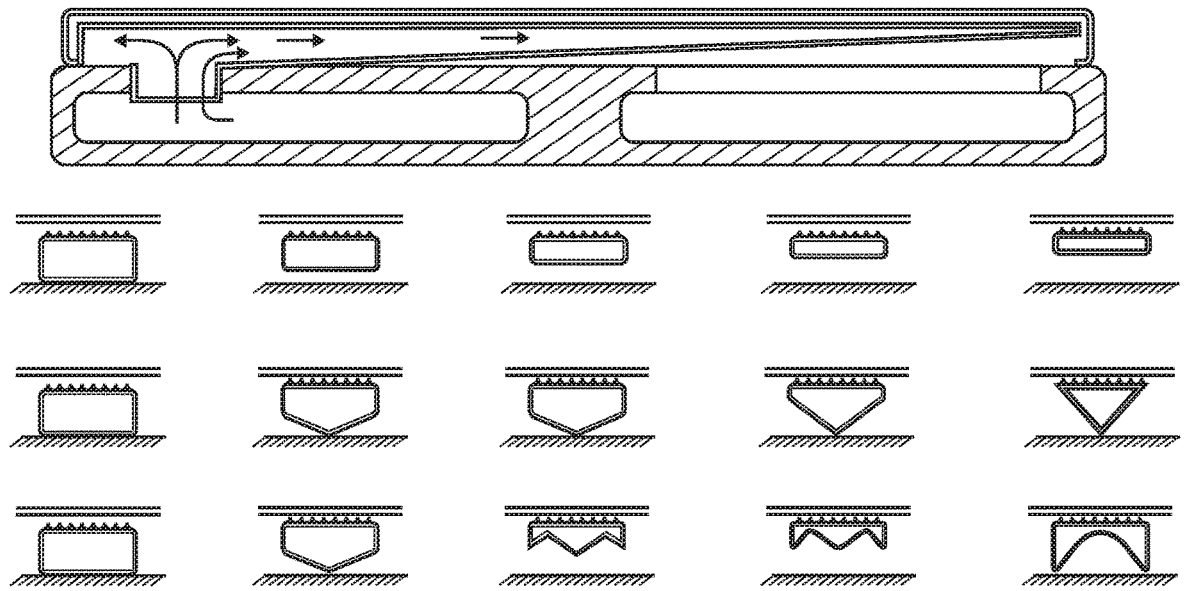
FIG. 19a shows a schematic of a longitudinal cross sectional view of a PVT panel as illustrated in FIG. 17a. Three single air cell plenums are shown with various cross sectional views along the PVT panel's longitudinal length. The first series of cross sections represent the standard rectangular profile, the second series with a triangle underside profile and the third the formation of an inverted vee profile at the plenums end.
Figure 19B:
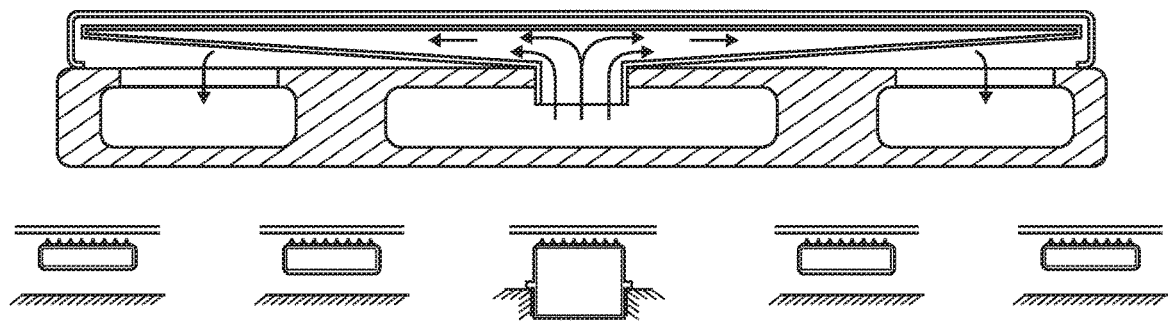
FIG. 19b shows a schematic of a longitudinal cross sectional view of a PVT panel as illustrated in FIG. 17c. A single air cell plenum is shown with various cross sectional views along the PVT panel's longitudinal length.

An alternative embodiment of this approach is to maintain the same cross-sectional area from any comparative section but to include a vee shape in the underside profile instead of a planer one which will provide additional structural rigidity and also enhance the segregation of spent fluid streams and reducing cross flow potential. This is more critical when the spent fluid is constrained only to the depth of the PV panel before it leaves the outlet port, which can be the case in some optional embodiment/arrangements. See for example, FIG. 14*b*-*b* and including FIG. 19*a* and FIG. 19*a*.

Mounting Cassette: The PV panels preferred mounting arrangement utilises the described mounting cassette, but is to be understood to not be limited to such. The general purpose of the standard mounting cassette is to provide a structural framework to secure the PV panel to the roof. It preferably also provides the internal duct work to supply both the panel's intakes and outlet vents and provides a mounting mechanism to physically secure the cell air plenums and seal the joint between the cell air plenum inlet port and the internal ductwork.

Additionally, the mounting cassette can provide the sealing surface to enclose the PV panel back face to prevent air leakage to the outside.

Internal ducting in the mounting cassette can be configured to be interconnected to the adjacent panels, act as a duct terminator and/or act as a roof penetration access point to convey the air between the PVT system and building.

The ducting can further insulated 142 to increase thermal performance. See for example, FIG. 20*a* and FIG. 20*b* series of cross sectional views.

The mounting cassette can be manufactured in large industrialized quantities at a low cost using either a blow moulding or injection moulding process. This enables complex shapes and surfaces to be realised in the one process. Inclusions to the mould will facilitate a wide number of installation opportunities from roof fixtures, to cantilevered vertical structures through to free standing structures. Mould inclusions can readily accommodate a wide range of air duct combinations. The same form and function of the mounting cassette could also be achieved using more traditional forms of manufacture using materials such as sheet metal, plastics and weather resistant timbers and ply.

Additional mounting cassette features that can be included in the mounting cassette frame are; roof mounting features for existing roofs to secure PVT systems directly to membranes 144 (FIG. 21*a*), corrugated 146 (FIG. 21*b*) and trim-deck 148 (FIG. 21*c*) like profiles and indirectly to slate and tile options.

Additional cavities can be included to facilitate the installation of the cassette over pre-existing solar mounting frames. For example, on a metal roof the battens are usually installed at 900 mm spacing—see FIGS. 22*a* through to FIGS. 22*c*.

Figure 22A:
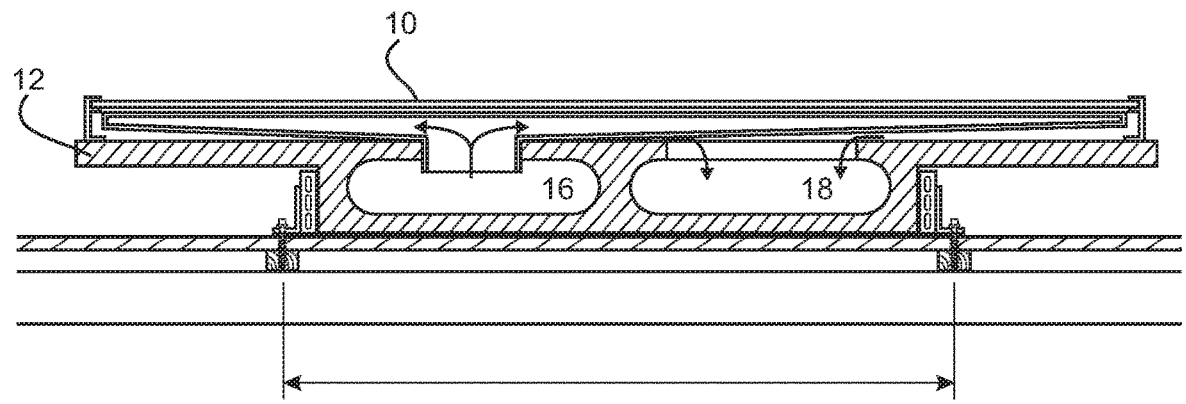
FIG. 22a shows a schematic of a cross sectional view of an alternative mounting cassette design to accommodate an alternative roof mounting arrangement of a PVT panel according to an embodiment of the present invention. It illustrates the utilisation PV mounting hardware in securing of the PVT mounting cassette to a roof structure with a general batten spacing of 900 mm. It incorporates the modifications that would be required to be made to the mounting cassette, inlet and outlet dusts and the cell air plenums to accommodate a central offset design.
Figure 22B:
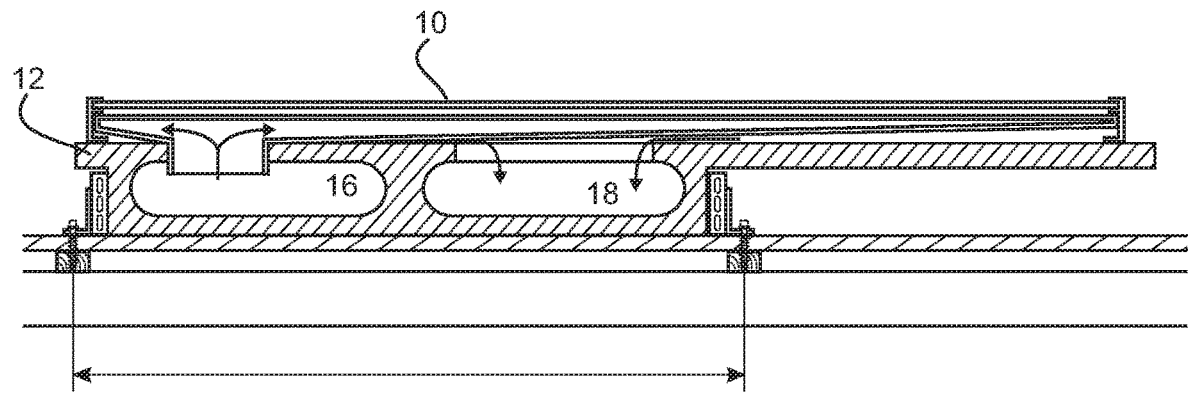
FIG. 22b shows an alternative schematic of a cross sectional view of the embodiment shown in FIG. 22a which illustrates the modifications required to accommodate an intake duct offset arrangement.
Figure 22C:
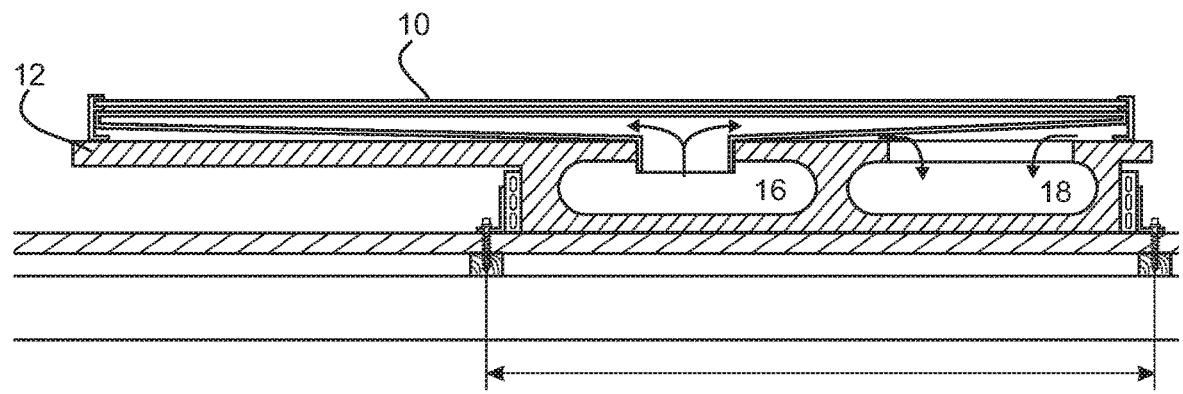
FIG. 22c shows an alternative schematic of a cross sectional view of the embodiment shown in FIG. 22a which illustrates the modifications required to accommodate a return duct offset arrangement.

The cassette can have a body 12 centrally mounted, as shown in FIG. 22*a* or may have an (left) offset towards the intake 16 or an (right) offset towards the return 18, as shown by way of example in FIGS. 22*b* and 22*c* respectively.

The mounting cassette can also be configured so that it can be cantilevered and supported from a single end.

Figure 23A:
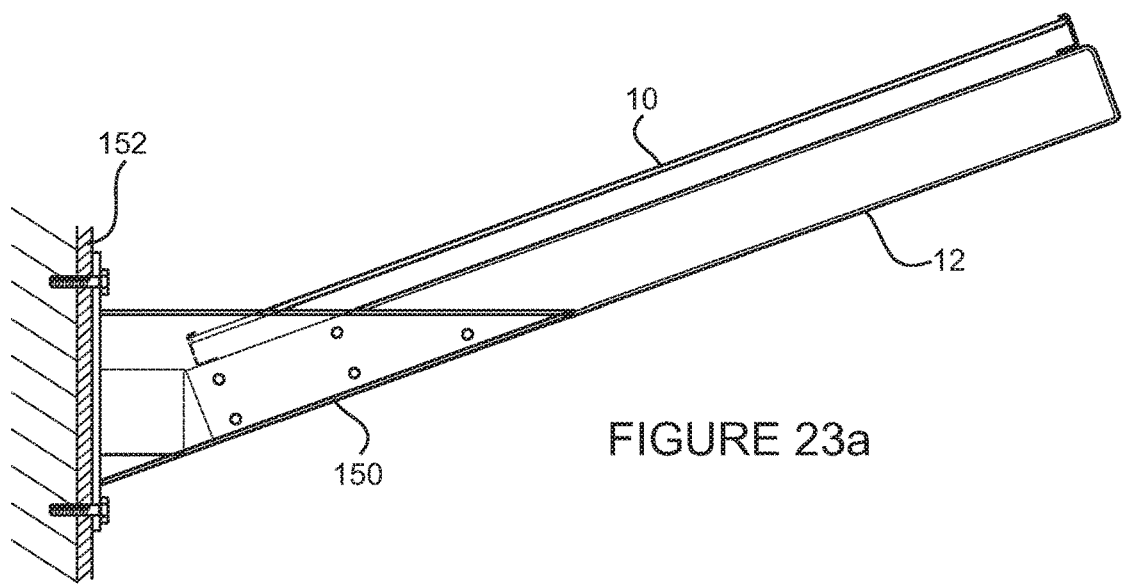
FIG. 23a shows a schematic of a side view illustrating the cantilever mounting of a PVT panel to a vertical wall/structure according to an embodiment of the present invention. In this arrangement the PVT panel is arranged on an incline extending away from the wall/structure.
Figure 23B:
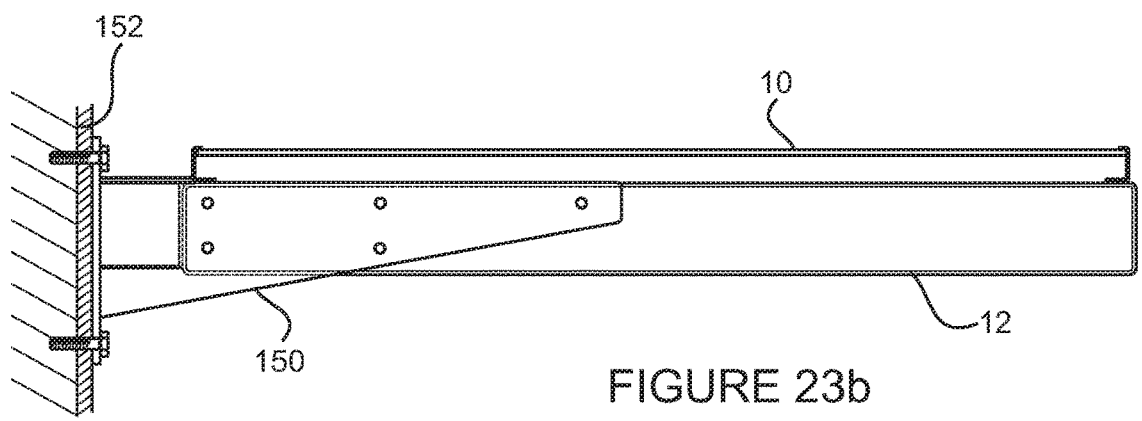
FIG. 23b shows a schematic of a side view illustrating the cantilever mounting of a PVT panel to a vertical wall/structure according to an embodiment of the present invention. In this arrangement the PVT panel is arranged perpendicular extending away from the wall/structure.
Figure 23C:
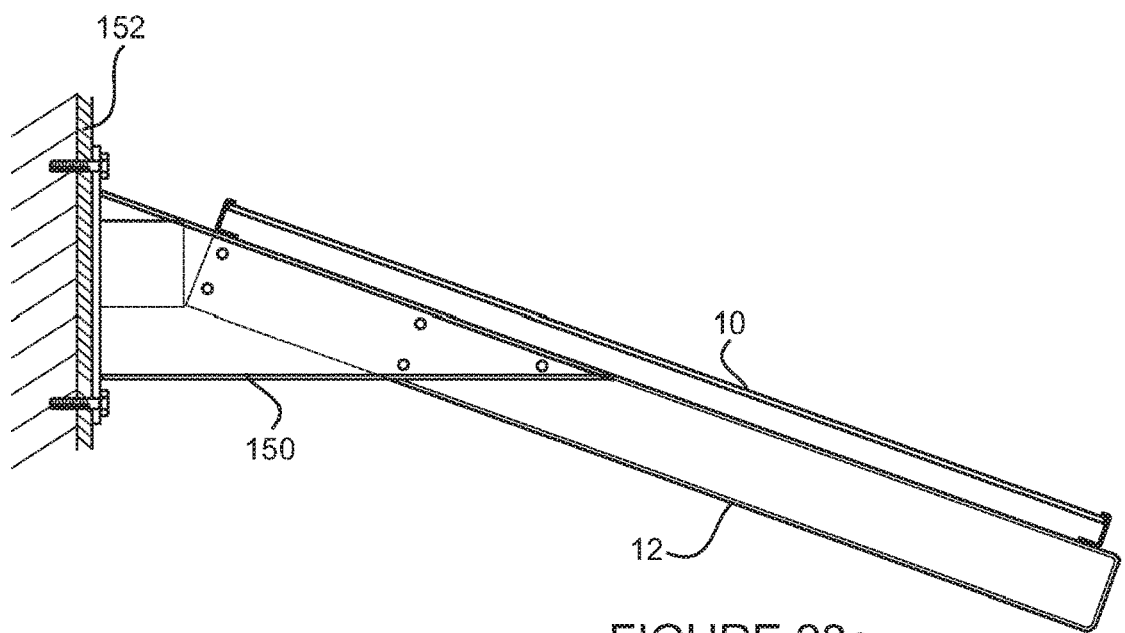
FIG. 23c shows a schematic of a side view illustrating the cantilever mounting of a PVT panel to a vertical wall/structure according to an embodiment of the present invention. In this arrangement the PVT panel is arranged on a decline extending away from the wall/structure.

The cantilevering arrangement can be pitched at a fixed angle such that the PVT panel is inclined up, flat or down from the mounting point, as referenced in FIGS. 23*a* through to FIGS. 23*c*.

Figure 24:
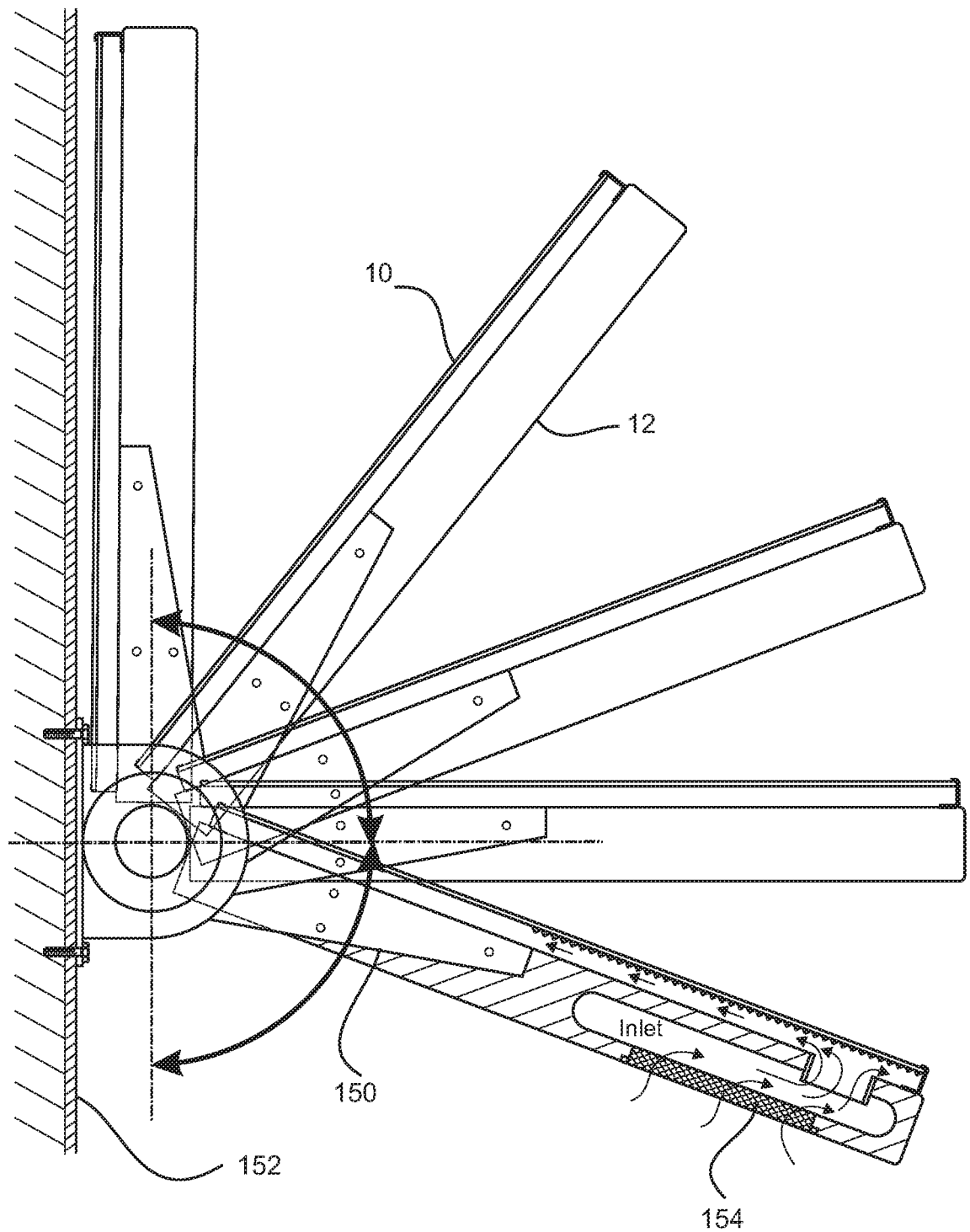
FIG. 24 shows a schematic of a side view illustrating the cantilever mounting of a PVT panel to a vertical wall/structure according to an embodiment of the present invention. In this arrangement the PVT panel is mounted on a rotational hinge such that it can be arranged at any angle between 0 degrees and 180 degrees. This Figure provides additional detail relating to an alternative embodiment whereby the air is drawn directly from ambient into the inlet and diffuser.

A further arrangement of this concept is to enable the PVT panel inclination angle to be set within a full range of 180 degrees with the extents starting from a full vertical up position to a fully vertical down position, as shown in FIG. 24.

In the above arrangements, a mounting frame 150 can be attached to a support 152, such as a wall.

At least one functional duct connection to the mounting arrangement can be provided which can be either intake or exhaust. In the case of an open air flow circuit arrangement (whereby the outlet port is connected to the support structure and the air is drawn through the PVT under negative pressure induced by the inline outlet fan) an air filter 154 can be fitted to the intake. Reference is made to FIG. 24. This arrangement can then be mounted directly to a wall or equivalent vertical structure.

FIG. 25 shows an exterior view of a building 156 including an awning 158 alongside one side thereof including multiple PVT panels/systems embodying the present invention.

The mounting cassette can be configured in various ways to facilitate mounting and connection of two adjacent panels or customised mounting structures utilising connectors 160, 162, or a mounting bracket 164 such as illustrated in FIG. 26*a* through to FIG. 26*c*.

A further variation of this aforementioned arrangement is to have cantilevered PVT panels secured to a common spine with a PVT panel/s mounted such that they are mirrored around the spine. The spine provides both structural and ducting support for air services, as indicated in FIGS. 27 a through to FIG. 27*d*.

The mounting cassette can be configured to be integrated directly into the roof structure 166, such as shown in FIG. 27*a*, which can include incorporated water proofing features and drainage.

The mounting cassette can also be configured to be a completely freestanding flat, see for example FIG. 27*a*, or pitched roof as in FIG. 27*b*. This may be more desirable on commercial buildings where space is usually required for or already occupied with other services.

Figure 28A:
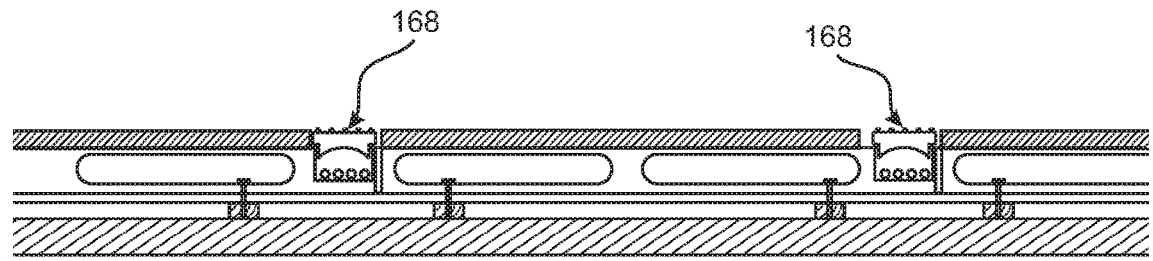
FIG. 28a shows a schematic of a side view illustrating an embodiment of the present invention including an extension to the mounting cassette to facilitate the inclusion of a multi-purpose inverted channel, such as for guttering, cable tray and service walkway.

Additional service features that can be incorporated in the mounting cassette include a small access walkway 168 and/or cable tray 170 to facilitate high density arrays by providing individual panel access for installation, maintenance and future servicing, as shown in FIG. 28*a*.

Figure 28B:
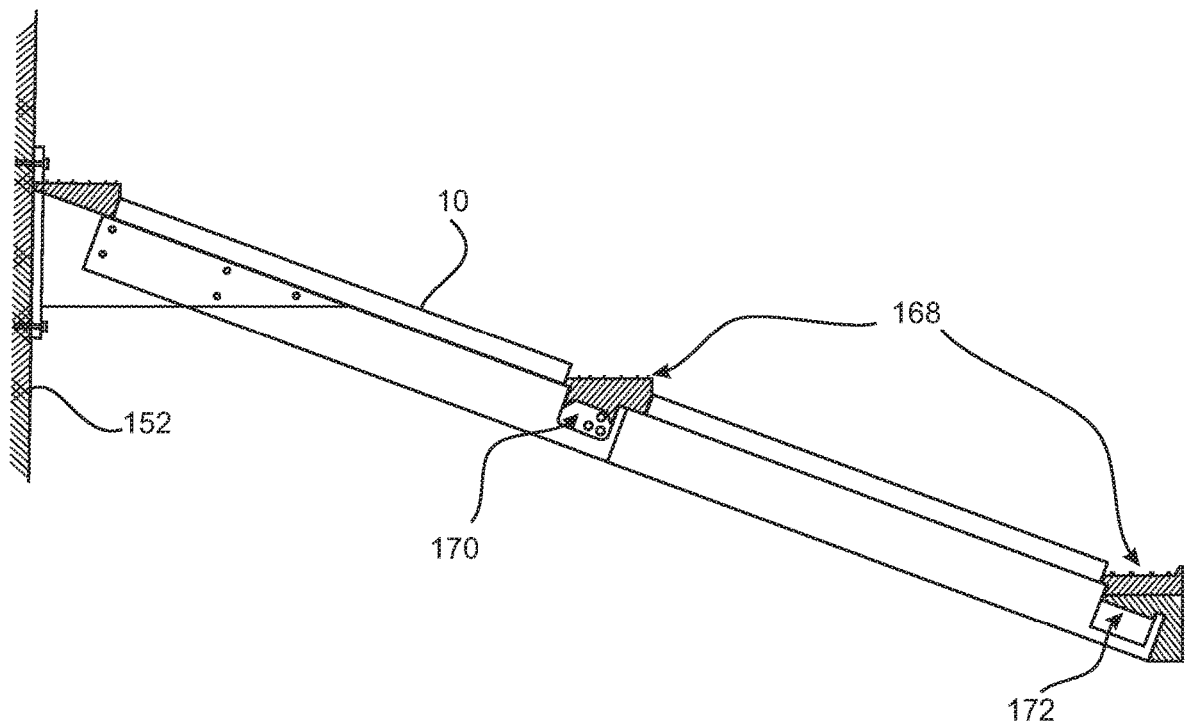
FIG. 28b shows a schematic of a side view further illustration of an embodiment of the present invention including an extension to the mounting cassette as referred to in FIG. 28a to facilitate a modified service walkway design to accommodate an installation angle that is other than flat.

Cabling duct can also be included for instrumentation or power requirements. Guttering 172 can be incorporated for water collection purposes. See for example FIG. 28*b*)

Figure 29A:
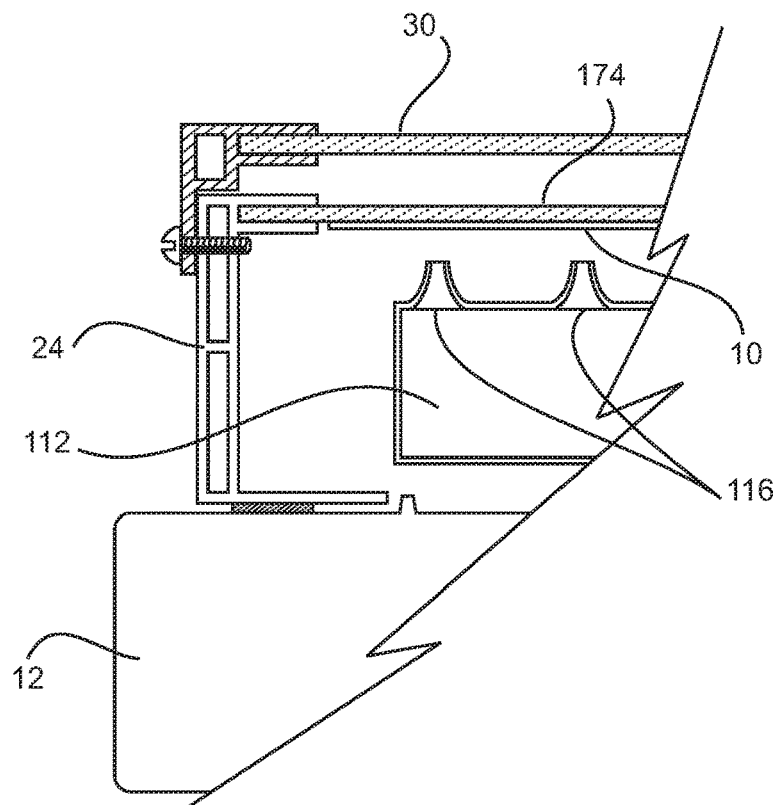
FIG. 29a shows a schematic of a partial cross sectional view illustrating an embodiment of the present invention including an additional double glazing element fitted to an existing conventional PV panel utilised in a PVT system. The double glazing enhances thermal capture performance of the PVT panel.
Figure 29B:
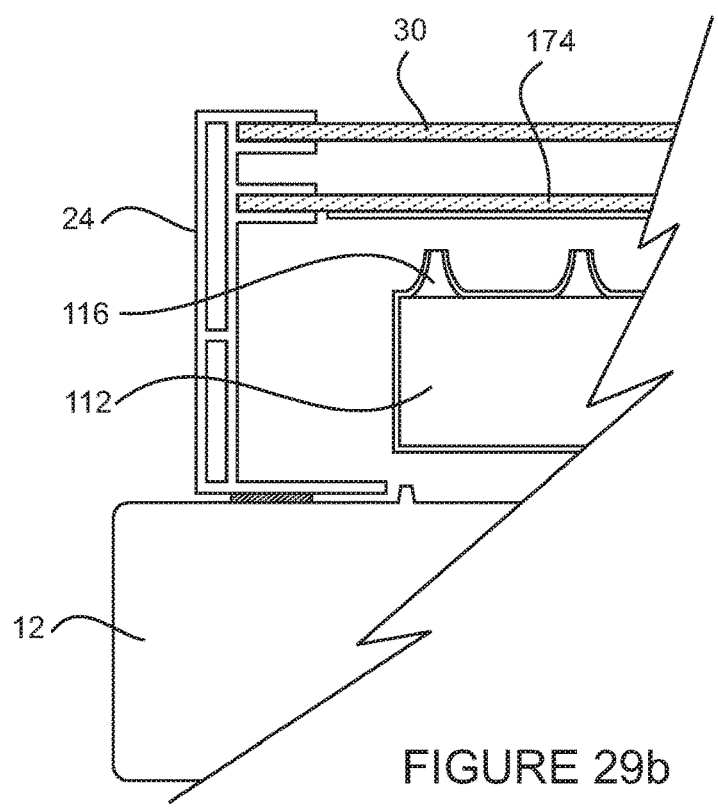
FIG. 29b shows a schematic of a partial cross sectional view illustrating an alternative embodiment of the present invention incorporating an additional double glazing element which is integrated into the frame of a new PV panel design utilised in a PVT system.

As shown by way of example in FIGS. 29*a* and 29*b*, Thermal Enhancement through Glazing: An option to reduce the panels conductive and convective loses through the upper glazed surface 174 (and further enhance the thermal energy capture of the PVT system) of one or more embodiments of the present invention is to apply a double glazing solution.

An additional glazing element 176 can be applied to the top face of an existing PV panel. This is an option that can be retrofitted upon installation of the PVT system where thermal demand is not being met by the standard single glazed PV panel. See for example FIG. 1*c*. This can be beneficial in colder climates with limited solar exposure.

The height of the double glazing standoff is significant factor. Limiting its height above the existing glass and the extents of it supporting frame ensures that shading caused by these elements is kept to an absolute minimum so as not to impact the electricity production. See for example FIG. 29*a*.

An alternative option to the added double glazing is to provide a completely new PV panel that incorporates this element at manufacture whilst still using the common glazed PV cell arrangement. See for example FIG. 29b.

A further alternative embodiment to the above double glazing option is to manufacture a new PV panel.

A panel that still retains the glazed element 178 to resist the elements, but instead of adopting the common glazed PV cell fixing arrangement an alternative method is proposed. This adopts the individual glazing of a single linear string using the traditional methods of cell fixing and encapsulation.

The glazed element of the PV string can afford to be much thinner as it is no longer exposed to the elements.

Figure 29C:
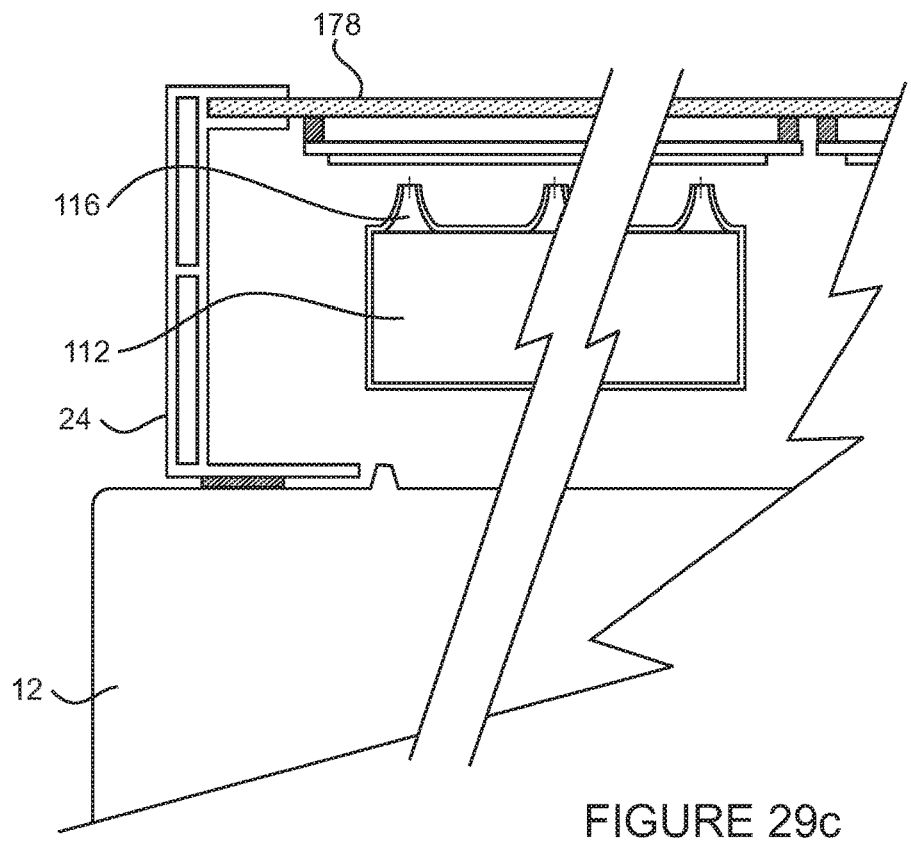
FIG. 29c shows a schematic of a partial cross sectional view illustrating the alternative embodiment of the present invention including an additional double glazing element. A standard glazed sheet is fitted to an existing PV panel frame. An additional glazed element fitted with single PV cell strings is then mounted/attached/bonded to the glazed sheet in the PV frame with spacers providing an air gap between the two glazed surfaces.

The glazed PV string can be fixed directly to the glass using a durable adhesive and with the introduction of standoff elements to provide an appropriate air gap between the glazed PV string and the upper glass surface. See for example FIG. 29c.

An alternative fixing arrangement is to fix the glazed PV string to the cell air plenum.

Figure 29D:
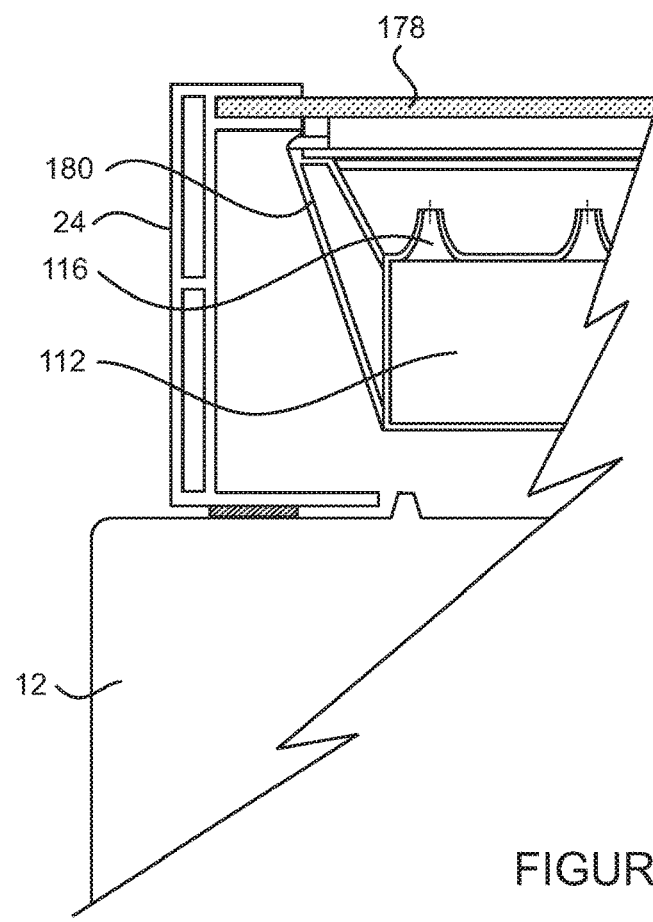
FIG. 29d shows a schematic of a partial cross sectional view illustrating alternative embodiment of the present invention incorporating an additional double glazing element. A standard glazed sheet is fitted to an existing PV panel frame. An additional glazed element fitted with single PV cell strings as in the embodiment shown in FIG. 29c. Instead of being fixed to the outside glazing the glazed PV string is supported and fixed to cell air plenums.

The cell air plenum can be modified to include additional fixing supports for the glazed PV string as well as integrated stand offs 180 to achieve a consistent air gap between the glazed surfaces. See for example FIG. 29d.

Figure 29E:
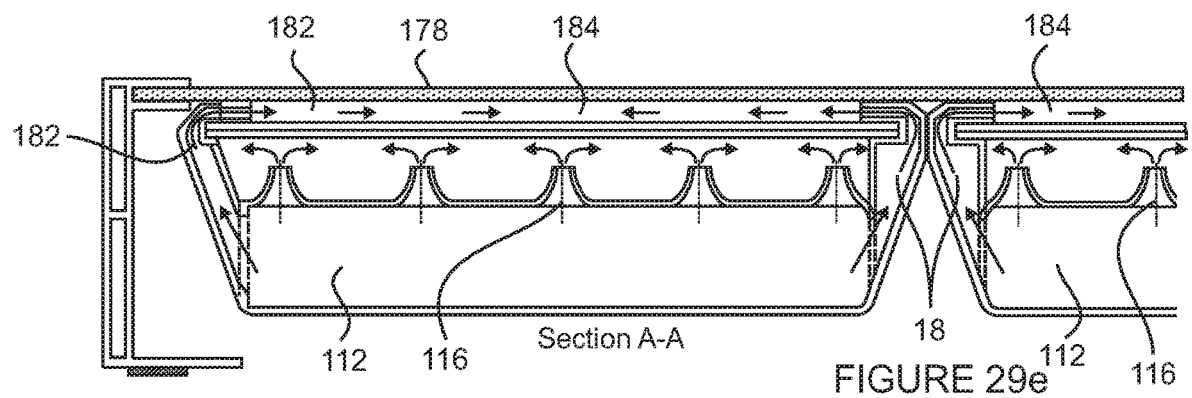
FIG. 29e shows a schematic of a cross sectional view A-A from FIG. 29f, illustrating an additional enhancement of the embodiment shown in FIG. 29d. Additional air is jetted across the gap between the upper surface of the PV glazed string and the outer glazing. The air is delivered by internal ducting incorporated into the supporting posts.
Figure 29F:
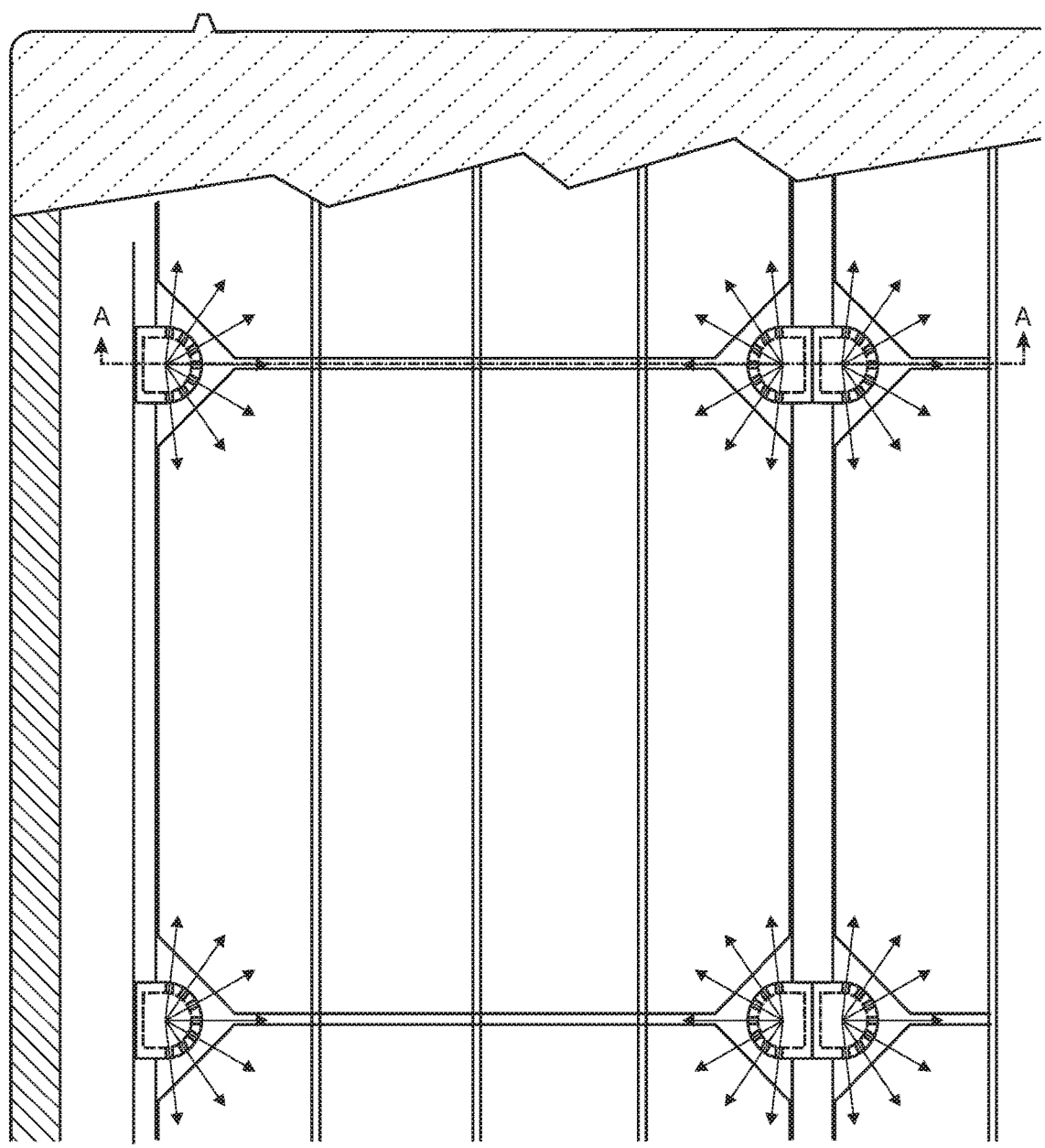
FIG. 29f shows a cut-away schematic of the plan view of the embodiment shown in FIG. 29d illustrating the air flow jetting out from the supporting posts.

An additional optional feature that can be incorporated is the inclusion of supplementary jet cooling 182 directed between the glazed air gap 184, as shown in FIG. 29e and FIG. 29f.

Figure 9:
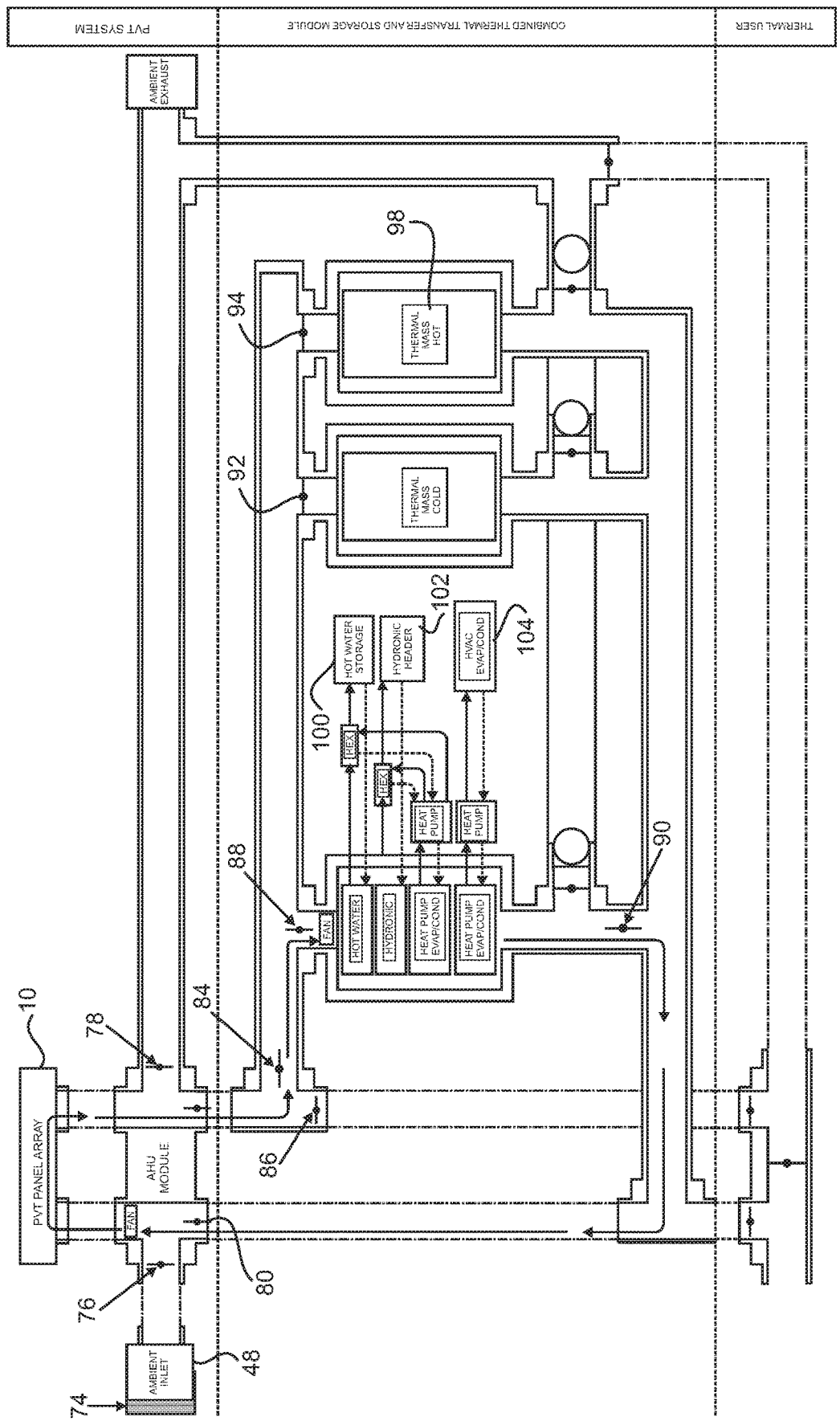
FIG. 9 shows a simplified schematic to illustrate the key components of the Combined Thermal Transfer and Storage Module (CTTSM) arrangement and the physical relationship of these to each other, according to an embodiment of the present invention.

Heating: One or more forms of the present invention facilitates multiple possible uses for the produced thermal energy. Such energy can be used to heat or preheat space within an occupied built environment (home/commercial), hot water services, hydronic heating systems, heat pump evaporators and thermal masses but not limited to these uses. Additional commercial uses can include drying agricultural, wood or industrial product, heating animal houses, heating greenhouses and heating district hot water systems to name a few. FIG. 9, for example, illustrates this application in a single dwelling.

The heating capacity is wholly dependent on three key factors, two of these are fixed and are outside the ability of the controller to change. These are the surface area of PVT installed and the solar insolation available.

The third factor is the volume of air applied to the system. The air's thermal capacity W/kgK is considered to be constant for the typical operating temperature range. As a result the outlet temperature for a given set of conditions is entirely dependant on flow rate.

Figure 10A:
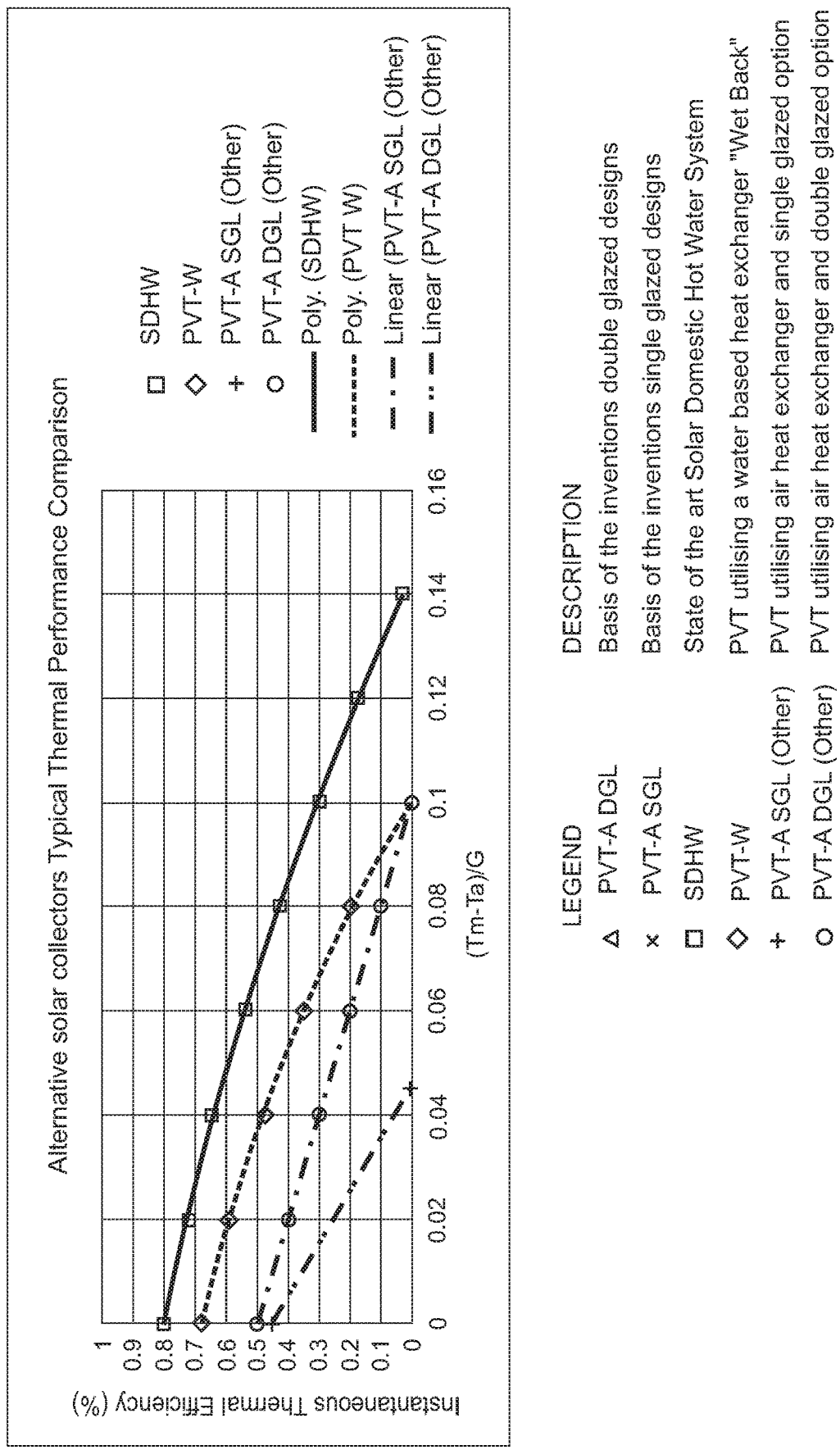
FIG. 10a shows the thermal performance of a selection of available solar collectors over a range of input conditions associated with mean fluid temperatures, ambient temperatures and solar isolation relating to one or more embodiments of the present invention.

FIG. 10a illustrates the thermal mechanisms associated with a fixed set of conditions for a theoretical heat exchanger with 100% efficiency and compares this to a high efficiency heater exchanger as presented in this invention and a lower performing heat exchanger.

FIG. 10a shows a comparison chart of instantaneous thermal efficiency (%) versus (Tm−Ta)/G where where: Tm=mean collector temperature, (Toutlet+Tinlet)/2[° C.], Ta=ambient air temperature [° C.] and G=Solar irradiance [W/sq m] representing typical thermal performance of various PVT systems.

Figure 10B:
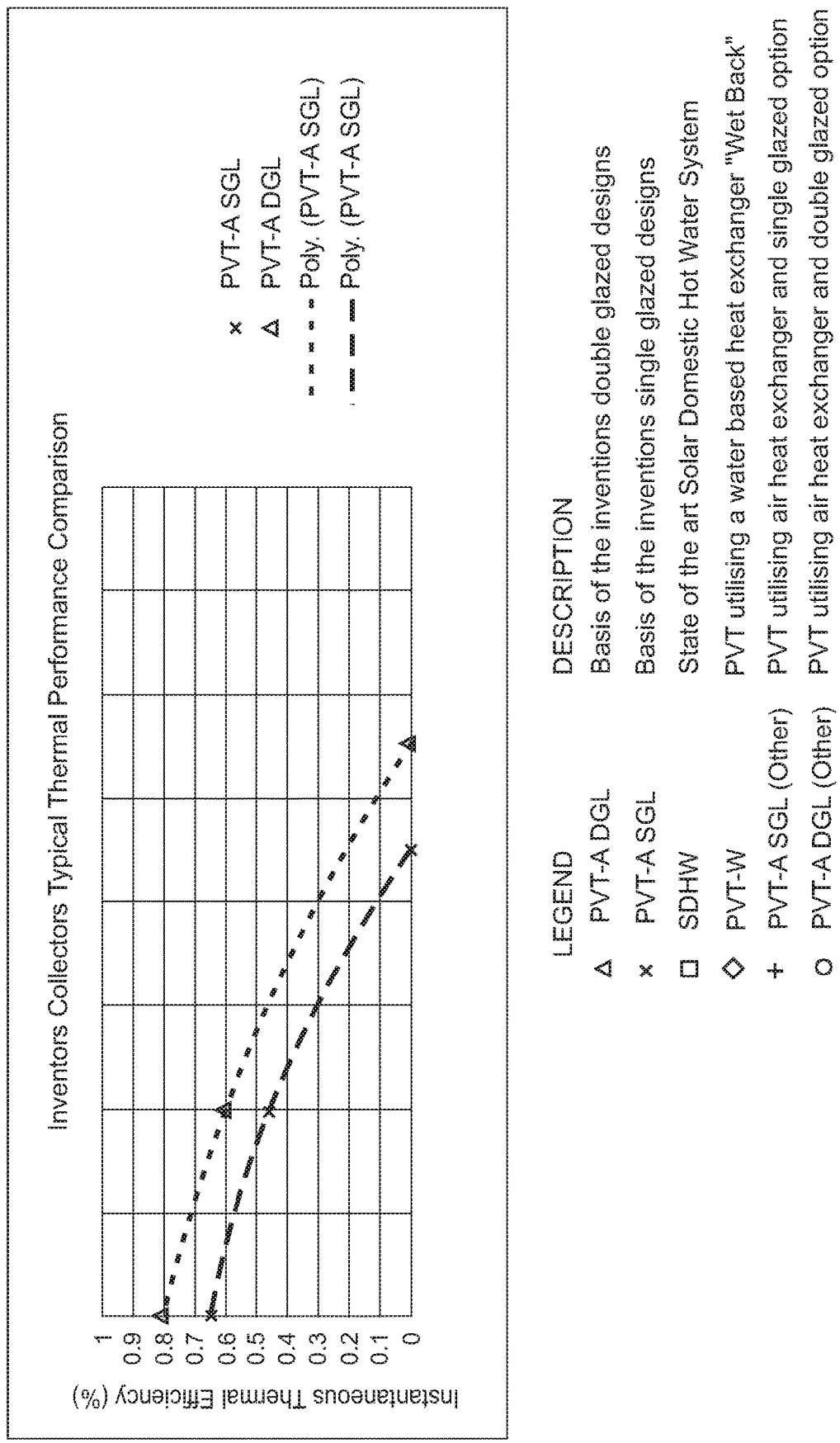
FIG. 10b shows the thermal performance of a single and double glazed PVT system according to an embodiment of the present invention.

FIG. 10b shows a chart of typical thermal performance of a PVT system embodying the present invention by way of comparison with the chart showing known PVT systems.

Figure 10C:
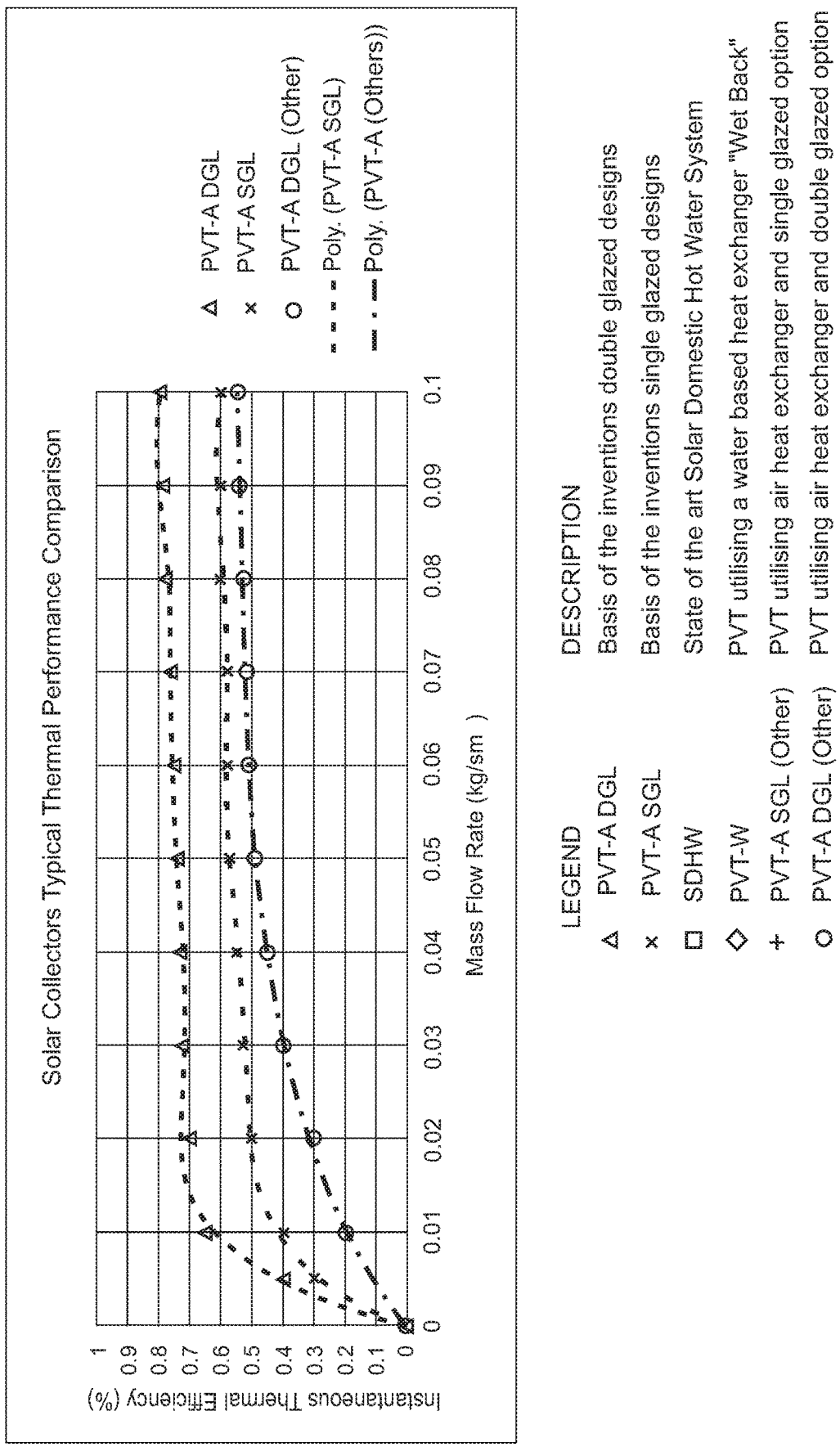
FIG. 10c shows the thermal performance of a single and double glazed PVT system according to an embodiment of the present invention and compares this performance to alternative arrangements. The thermal performance is illustrated over a range of mass flow rate conditions.

FIG. 10c shows a comparison chart of typical solar collect performance of at least one embodiment of the present invention compared to a range of known solar collectors.

PVT Cooling: one or more forms of the present invention incorporates options to introduce ambient air to the PVT system at a temperature lower than the PV cell/panel surface temperature condition by employing a range of cooling techniques either individually or in combination.

Figure 7A:
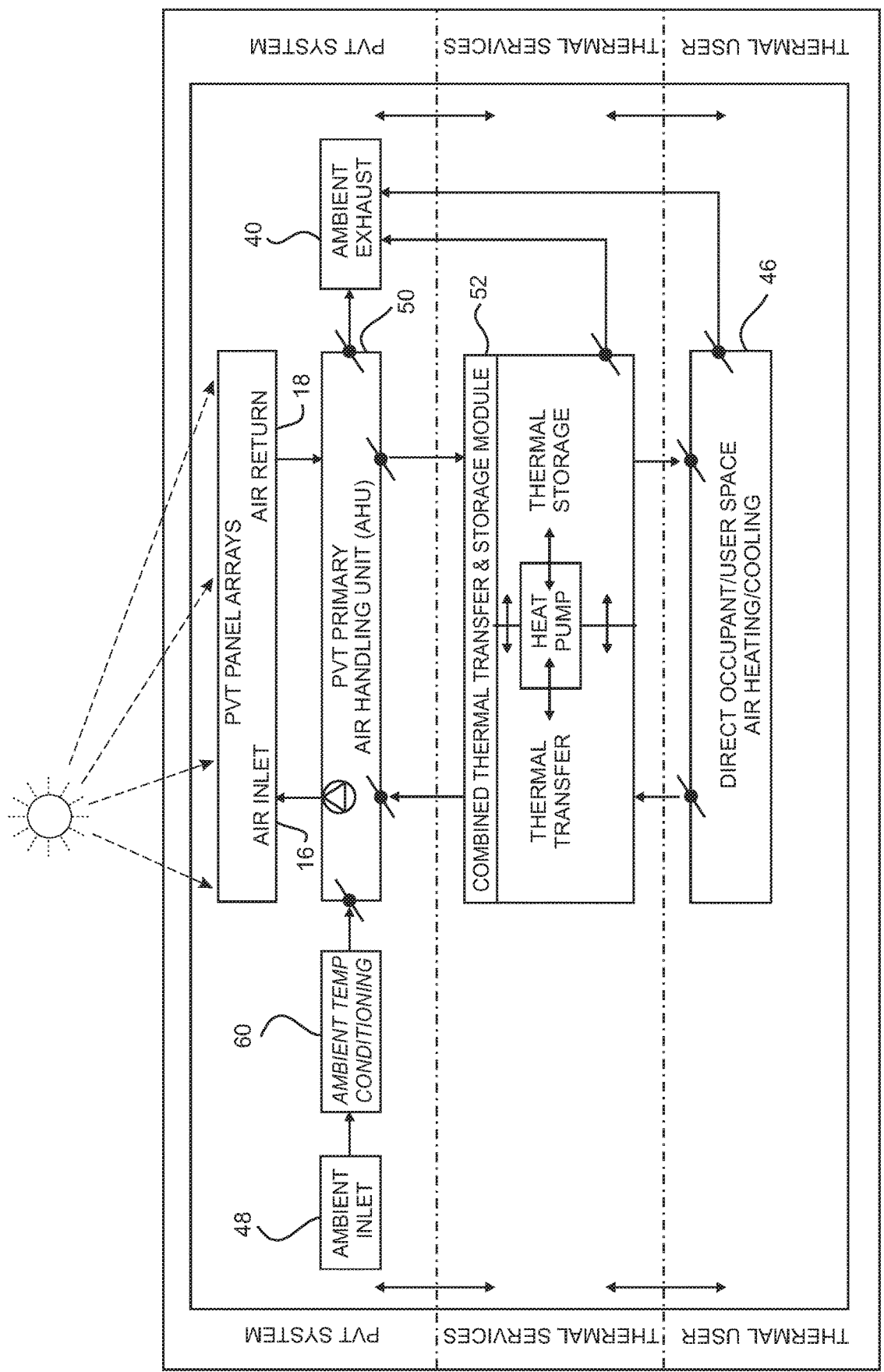
FIG. 7a shows a process flow block diagram illustration of FIG. 4 with the inclusion of an ambient temperature conditioning function in a day time PVT cooling 'open loop' mode according to a further embodiment of the present invention.

Temperature conditioning of ambient air drawn in via the ambient inlet 48 can be provided by an ambient (air) temperature conditioning system/device 60, as shown by way of example in FIG. 7a.

Figure 7B:
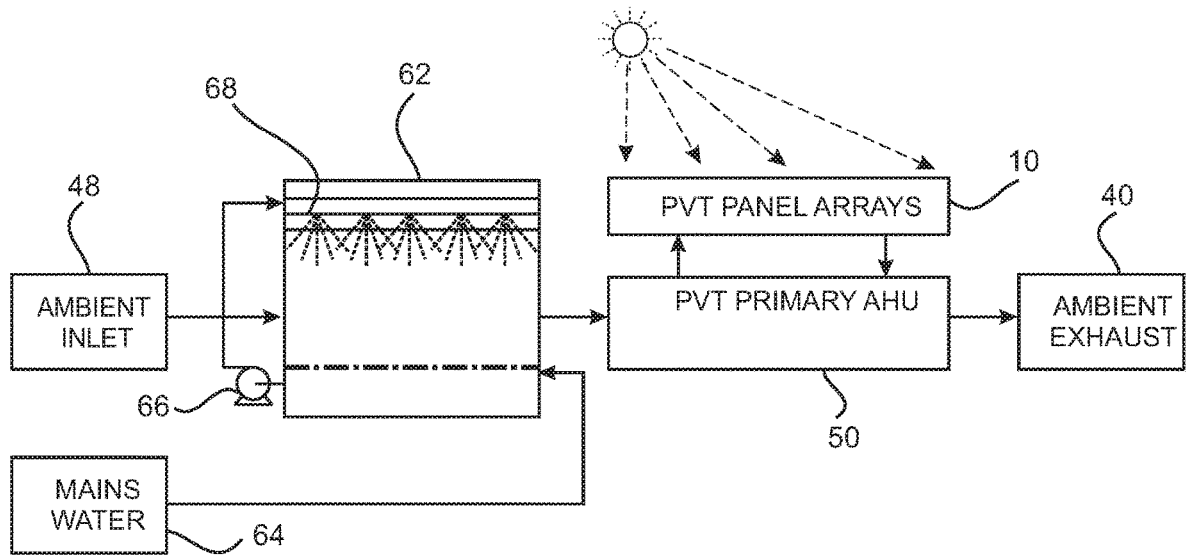
FIGS. 7b to 7e illustrate alternative methods to perform this function according to alternative embodiments of the present invention.

As shown by way of example in FIG. 7b, ambient air can be precooled by an evaporative cooler 62 fed with water, such as from a mains water supply 64. The water can be pumped via a pump 66 to sprays 68 to wet pads through which the ambient air is drawn to supply pre-cooled air to the PVT primary air handling unit (AHU) 50.

Figure 7C:
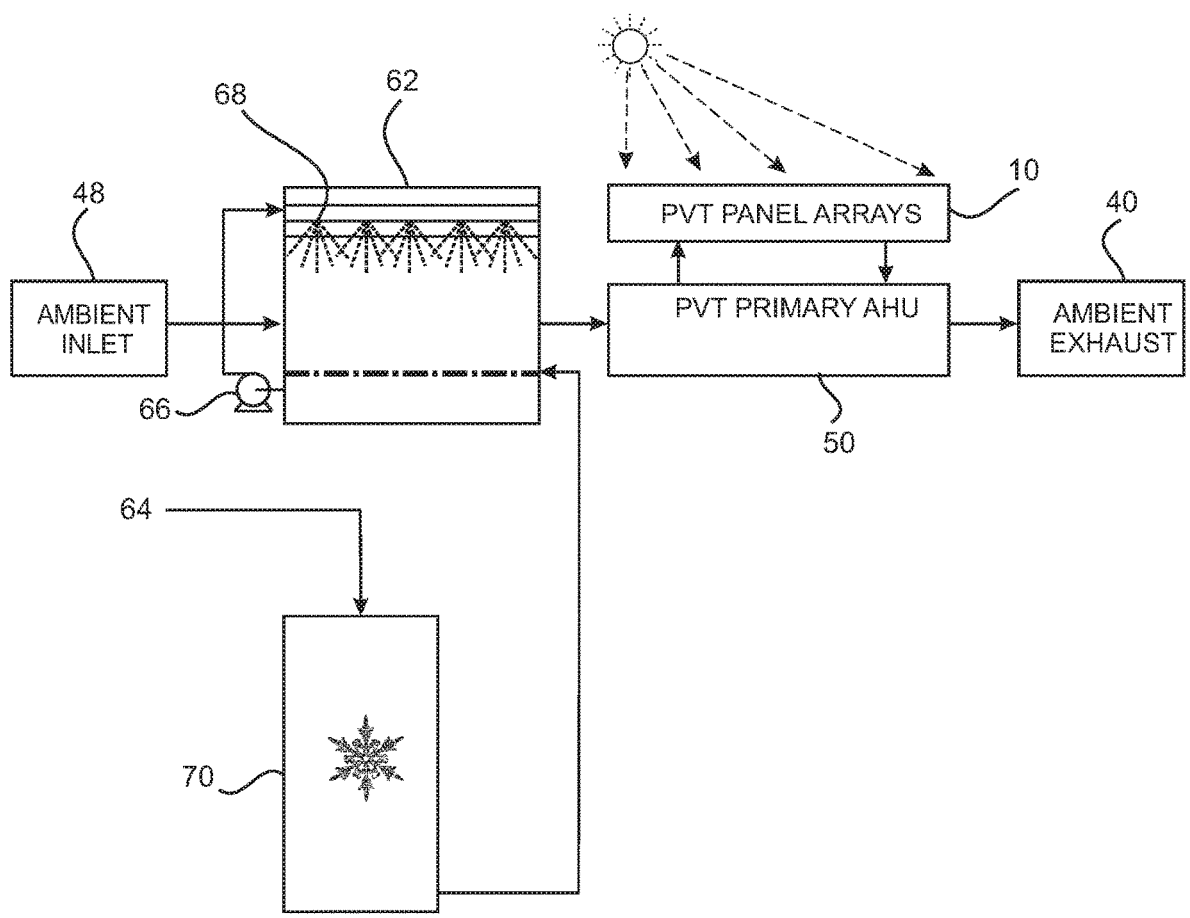

As shown by way of example in FIG. 7c, water supplied to the evaporative cooler may be pre-chilled via a chiller unit 70, which can help to extract additional heat form the incoming ambient air, further pre-cooling the air to the AHU.

Evaporative cooling techniques can nominally reduce ambient temperature by 10 degrees C. subject to the humidity levels of the air entering the cooler.

A 10 degrees C. reduction in panel temperature returns a nominal 5% gain in PV capacity when compared to simple ambient air cooling. Further cooling can be achieved in evaporative cooling if chilled water is circulated in through evaporative media, such as shown in FIG. 7c.

Thermal storage cooling technique draws the inlet air across a thermal mass 72 that has been cooled by an external means to a temperature that is below ambient air temperature.

Figure 7D:
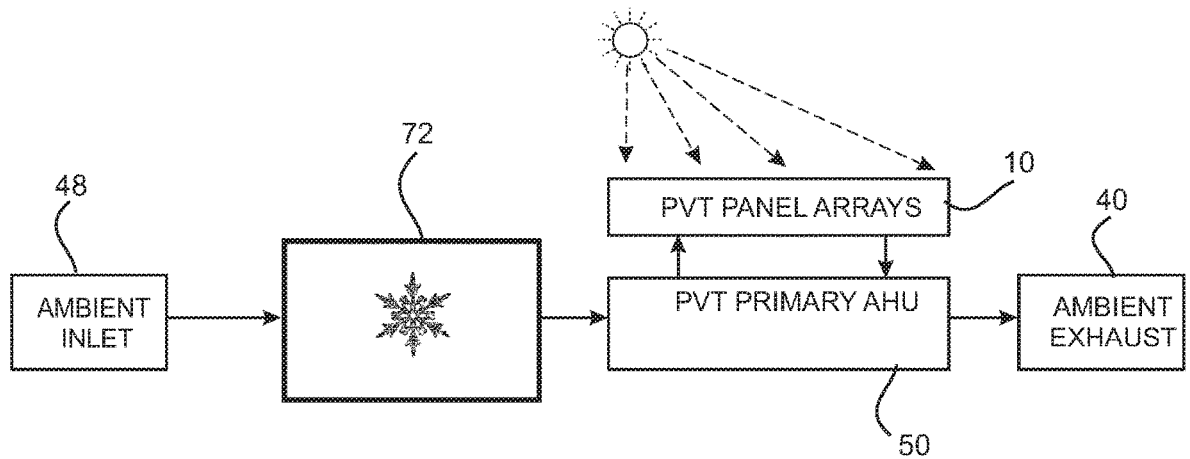
Figure 7E:
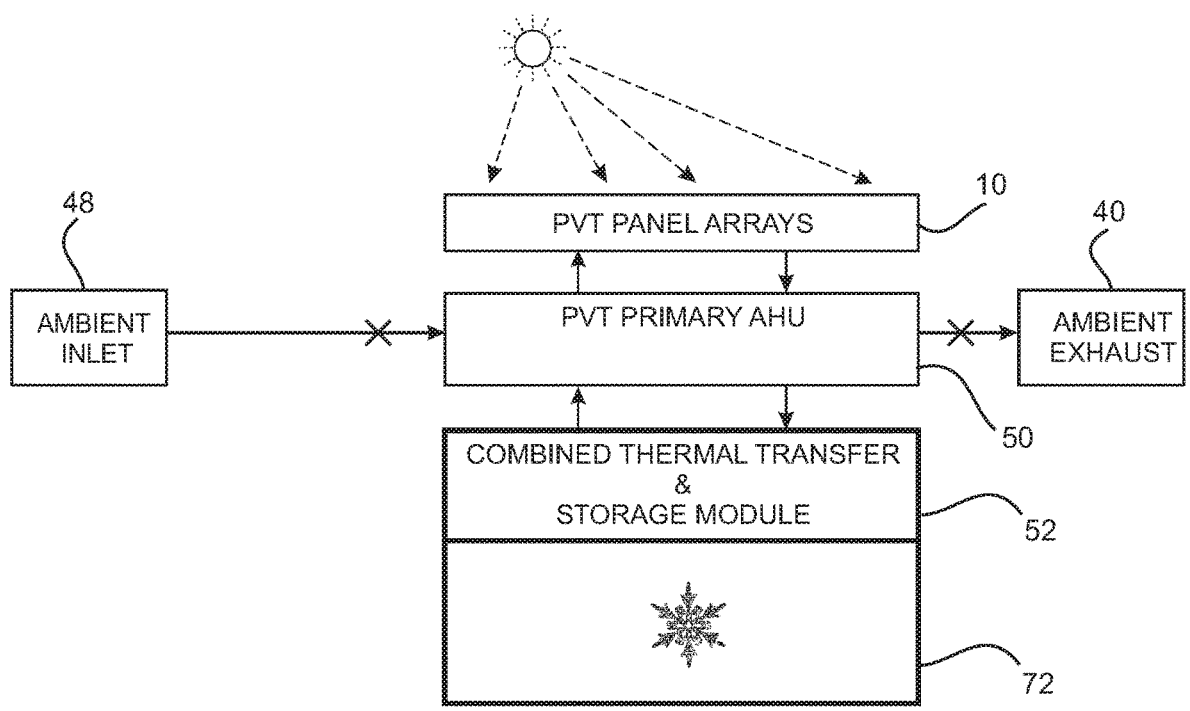

The thermal mass 72 can be in many forms including solid material (concrete/aggregate), liquid (water) and more recently phase change materials (ice, long chain hydrocarbons, salts), as indicated in FIG. 7d and FIG. 7e.

As shown in FIG. 7e, the chilled thermal mass can be associated with the combined thermal transfer and storage module 52.

Alternatively, or in addition, the chilled thermal mass 72 can be provided between the ambient air inlet and the PVT primary AHU.

Radiative Night Cooling: one or more forms of the present invention provides the unique feature of being suited to radiative night cooling applications with no or little modification to the daytime PVT mode.

Radiative night cooling is an effective means of cooling objects below ambient air temperature. To explain this phenomenon by example, it is what enables frost to form on black roofs even with ambient minimum temperature well above zero degrees.

Intake air can be drawn from outside, inside a building/facility or from a thermal storage mass depending on application. This air is filtered and then driven through the PVT circuit.

As the warmer inlet air is jetted on to the cold PV cell it releases its heat to the cell which is then radiated into the night sky. The spent air which is now much cooler is then distributed back into the occupied air space and/or thermal mass.

Radiative night cooling effectiveness is subject to cloud conditions with clear night sky's offering the best result. See for example FIGS. 6a through to 6e.

A combination of radiative night cooling, with sufficient internal thermal mass and adequate perimeter insulation, can be provided to prevent the need for auxiliary forms of cooling even in the hottest climates.

One or more embodiments of the present invention provides the benefits of night cooling whilst doing so in an airtight environment when used in a closed loop mode. This reduces the occupant's exposure to dust, pollen, security concerns, outside noise and vagaries of the wind disturbance which can all impact on a healthy and safe living space together.

The use of a radiative night cooling mode can be used to recharge the cooling potential of thermal storage systems which have been referred to as a technique for cooling the PVT during daytime operations, as indicated in FIG. 7d and FIG. 7e.

Condensation Generation: When employed in night cooling applications, one or more embodiments of the present invention can generate condensation in varying quantities subject to the air intake's humidity and night sky temperature.

The condensation collection points can be incorporated into the base of the HTMM for removal from the panel using either gravity or assisted means.

Figure 8A:
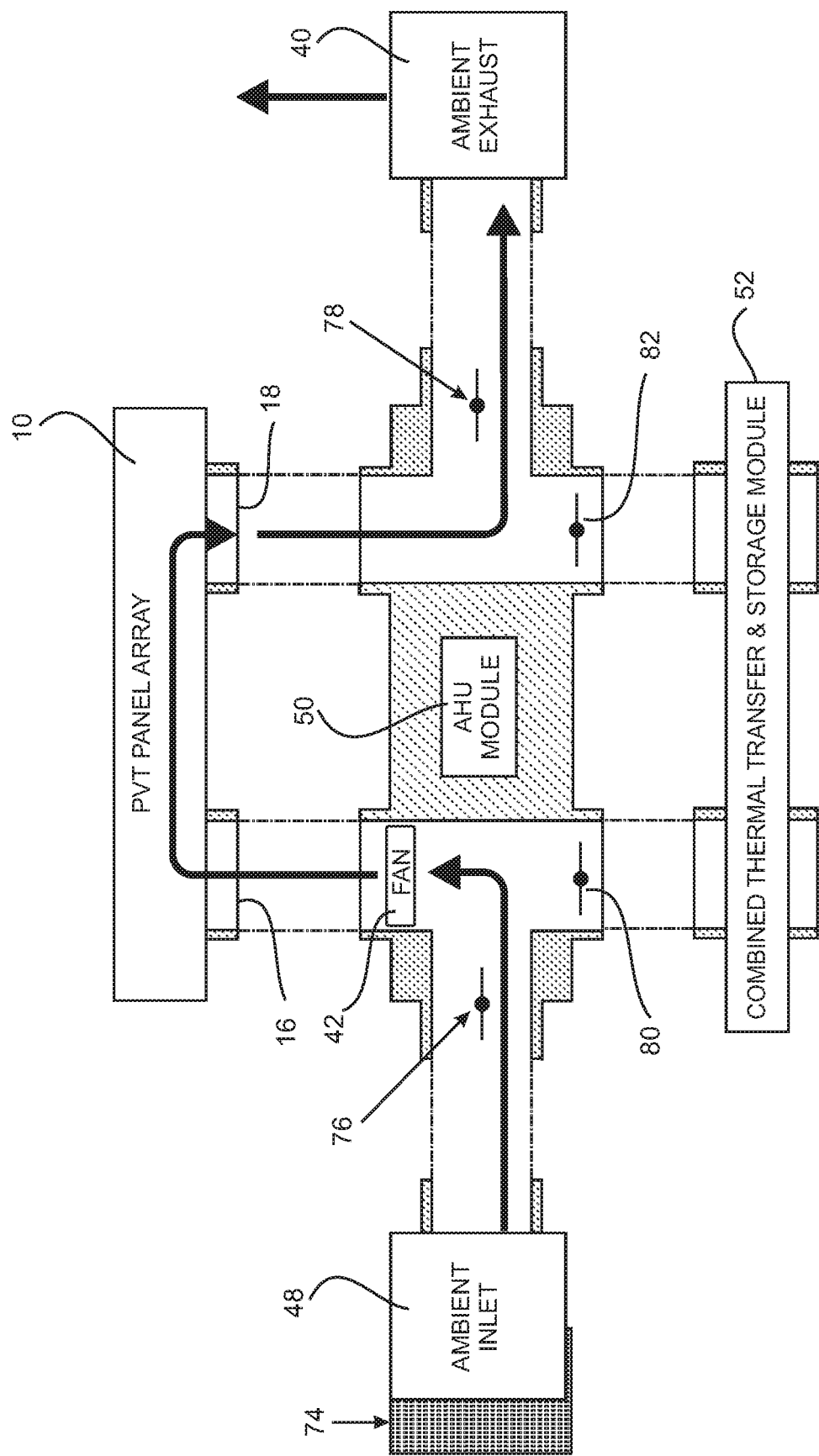
FIG. 8a shows a simplified schematic illustrating the key components of the primary air handling unit (AHU) for a PVT cooling mode in open loop circuit and the physical relationship of these to each other according to a further embodiment of the present invention.

FIG. 8a shows an example of an open loop mode of operation of the system. Ambient air is drawn through a filter 74 at the ambient air inlet 48. An inlet valve 76 is open to allow the air to pass, via the fan 42, to the PVT panel array and to exit via an open outlet valve 78 to the ambient exhaust 40.

During such operation, inlet valve 82 and outlet valve 80 associated with the combined thermal transfer and storage device are maintained closed.

Figure 8B:
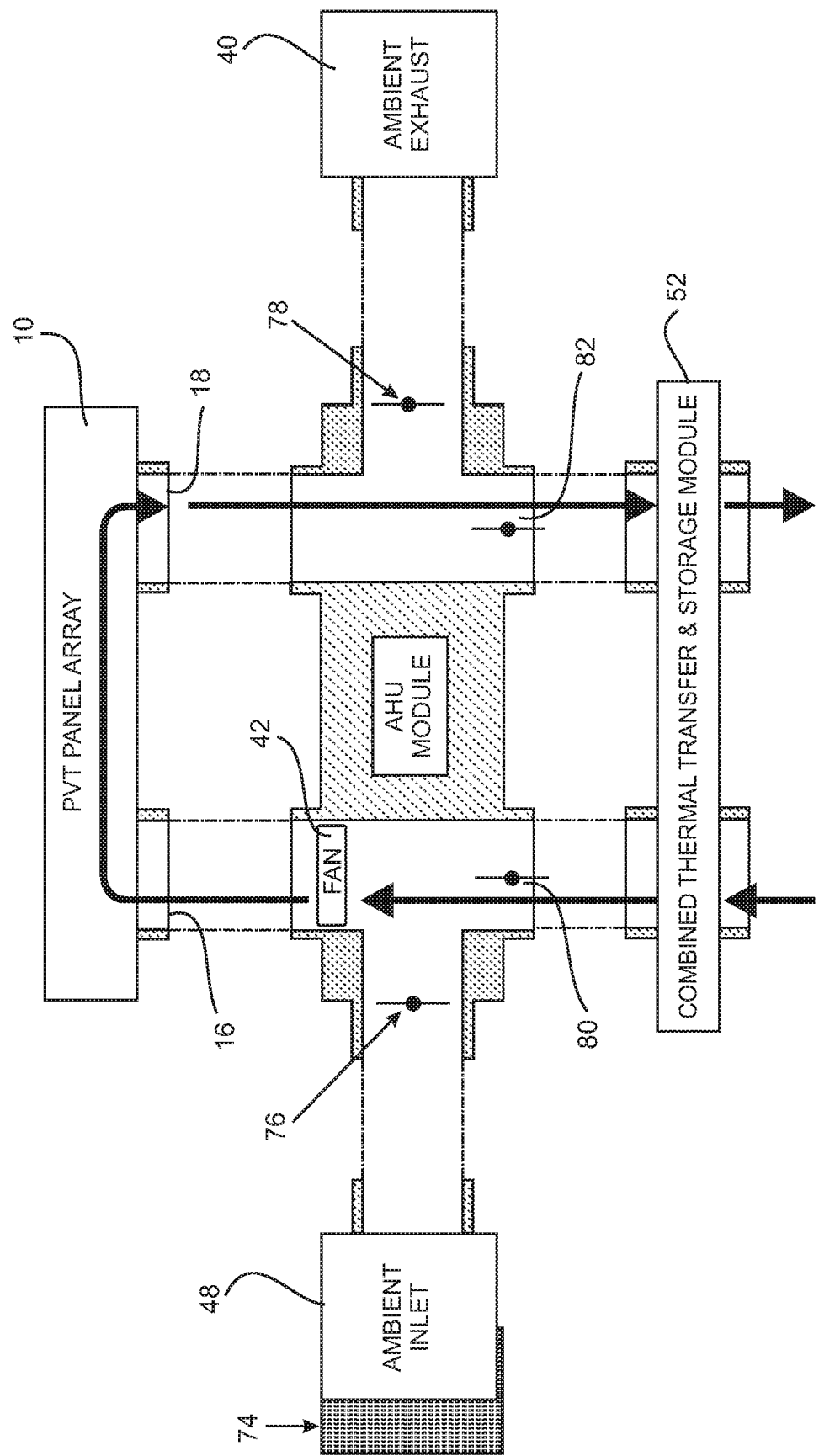
FIG. 8b shows the same simplified schematic of FIG. 8a but with the air flow path way in the closed loop mode.

An alternative mode of operation is shown by way of example in FIG. 8b, wherein the inlet valve 76 is closed to prevent ambient air being drawn in from the external atmosphere.

An outlet valve 80 of the combined thermal transfer and storage module draws cool air from the building/room, passes the air through the PVT panels for heating the air, and feeds the warmed air back into the room via inlet valve 82. The outlet ambient air valve 78 is closed.

The extended surface referred to in (see FIG. 15e) can be modified to provide a method to entrap the moisture and (then through capillary action and channeling) drain the condensation to one end of the panel to a collection manifold.

In some arid environments, the generation of condensate would be seen as a great opportunity to source water from the environment. This technique would be a significant improvement on the current approaches employed, and reference is made to FIGS. 16a through to FIG. 16c.

Filtering/Sanitisation: one or more forms of the present invention incorporates filtering of the air before it enters the PVT circuit in either open or closed loop operation to maintain the long term performance of the system whilst maintaining good air quality.

Additional sanitisation methods such as UVC light sources can further sustain long term air quality and performance by preventing the build-up of biological elements on filters and heat exchanger coils, as indicated in FIG. 4.

Thermal Heat Exhaust and Outside Air Exchange Systems: one or more forms of the present invention can include a duct that connects the PVT outlet duct to atmosphere. The flow through this duct can be controlled through the engagement of at least one fan and/or at least one valve.

The speed of the fan(s) and the actuation of the valve(s) can be controlled either manually or remotely, such as utilising an integrated control system.

The primary purpose of the heat exhaust outlet is to expel the excess hot air generated which is greater than the systems thermal demand. It is generally located downstream of any additional energy transfer units such hot water heating as an example.

The thermal heat exhaust system can also incorporate an air/air heat exchanger that can be engaged to ensure adequate volumes of replenished air from outside are introduced into the house. This feature enables the heat from any exhausted air to be recovered by the replenished outside air drawn through the intake. This requirement is applicable when the system is operated in closed loop mode, as indicated in FIG. 4.

Main Air Ducting: one or more forms of the present invention can incorporate a number of features that enables many configurations of main ducting to be considered. The selected configuration will then determine the type of cell air plenum used. The ducting moulded into the mounting cassette will be open ended. Closure is achieved with a duct termination plate. The mounting arrangement/cassette underside will provide the option for main duct entries ports which need to be cut out for use.

The invention considers the preferred arrangement of main ducting to be axially along a length of a PVT string that is orientated with the PVT panel aligned with their long axis.

A preferred orientation of the main ducting inlet and outlet are at opposing ends of the PVT string to passively facilitate balance flow across all PVT panels.

The invention considers that the main inlet and outlet ducts are insulated inside the PVT apparatuses and as they extend beyond the apparatus.

The invention considers that during a closed loop mode of operation the system's performance will benefit from reversing the location of the air draw and discharge points within a room/space when switching from heating and cooling modes.

In a preferred arrangement for the cooling mode, air is drawn from the upper extents of the room and the air discharged at the lower extents to prevent mixing.

In a preferred arrangement for the heating mode, the air is drawn from the lower extents of the room and the air discharged at the upper with adequate velocity to ensure thermal comfort to the occupants. See for example FIG. 5a.

Air Handling Unit/s (AHU): One or more forms of the present invention encompasses methods and arrangements for conveying the air through the PVT circuit/s and auxiliary services.

One or more embodiments include the use of electrically driven axial, centrifugal and mixed flow fans.

Operation and maximum flow control the electric fan motors can be deployed using EC or equivalent variable speed control techniques. Flow control setting can be established by the controller. Manual fan control can be employed.

Figure 30A:
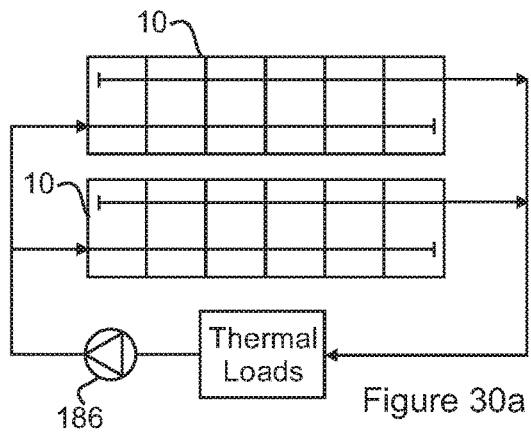
FIGS. 30a to 30h show block diagrams illustrating the basic process flow within the PVT panels and the placement of primary and secondary fans in relation to the PVT panel strings according to an embodiment of the present invention.
Figure 30B:
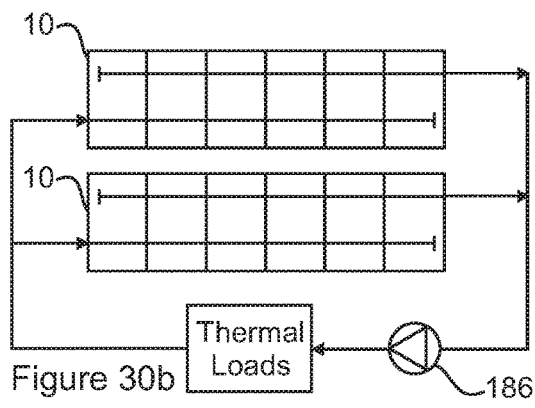
Figure 30C:
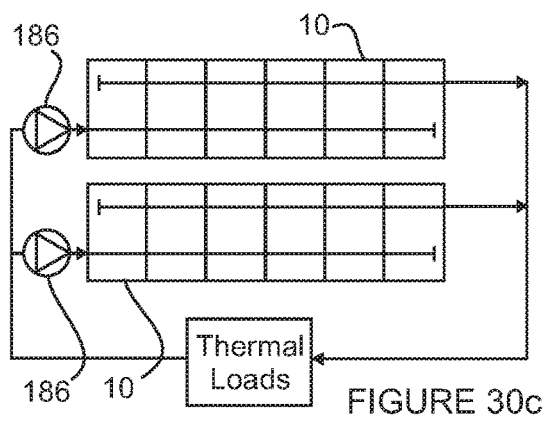
Figure 30D:
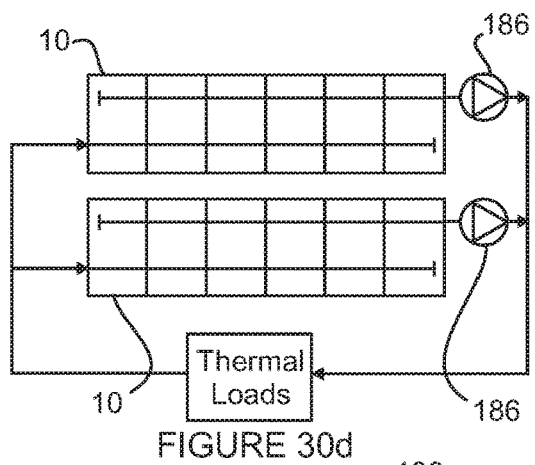

A single fan can be located between the inlet filter and the inlet duct/s of the PVT system (which may contain one or more PV string elements), such as shown in FIG. 30d.

Figure 30E:
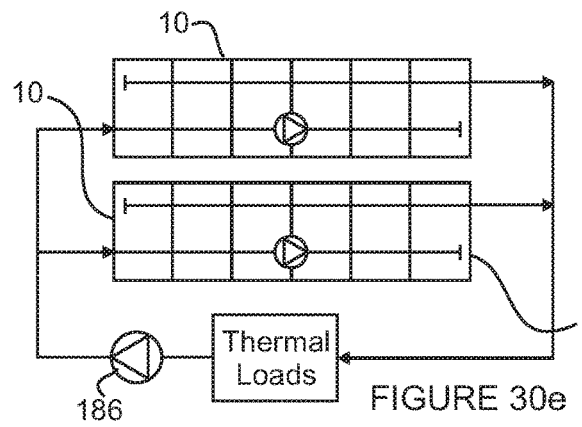
Figure 30F:
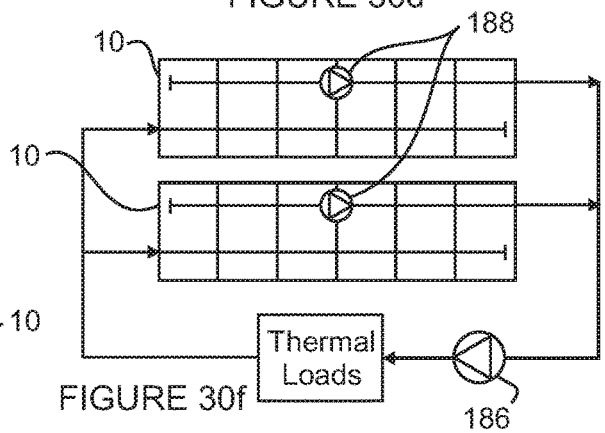
Figure 30G:
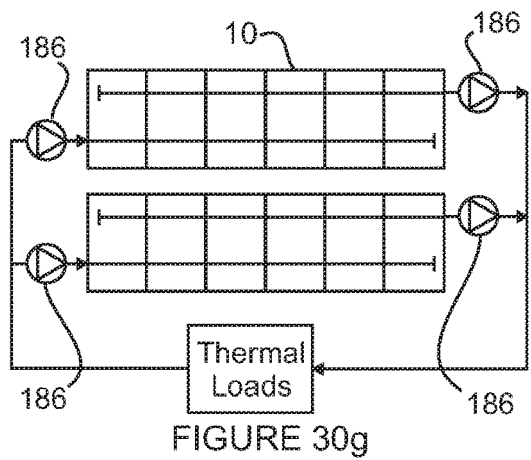

Other fan configurations considered are: single exhaust fan drawing air from the PVT system which may contain one or more PV strings (FIG. 30b); single inlet or exhaust fan applied to each individual PV system string (FIG. 30c); multiple inlet or exhaust fans configured in series or parallel and applied to each individual PV system string (FIG. 30d); single inlet or exhaust fan configured in series or parallel and applied to each individual PV panel (FIG. 30e); multiple inlet or exhaust fans configured in series or parallel and applied to each individual PV panel (FIG. 30f).

Figure 30H:
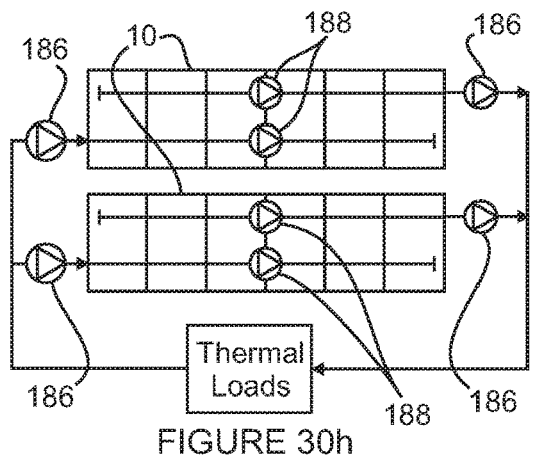
Figure 31E:
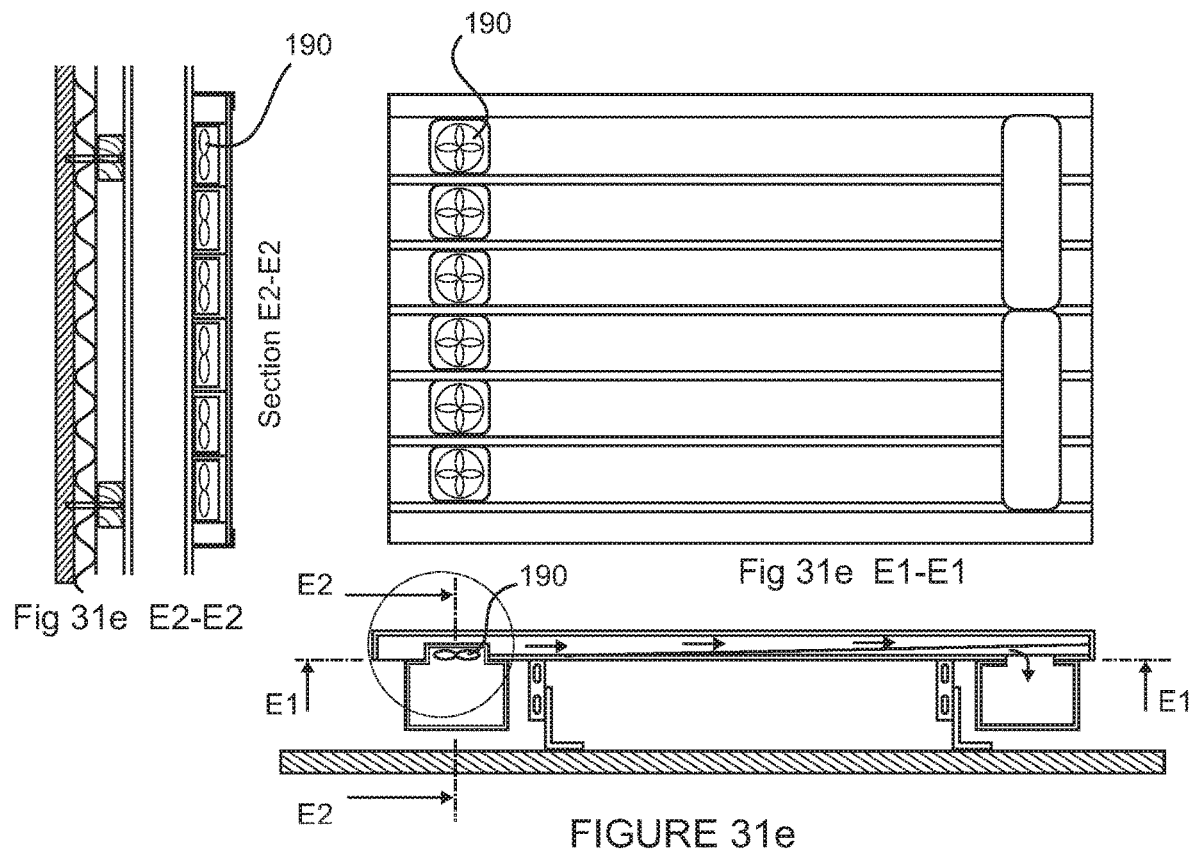
FIG. 31e shows a schematic of the plan view and FIGS. 31eE1-E1 and 31eE2-E2 show respective sectional views of a PVT panel to illustrate the placement of fans directly in the inlet of each individual cell air plenum according to an embodiment of the present invention. This embodiment of the invention enables the PVT panel and air fans to be supplied as a simple package unit.
Figure 31F:
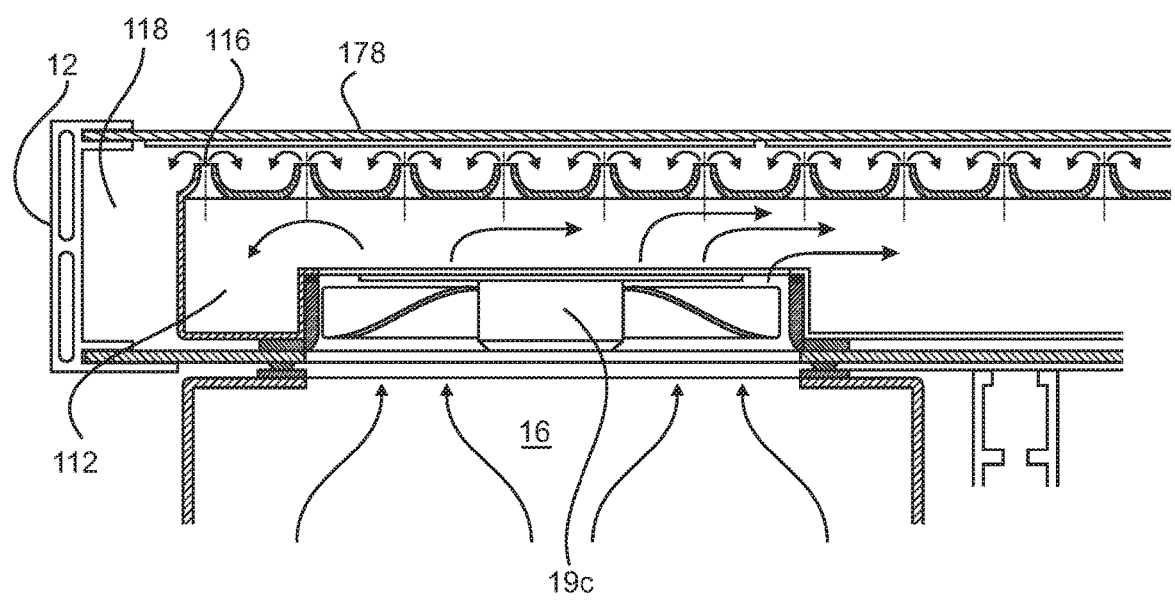
FIG. 31f shows a detailed schematic of a sectional view of the embodiment shown in FIG. 31e illustrating the installation of the fans within the inlet of the cell air plenum and the sealing interfaces between the fan, cell air plenum and the inlet duct.
Figure 32A:
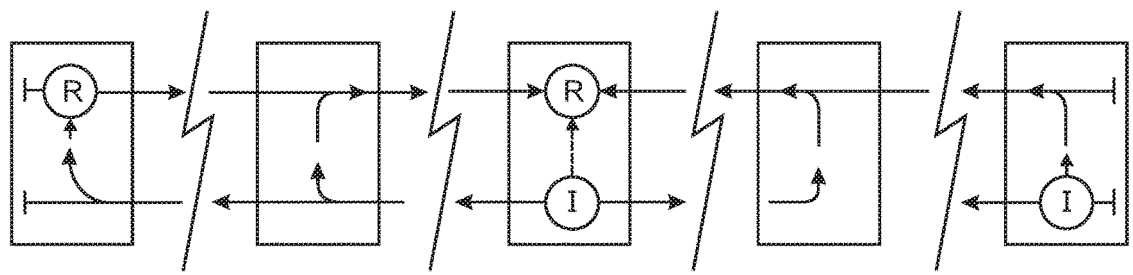
FIG. 32a shows a block drawing illustrating the process flows of various PVT panel ducting arrangements for PVT panels whereby the ducts are aligned across the width of the panel according to an embodiment of the present invention. The various panel ducting configurations include, terminus, pass through, rear entry and side entry.
Figure 32B:
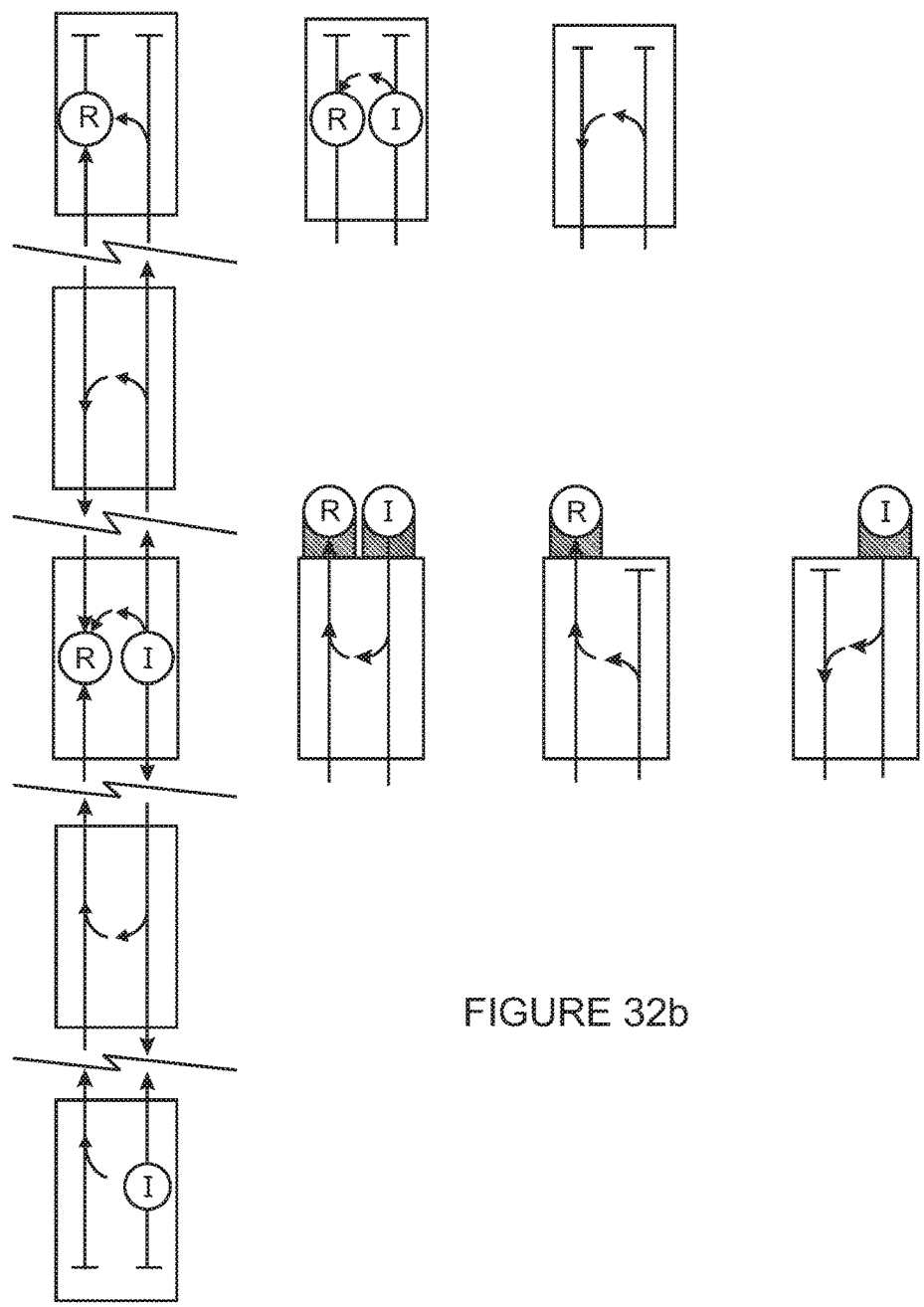
FIG. 32b shows a block drawing illustrating the process flows of various PVT panel ducting arrangements for PVT panels whereby the ducts are aligned along the length of the panel according to an embodiment of the present invention. The various panel ducting configurations include, terminus, pass through, rear entry and side entry.
Figure 33A:
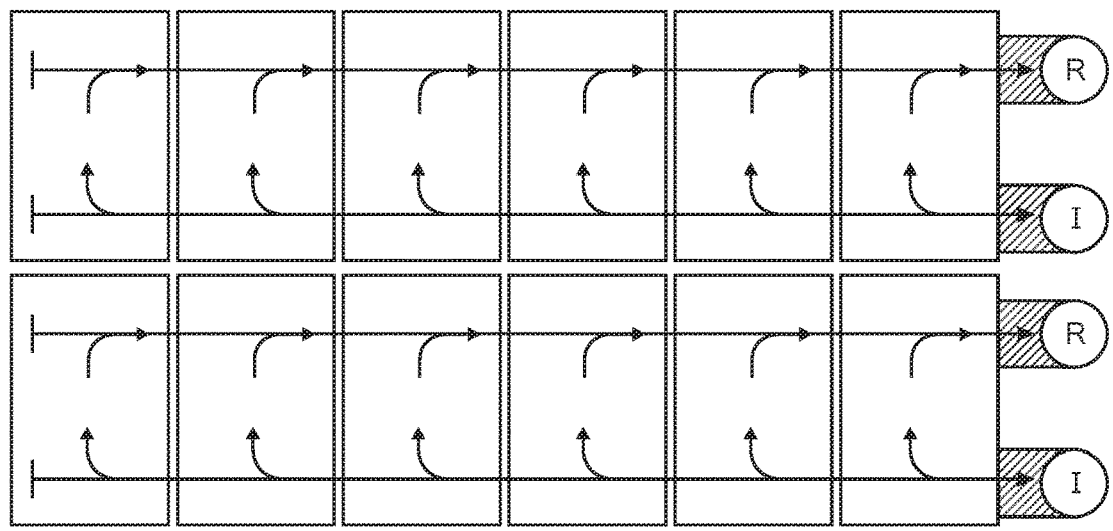
FIG. 33a shows a block drawing illustrating the process flows of various PVT panel ducting arrangements for dual PVT panel strings according to an embodiment of the present invention. In this embodiment, each PVT panel string is supplied with separate inlet and return ducting from a side entry port on the same PVT panel.
Figure 33B:
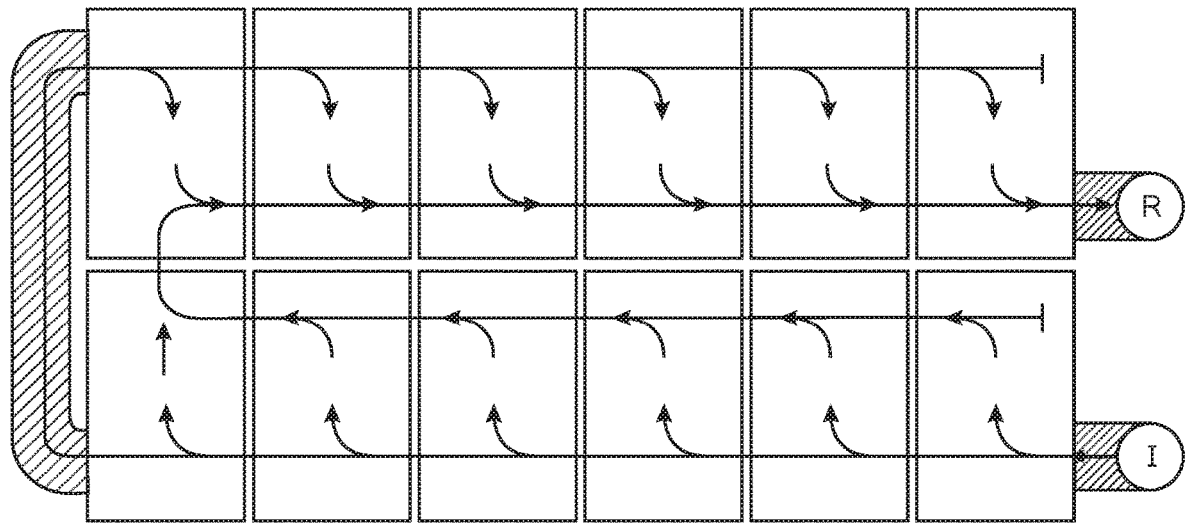
FIG. 33b shows a block drawing illustrating the process flows of various PVT panel ducting arrangements for dual PVT panel strings according to an embodiment of the present invention. In this embodiment, the two PVT panel strings are joined and supplied from the same inlet source and deliver to the same return port. Such configuration embodies the use of an external duct together with cross-port connection to complete the circuits between the two strings.
Figure 33C:
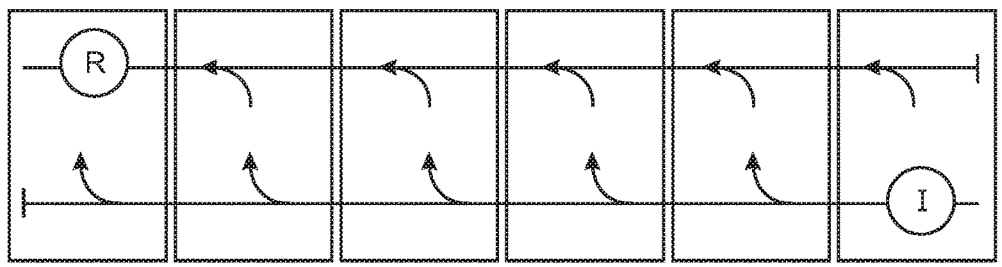
FIG. 33c shows a block drawing illustrating the process flows of various PVT panel ducting arrangements for single PVT panel string according to an embodiment of the present invention. In this configuration, each PVT panel string is supplied with inlet air from a rear port on one end of the string and return air via a rear port on the other end of the string.

Other fan configurations may also be provided to assist in balancing air flow through each PVT apparatus. For example, a primary fan used in conjunction with secondary fan/s configured in a parallel arrangement can be employed to address any balancing issues, as shown in FIG. 30e through to FIG. 30h.

One or more auxiliary fans can be employed for delivering air to other services such as the outside air exchange module; thermal storage modules; hydronic heat exchange modules, hot water heat exchange module, heat pump condenser/evaporator heat exchange module and internal air distribution, as shown in FIG. 9.

Warmed air from the PVT panel array 10 can be fed into the combined thermal transfer and storage module 52. As shown by way of example in FIG. 9, air can be diverted via closed valve 86 and open valve 84 to the combined thermal transfer and storage module 52.

A heat transfer inlet valve 88 can be opened to allow the air to be directed to thermal transfer unit 90 incorporating thermal transfer (heat exchange or HEX) for hot water (hot water storage 100), hydronics (hydronic header 102), a heat pump (for heating, ventilation and air-conditioning, HVAC 104), a heat pump for heat exchange with the hot water system or hydronics system/header for use in heating, ventilation and air-conditioning HVAC.

An outlet valve 90 allows return air to flow back to the PVT panel array (via open valve 80 and the fan 42). Valves 92, 94, to the cold thermal mass 96 and hot thermal mass 98 are maintained closed.

Modes of Operation: One or more forms of the present invention incorporate one or both of two primary modes; closed loop and open loop.

Closed loop corresponds to no net transfer between the complete PVT circuit including any building envelope/space forming part of that circuit and the outside environment.

A system would still deemed to be closed loop when operating the outside air exchange system whilst the incoming and outgoing air flows are in balance.

The open loop system preferably involves a differential in flow rate between any two or more elements of the circuit. For example, the inlet air can be drawn from outside, forced through the PVT circuit and spent air expelled back outside through the exhaust.

A secondary mode of operation relates to either daytime generation (heat and electricity) or night-time cooling.

A third mode of operation relates to maximising the combined energy yield of the PV and Solar system at any point in time or daily. It establishes the optimal air flow rate through the PVT and determines where best to source the intake air.

A fourth mode of operation relates to any other operational state that is not the third mode. This mode is a response to one or more of market forces, internal demand or consumer preferences. For example, the PVT system maybe set to deliver high-grade heat during winter and when electricity prices are low. The system in this mode has reduced air flow to allow the PV cells to retain more heat.

An external electrical system has an issue that causes the exported price of electricity to increase significantly. In response, the control system market response algorithm defers any internal loads and then switches the PVT system duty from space heating to panel cooling. It does this by switching into open loop mode and draws in cold outside air and expels the spent air through the exhaust (assuming the outlet temperature is colder than the room set point temperature). The resultant effect is a reduction in panel temperature of 40 degrees C. and a 20% boost in PV production. In this case it is assumed that the value of the lost heating is less than the revenue attained from the electricity sale.

In another example a domestic hot water system may call for additional heat due to a large demand placed upon it. The system operating in mode 3 delivers high volume lower grade space heating. The hot water demand switches the system to mode 4 and the control system reduces the air flow. The PV cells subsequently heat up to a temperature that delivers the required conditions to heat the water.

Control System and Instrumentation: Operation of one or more forms of the present invention can be by the use of a control system, but is not limited to this. The control system preferably centralizes all the physical inputs from the PVT system and other external systems that have a determining effect on how the system operates and performs. It then references these conditions against an operating mode algorithm and sends the appropriate updated commands to control fan speed and valve actuation.

Figure 34:
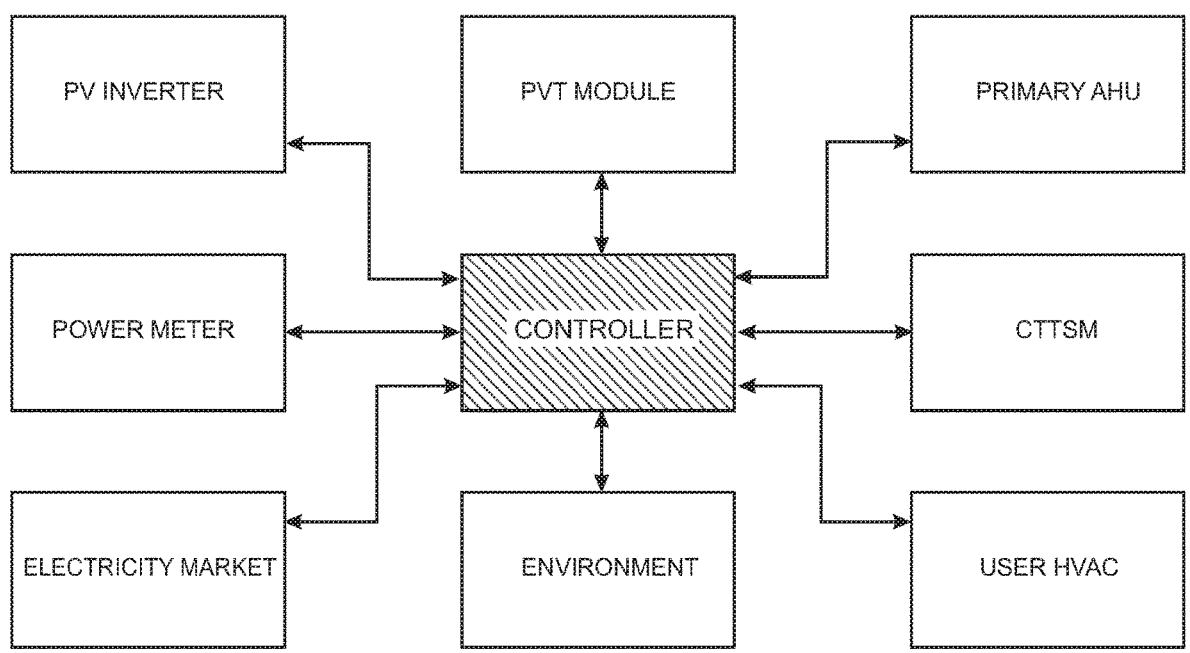
FIG. 34 shows a block drawing illustrating the PVT control system interfaces with all the various related systems according to an embodiment of the present invention.

Physical inputs from the PVT system could include central or micro inverter data (DC power, DC volts, DC amps, AC power, AC volts, AC amps frequency), air flow measurements (delivered air, outside air transfer module), air pressure sensors (across the fan, across the filter/s, across PVT panel inlet and outlets and across heat exchanger modules), air temperature probes (ambient, ambient air intake, room/space air intake, exhaust air, PVT panel surface and air outlets, air inlet and outlets to various heat exchange modules, fluid inlet and outlet temperatures associated with the respective various heat exchanger modules, room/space), ducting valve actuation status, fan operational data (speed, power, current, volts). See for example FIG. 34 and Tables 1 and 2 below:

Tables 1 and 2 below show lists of system inputs/outputs (I/Os). In particular, Tables 1 and 2 show the associated input and output conditions that can be monitored or changed to effect adequate control of the PVT system according to at least one embodiment of the present invention.

TABLE 1

| SYSTEM | COMPONENT | MEASUREMENT | ANALOGUE | DIGITAL |
|---|---|---|---|---|
| USERHVAC | HVAC INLET VALVE | ACTUAL POSITION | I | |
| | | SETPOINT POSITION | O | |
| | HVAC OUTLET VALVE | ACTUAL POSITION | I | |
| | | SETPOINT POSITION | O | |
| | HVAC TRANSFER VALVE | ACTUAL POSITION | I | |
| | | SETPOINT POSITION | O | |
| | AIR INLET FILTER | DIFFERENTIAL PRESSURE | I | |
| | | AMBIENT TEMPERATURE | I | |
| | HVAC HEAT PUMP ACTIVATE | STATUS | | O |
| | HVAC HEAT PUMP LOAD | DEMAND | I | |
| | SPACE/ROOM | TEMPERATURE | | |
| | HVAC FAN | AIR INLET TEMPERATURE | I | |
| | | SPEED | I | |

TABLE 1-continued

| SYSTEM | COMPONENT | MEASUREMENT | ANALOGUE | DIGITAL |
|---|---|---|---|---|
| | | VOLTS | I | |
| | | AMPS | I | |
| | | INLET PRESSURE | I | |
| | | OUTLET PRESSURE | I | |
| | | SPEED SETPOINT | O | |
| | | AIRFLOW | I | |
| | HVAC EVAPORATOR | AIR OUTLET TEMPERATURE | I | |
| | CONDENSOR COIL | AIR OUTLET TEMPERATURE SETPOINT | | O |
| | HVAC HEAT PUMP ACTIVATE | STATUS | | O |
| | HVAC HEAT PUMP LOAD | DEMAND | I | |
| PV INVERTER | INVERTER CONTROLLER | DC VOLTS | I | |
| | | DC AMPS | I | |
| | | AC VOLTS | I | |
| | | AC AMPS | I | |
| | | AC POWER | I | |
| | | AC ENERGY ACCUMULATOR | I | |
| POWER METER | NETWORK EXPORT METER | AC POWER | I | |
| | | AC ENERGY ACCUMULATOR | I | |
| | | AC FREQ | I | |
| | NETWORK EXPORT METER | AC POWER | I | |
| | | AC ENERGY ACCUMULATOR | I | |
| | INTERNAL CONSUPTION METER/S | AC POWER | I | |
| | | AC ENERGY ACCUMULATOR | I | |
| | DEMAND MANAGEMENT (DIGITAL) | STATUS | | I/O |
| | DEMAND MANAGEMENT (ANALOGUE SETPOINTS | SETPOINTS | I/O | |
| ENVIRONMENT | AMBIENT REALTIME | TEMPERATURE | I | |
| | | HUMIDITY | I | |
| | | WIND SPEED | I | |
| | | SOLAR ISOLATION | I | |
| | | TIME | I | |
| | AMBIENT FORECAST | TEMPERATURE | I | |
| | | SOLAR ISOLATION | I | |
| ELECTRICITY MARKET | REALTIME INTERVAL PRICING | UNIT PRICING | I | |
| | FORECAST INTERNAL PRICING | UNIT PRICING | I | |
| | FORECAST PV PRODUCTION | ENERGY ACCUMULATOR | I | |
| | FORECAST THERMAL PRODUCTION | ENERGY ACCUMULATOR | I | |
| | FORECAST USER ELECTRICITY DEMAND | ENERGY ACCUMULATOR | I | |
| | FORECAST USER THERMAL DEMAND | ENERGY ACCUMULATOR | I | |
| CONTROLLER | MODE OF OPERATION | SETPOINTS | I | |

TABLE 2

| SYSTEM | COMPONENT | MEASUREMENT | ANALOGUE | DIGITAL |
|---|---|---|---|---|
| PVT MODULE | PV Panel | VOLTS | I | |
| | | AMPS | I | |
| | | PANEL TEMPERATURE | I | |
| | | VOID PRESSURE | I | |
| | PVT DUCT | PRESSURE | I | |
| PRIMARY AHU | PVT RETURN DUCT | AIR TEMPERATURE | I | |
| | PRIMARY FAN | AIR TEMPERATURE | I | |
| | | SPEED | I | |
| | | VOLTS | I | |
| | | AMPS | I | |
| | | INLET PRESSURE | I | |
| | | OUTLET PRESSURE | I | |
| | | SPEED SETPOINT | O | |
| | | AIR FLOW | I | |
| | AMBIENT INLET FILTER | DIFFERENTIAL PRESSURE | I | |
| | | AMBIENT TEMPERATURE | I | |
| | AMBIENT INLET CONTROL VALVE | ACTUAL POSITION | I | |
| | | SETPOINT POSITION | O | |
| | EXHAUST CONTROL VALVE | ACTUAL POSITION | I | |
| | | SETPOINT POSITION | O | |
| | CTTSM INLET CONTROL VALVE | ACTUAL POSITION | I | |
| | | SETPOINT POSITION | O | |
| | CTTSM OUTLET CONTROL VALVE | ACTUAL POSITION | I | |
| | | SETPOINT POSITION | O | |
| CTTSM | CTTSM INLET VALVE | ACTUAL POSITION | I | |
| | | SETPOINT POSITION | O | |
| | CTTSM OUTLET VALVE | ACTUAL POSITION | I | |
| | | SETPOINT POSITION | O | |

TABLE 2-continued

| SYSTEM | COMPONENT | MEASUREMENT | ANALOGUE | DIGITAL |
|---|---|---|---|---|
| | THERMAL TRANSFER MODULE INLET VALVE | ACTUAL POSITION | I | |
| | | SETPOINT POSITION | O | |
| | THERMAL TRANSFER MODULE OUTLET VALVE | ACTUAL POSITION | I | |
| | | SETPOINT POSITION | O | |
| | THERMAL TRANSFER MODULE EXHAUST VALVE | ACTUAL POSITION | I | |
| | | SETPOINT POSITION | O | |
| | COLD THERMAL MASS STORAGE MODULE INLET VALVE | ACTUAL POSITION | I | |
| | | SETPOINT POSITION | O | |
| | COLD THERMAL MASS STORAGE MODULE OUTLET VALVE | ACTUAL POSITION | I | |
| | | SETPOINT POSITION | O | |
| | COLD THERMAL MASS STORAGE MODULE EXHAUST VALVE | ACTUAL POSITION | I | |
| | | SETPOINT POSITION | O | |
| | HOT THERMAL MASS STORAGE MODULE INLET VALVE | ACTUAL POSITION | I | |
| | | SETPOINT POSITION | O | |
| | HOT THERMAL MASS STORAGE MODULE OUTLET VALVE | ACTUAL POSITION | I | |
| | | SETPOINT POSITION | O | |
| | HOT THERMAL MASS STORAGE MODULE EXHAUST VALVE | ACTUAL POSITION | I | |
| | | SETPOINT POSITION | O | |
| | HOT WATER HEAT EXCHANGER | AIR INLET TEMP | I | |
| | | WATER INLET TEMP | I | |
| | | WATER OUTLET TEMP | I | |
| | | WATER FLOW RATE | I | |
| | | WATER FLOW RATE SETPOINT | O | |
| | HOT WATER HEAT PUMPHEAT EXCHANGER | WATER OUTLET TEMP | I | |
| | HEAT PUMP ACTIVATE | STATUS | | O |
| | HEAT PUMP LOAD | DEMAND | I | |
| | HOT WATER TANK | TANK TEMPERATURE | I | |
| | | ENERGY ACCUMULATED | I | |
| | HOT WATER CIRCULATION PUMP | SPEED | I | |
| | | SPEED SETPOINT | O | |
| | HYDRONIC HEAT EXCHANGER | AIR INLET TEMP | I | |
| | | WATER INLET TEMP | I | |
| | | WATER OUTLET TEMP | I | |
| | | WATER FLOW RATE | I | |
| | | WATER FLOW RATE SETPOINT | O | |
| | HYDRONIC HEAT PUMP HEAT EXCHANGER | WATER OUTLET TEMP | I | |
| | HEAT PUMP ACTIVATE | STATUS | | O |
| | HEAT PUMP LOAD | DEMAND | I | |
| | HEAT PUMP EVAPORATOR/CONDENSOR | AIR INLET TEMP | I | |
| | HVAC HEAT PUMP EVAPORATOR/CONDENSOR | AIR INLET TEMP | I | |
| | | AIR OUTLET TEMP | I | |
| | COLD THERMAL MASS STORAGE MODULE | AIR INLET TEMP | I | |
| | | AIR OUTLET TEMP | I | |
| | | MASS TEMPERATURE | I | |
| | | ENERGY ACCUMULATED | I | |
| | HOT THERMAL MASS STORAGE MODULE | AIR INLET TEMP | I | |
| | | AIR OUTLET TEMP | I | |
| | | MASS TEMPERATURE | I | |
| | | ENERGY ACCUMULATED | I | |
| | THERMAL TRANSFER MODULE FAN | SPEED | I | |
| | | VOLTS | I | |
| | | AMPS | I | |
| | | INLET PRESSURE | I | |
| | | OUTLET PRESSURE | I | |
| | | SPEED SETPOINT | O | |
| | | AIR FLOW | I | |

Figure 35A:
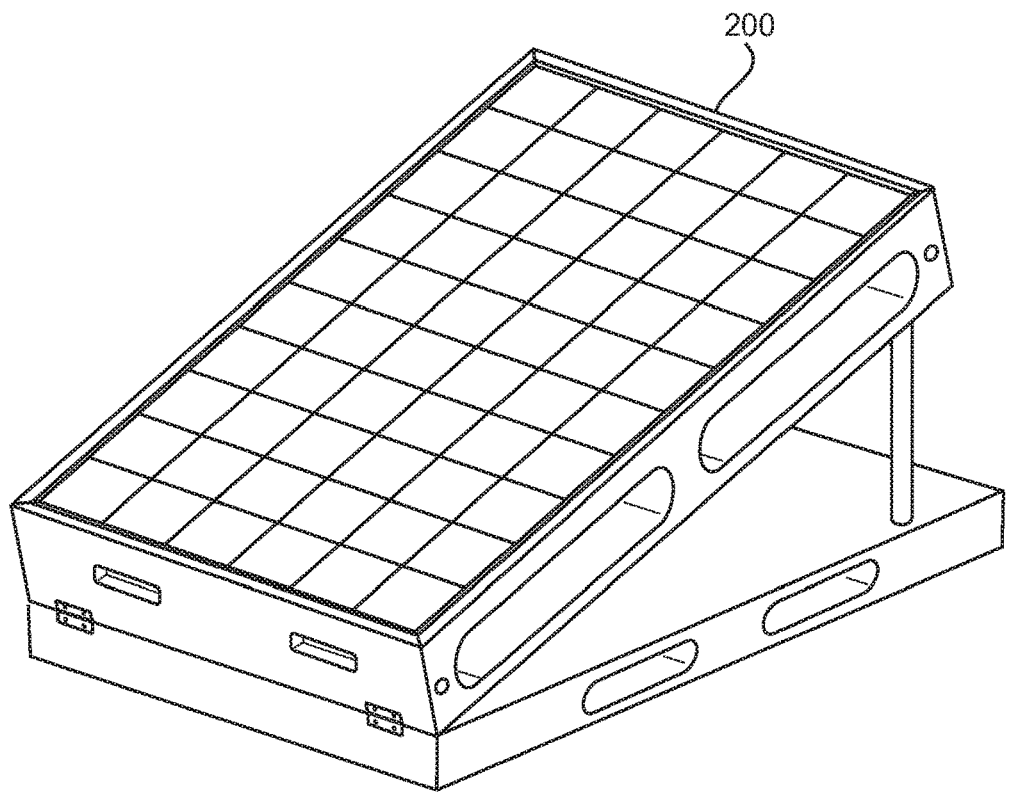
FIG. 35a shows an isometric schematic of a further embodiment of the present invention illustrating a transportable PVT pod system that can be easily transported and installed for temporary power applications.
Figure 35B:
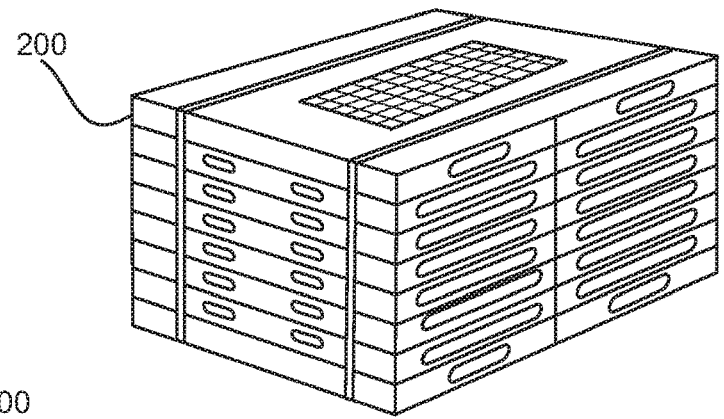
FIG. 35b shows an isometric schematic of an embodiment of the present invention shown in FIG. 35a when installed as part of a complete array.
Figure 35C:
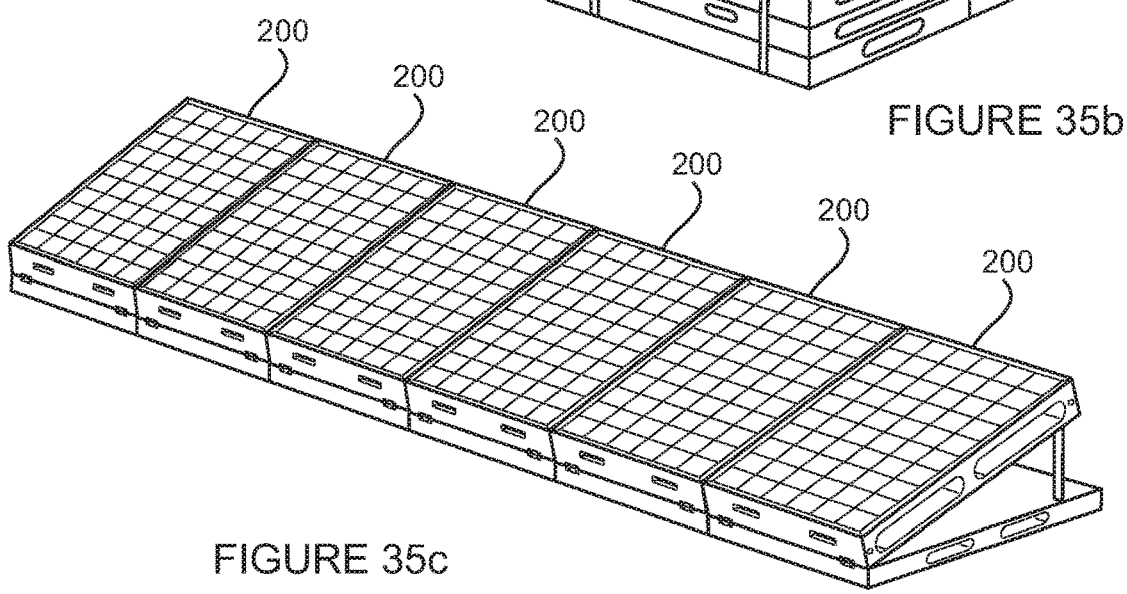

System arrangements: A PVT system 200 according to at least one embodiment of the present invention can include a single PV panel, such as for providing the very basic of needs of an impoverished community—see FIGS. 35a through to FIG. 35c.

Figure 36:
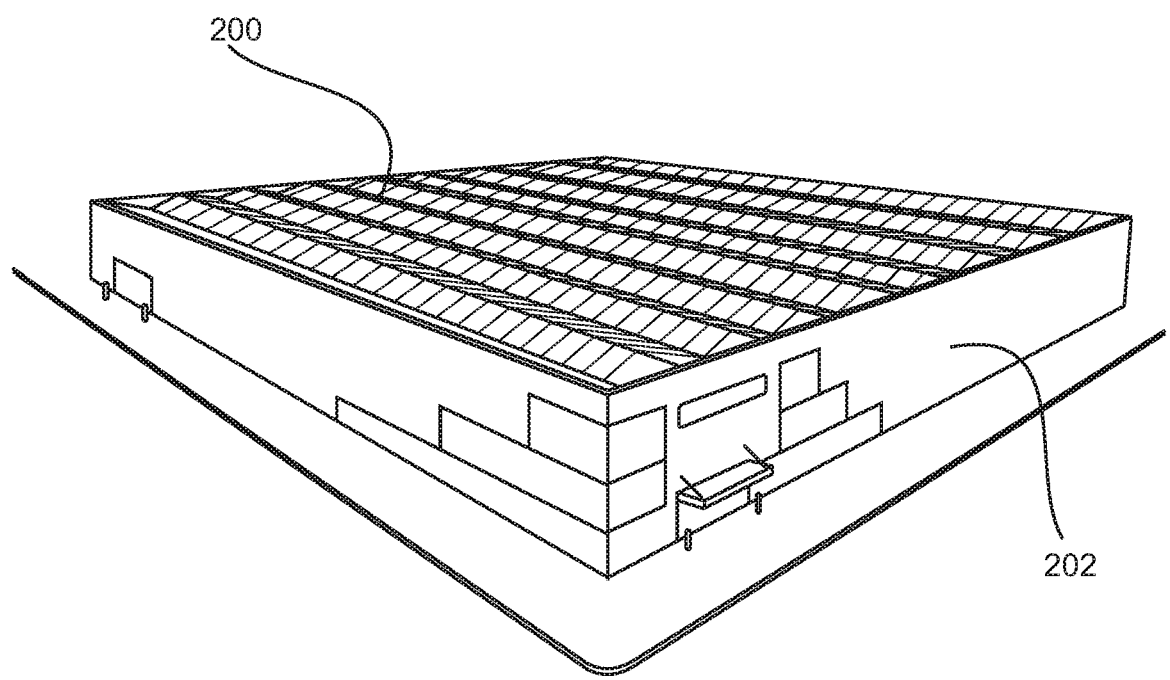

In one or more forms, the PVT system can include one or more PVT strings, with PVT panels numbering between 6 and 16 plus for an existing single dwelling roof top application, as indicated in FIG. 2a. In a commercial application, the PVT system 200 can be installed across the entire existing roof or better still become the roof in new building constructions 202 (see for example FIGS. 36).

PVT systems embodying the present invention can be cantilevered off walls or even shop fronts, increasing the available area to extract solar energy that was previously unrealized. PVT systems embodying the present invention can also be installed in large scale solar systems adjacent to farms of industrial facilities that have a need for thermal energy.

The ability of one or more forms of the present invention to incorporate radiative night cooling is a significant opportunity in adopting the application of PVT technology in refrigeration applications and data centre cooling. Excess night radiative cooling potential not exploited directly could be diverted to cool energy storage modules which can then be drawn down on during the day reducing air-conditioning cooling demand. Cooling of data centres is critically important to maximise computing capacity.

A recent behavioural phenomenon in operating data centres it the concept of "chasing the moon", whereby computing processes are being constantly shunted from data centre to data centre across the globe chasing the cold air to economically cool their processes.

Whilst the above description and associated drawings provide examples of features and embodiments of the present invention, it will be appreciated that modifications and improvements, and alternative embodiments encompassing the present invention, fall within the overall scope of the present invention. That is, the particular embodiments are not to be taken to limit the overall scope and breadth of the present invention.

The invention claimed is:

1. A hybrid solar air photovoltaic thermal (PVT) apparatus that is configured to generate an electrical output and a heated thermal output from incident solar radiation during daytime and a cooling thermal output during night-time, the PVT apparatus including:
    a solar photovoltaic (PV) panel having a plurality of photovoltaic cells, the photovoltaic cells being configured to generate the electric output from the incident solar radiation,
    a heat transfer apparatus including:
        at least one first air passage configured to enable air to flow into the PVT apparatus from an inlet of the PVT apparatus;
        at least one second air passage configured to enable air to flow out of the PVT apparatus through an outlet of the PVT apparatus; and
        an air flow modification configured to direct air flowing from the at least one first air passage towards an underside surface of the solar PV panel, thereby enabling the transfer of heat to or from the solar PV panel, the air flow modification including:
            an array of jets, air nozzles or orifices provided in a flow path between the inlet of the PVT apparatus and the underside surface of the solar PV panel, wherein the jets, air nozzles or orifices are configured to direct air flowing from the inlet towards the underside surface of the solar PV panel; and
            a drain configured to enable the evacuation of the air directed towards the underside surface of the solar PV panel by the array of jets, air nozzles or orifices, away from the solar PV panel, to the outlet of the PVT apparatus;
    wherein:
    a portion of the drain is disposed between two or more jets, air nozzles or orifices of the array of jets, air nozzles or orifices;
    the at least one first air passage and/or the at least one second air passage includes multiple air passages, chambers or plenums through which supply air flows during use; and
    the multiple air passages, chambers or plenums are arranged in series such that air flows from one to the other, or are arranged in parallel such that air flow is shared/split through the air passages, chambers or plenums.

2. The hybrid solar air photovoltaic thermal (PVT) apparatus of claim 1, including at least one layer of glazing over at least part of the plurality of photovoltaic cells, such that at least some of the incident solar radiation passes through the glazing prior to reaching at least one photovoltaic cell.

3. The hybrid solar air photovoltaic thermal (PVT) apparatus of claim 1, including a condensation collection system.

4. The hybrid solar air photovoltaic thermal (PVT) apparatus of claim 3, the condensation collection system including one or more channels or ducts provided on or within the PV panel or connected to the PV panel.

5. The hybrid solar air photovoltaic thermal (PVT) apparatus of claim 4, further including a control arrangement that is configured to enable control of air flow through a number of the jets, air nozzles or orifices in use at any one time and/or to enable control of the velocity of air through the jets, air nozzles or orifices.

6. The hybrid solar air photovoltaic thermal (PVT) apparatus of claim 1, wherein air flow from the at least one first air passage to one or more of said jets, air nozzles or orifices in a region is controlled by limiting or increasing air pressure within the at least one first air passage and/or restricting/opening a diameter/width or size of one or more said jets, air nozzles or orifices in the region and/or by allowing/preventing flow of air into or out of the one or more said jets, air nozzles or orifices in the region.

7. The hybrid solar air photovoltaic thermal (PVT) apparatus of claim 1, wherein each respective jet, nozzle or orifice has a sectional profile of parallel square edged profile, convex profile, concave profile, long radius nozzle square end exit profile, long radius nozzle profile (pencil end), long radius nozzle (expansion end), long radius nozzle (mitred end), or a combination of two or more thereof.

8. The hybrid solar air photovoltaic thermal (PVT) apparatus of claim 1, wherein each respective jet, air nozzle or orifice projects to a height H relative to a flush mount jet height h above a base plane/surface at a root of the jet, the height being between 3.0 mm and 25 mm.

9. The hybrid solar air photovoltaic thermal (PVT) apparatus of claim 8, wherein the height H is a proportion relative to h, the proportion being between 20% and 80%.

10. The hybrid solar air photovoltaic thermal (PVT) apparatus of claim 1, including surface treatment/coating on a rear of the PV panel, wherein the surface treatment of the rear of the PV panel includes a textured surface that is selected from the group consisting of (i) ridges, (ii) undulations, (iii) cross hatching, (iv) raised, indented, embossed or impressed patterning, (iv) random surface texture, (v) roughing and mixtures thereof.

11. The hybrid solar air photovoltaic thermal (PVT) apparatus of claim 10, wherein the textured surface is applied onto or into an external layer of the PV panel or as an applied sheet.

12. The hybrid solar air photovoltaic thermal (PVT) apparatus of claim 1, further including attachments or coatings applied to or behind the solar PV panel immediately underneath a jet, air nozzle or orifice flow axis or along a surface trajectory of the jet, air nozzle or orifice or at a boundary between two or more interposing jet, air nozzle or orifice flows.

13. The hybrid solar air photovoltaic thermal (PVT) apparatus of claim 1, wherein the passages, chambers or plenums of the at least one first air passage and/or the at least one second air passage include insulation.

14. The hybrid solar air photovoltaic thermal (PVT) apparatus of claim 13, wherein the insulation includes a reflective coating or reflective layer, a foam cell wall structure, a laminated structure, or a combination of two or more thereof.

15. A photovoltaic thermal system including the hybrid solar air photovoltaic thermal (PVT) apparatus according to claim 9, a power inverter, and a primary air handling unit (AHU).

16. The system of claim 15, wherein the primary AHU includes at least one fan, ducting interconnections to the PVT apparatus, ducting connections to a combined thermal transfer and storage module (CTTSM), ducting interconnections to an ambient air inlet and an ambient air exhaust.

17. The system of claim 15 including a flow rate and/or temperature monitoring system that is configured to sense flow rate and/or temperature:
within or through the at least one first air passage;
within or through the at least one second air passage;
before or after the jets, air nozzles or orifices;
at the inlet;
at the outlet;
or a combination of two or more thereof.

18. The system of claim 17, wherein the monitoring system is configured to control a blend of open and closed loop mode air.

19. The hybrid solar air photovoltaic thermal (PVT) apparatus of claim 1, wherein:
the array of jets, air nozzles or orifices comprises a plurality of rows of jets, air nozzles or orifices, each row of jets, air nozzles or orifices being spaced from another row of jets, air nozzles or orifices;
the drain comprises a plurality of drain openings;
the plurality of drain openings comprises a plurality of inner drain openings; and
each of the plurality of inner drain openings is disposed between two or more jets, air nozzles or orifices.

20. The hybrid solar air photovoltaic thermal (PVT) apparatus of claim 1 wherein:
a longitudinal direction of one or more of the jets, air nozzles or orifices is transverse to the underside surface of the solar PV panel.

* * * * *